(12) United States Patent
Yasuhara et al.

(10) Patent No.: US 10,509,317 B2
(45) Date of Patent: Dec. 17, 2019

(54) NEGATIVE TYPE PHOTOSENSITIVE RESIN COMPOSITION, NEGATIVE TYPE PLANOGRAPHIC PRINTING PLATE PRECURSOR, AND METHOD OF PREPARING PLANOGRAPHIC PRINTING PLATE

(71) Applicant: FUJIFILM CORPORATION, Minato-ku, Tokyo (JP)

(72) Inventors: Yuichi Yasuhara, Shizuoka (JP); Atsuyasu Nozaki, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 93 days.

(21) Appl. No.: 15/880,539

(22) Filed: Jan. 26, 2018

(65) Prior Publication Data

US 2018/0149975 A1    May 31, 2018

Related U.S. Application Data

(63) Continuation of application No. PCT/JP2016/068828, filed on Jun. 24, 2016.

(30) Foreign Application Priority Data

Sep. 28, 2015 (JP) ................. 2015-189519

(51) Int. Cl.
*G03F 7/20* (2006.01)
*G03F 7/038* (2006.01)
(Continued)

(52) U.S. Cl.
CPC ............ *G03F 7/038* (2013.01); *B41C 1/1008* (2013.01); *C08F 220/14* (2013.01); *G03F 7/029* (2013.01);
(Continued)

(58) Field of Classification Search
CPC ....................................... G03F 7/004
See application file for complete search history.

(56) References Cited

U.S. PATENT DOCUMENTS

| 5,656,412 A | 8/1997 | Chandross et al. |
| 2005/0069812 A1 | 3/2005 | Maemoto et al. |

(Continued)

FOREIGN PATENT DOCUMENTS

| EP | 3128369 A1 | 2/2017 |
| JP | H05-210241 A | 8/1993 |

(Continued)

OTHER PUBLICATIONS

International Search Report issued in International Application No. PCT/JP2016/068828 dated Sep. 20, 2016.
(Continued)

*Primary Examiner* — Chanceity N Robinson
(74) *Attorney, Agent, or Firm* — Solaris Intellectual Property Group, PLLC

(57) ABSTRACT

A negative type photosensitive resin composition includes a polymer compound which has, in a main chain thereof, a constitutional unit A represented by Formula A-1, a constitutional unit B that is at least one of constitutional units represented by Formulae B-1, B-2, B-3, B-4, B-5, B-6, or B-7, and a constitutional unit C containing an ethylenically unsaturated group; and a polymerization initiator. A negative type planographic printing plate precursor includes an image recording layer containing the negative type photosensitive resin composition. A method of preparing a planographic printing plate includes, in order, an exposure step of image-exposing the negative type planographic printing plate precursor; and a development step of performing development by removing a non-exposed portion of the exposed negative type planographic printing plate precursor using a developer.

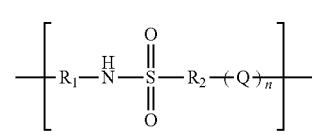

Formula A-1

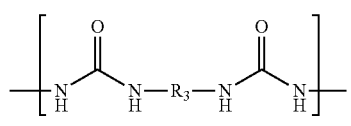

Formula B-1

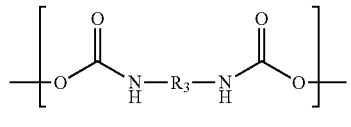

Formula B-2

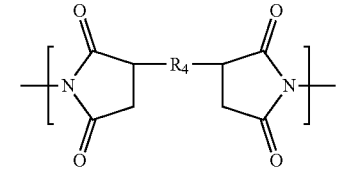

Formula B-3

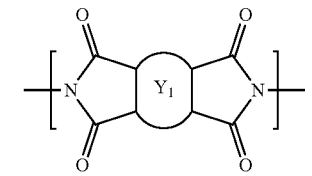

Formula B-4

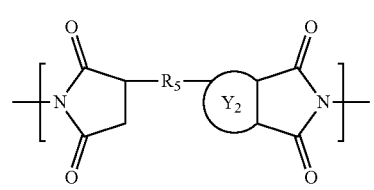

Formula B-5

(Continued)

-continued

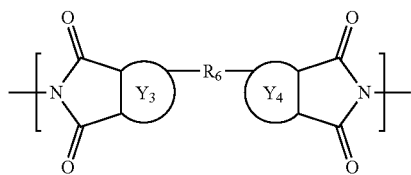

Formula B-6

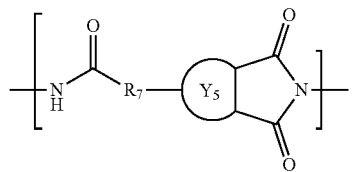

Formula B-7

14 Claims, No Drawings

(51) Int. Cl.
*G03F 7/029* (2006.01)
*B41C 1/10* (2006.01)
*C08F 220/14* (2006.01)
*G03F 7/32* (2006.01)

(52) U.S. Cl.
CPC .............. *G03F 7/2002* (2013.01); *G03F 7/32* (2013.01); *B41C 2210/04* (2013.01)

(56) References Cited

U.S. PATENT DOCUMENTS

| | | | |
|---|---|---|---|
| 2005/0202342 | A1 | 9/2005 | Nagashima |
| 2014/0349234 | A1 | 11/2014 | Tsushima et al. |
| 2017/0329225 | A1* | 11/2017 | Nozaki ................ C08G 75/30 |

FOREIGN PATENT DOCUMENTS

| | | |
|---|---|---|
| JP | H09-090638 A | 4/1997 |
| JP | 2001-125257 A | 5/2001 |
| JP | 2002-229207 A | 8/2002 |
| JP | 2005-091703 A | 4/2005 |
| JP | 2005-106910 A | 4/2005 |
| JP | 2005-258070 A | 9/2005 |
| JP | 2013-130726 A | 7/2013 |
| WO | 2015/151632 A1 | 10/2015 |
| WO | 2016/133072 A1 | 8/2016 |

OTHER PUBLICATIONS

Written Opinion of the ISA issued in International Application No. PCT/JP2016/068828 dated Sep. 20, 2016.
Extended European Search Report dated Jun. 5, 2018, issued in corresponding EP Patent Application No. 16850772.1.

* cited by examiner

NEGATIVE TYPE PHOTOSENSITIVE RESIN COMPOSITION, NEGATIVE TYPE PLANOGRAPHIC PRINTING PLATE PRECURSOR, AND METHOD OF PREPARING PLANOGRAPHIC PRINTING PLATE

CROSS-REFERENCE TO RELATED APPLICATIONS

This application is a Continuation of International Application No. PCT/JP2016/068828 filed on Jun. 24, 2016, which claims priority to Japanese Patent Application No. 2015-189519 filed on Sep. 28, 2015. The entire contents of these applications are incorporated herein by reference.

BACKGROUND OF THE INVENTION

1. Field of the Invention

The present invention relates to a negative type photosensitive resin composition, a negative type planographic printing plate precursor, and a method of preparing a planographic printing plate.

2. Description of the Related Art

A computer to plate (CTP) technology for scanning light with high directivity, such as laser light, according to digitized image information and directly producing a printing plate has been desired. As such a planographic printing plate precursor capable of scanning exposure, a planographic printing plate precursor which includes a photopolymerization type photosensitive layer (also referred to as an image recording layer) containing, on a hydrophilic support, a photopolymerization initiator; an addition-polymerizable ethylenically unsaturated compound; and a binder polymer that is soluble in a developer has been known. Such a planographic printing plate precursor has advantages of excellent productivity and an easy development treatment.

In the related art, an example of using a polyurethane resin binder (for example, see JP2001-125257 A) or changing an ethylenically unsaturated bond-containing unit structure in an acrylic resin binder (for example, see JP2002-229207 A) for the purpose of allowing a printing plate to have excellent printing durability has been known.

SUMMARY OF THE INVENTION

An object of an embodiment of the present invention is to provide a negative type photosensitive resin composition which is capable of forming an image recording layer with excellent printing durability and resistance to development scum at the time of preparing a printing plate; and a negative type planographic printing plate precursor and a method of preparing a planographic printing plate obtained by using the negative type photosensitive resin composition.

The above-described object has been achieved by the means according to the following <1>, <13>, or <14>. The following <1>, <13>, or <14> is described below together with <2> to <12> which are preferred embodiments.

<1> A negative type photosensitive resin composition comprising: a polymer compound which has, in a main chain thereof, a constitutional unit A represented by Formula A-1, a constitutional unit B that is at least one of constitutional units represented by Formulae B-1, B-2, B-3, B-4, B-5, B-6, or B-7, and a constitutional unit C containing an ethylenically unsaturated group; and a polymerization initiator.

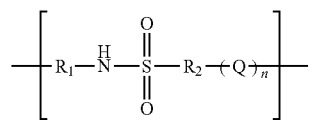
Formula A-1

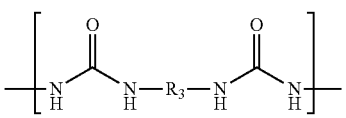
Formula B-1

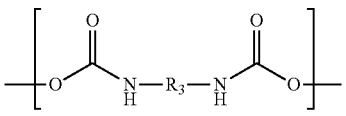
Formula B-2

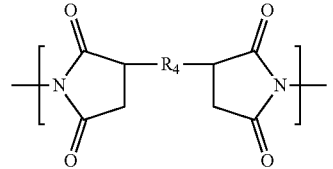
Formula B-3

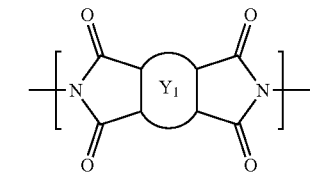
Formula B-4

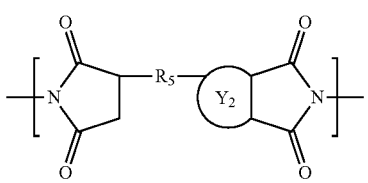
Formula B-5

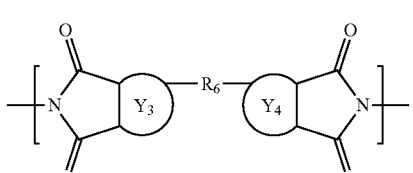
Formula B-6

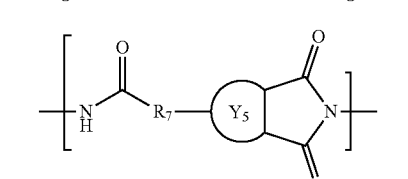
Formula B-7

In Formulae A-1 and B-1 to B-7, $R_1$ to $R_3$ each independently represent a divalent linking group, Q represents a divalent structure containing a sulfonamide group, n represents an integer of 0 or greater, $R_4$ to $R_7$ each independently represent a single bond or a divalent linking group, and $Y_1$ to $Y_5$ each independently represent an aromatic hydrocarbon ring or an aliphatic hydrocarbon ring.

<2> The negative type photosensitive resin composition according to <1>, in which the constitutional unit B has a constitutional unit represented by Formula B-1, B-2, or B-7.

<3> The negative type photosensitive resin composition according to <1> or <2>, in which the constitutional unit B has a constitutional unit represented by Formula B-1 or B-2.

<4> The negative type photosensitive resin composition according to any one of <1> to <3>, in which $R_1$ represents an alkylene group or an arylene group, and $R_2$ represents an arylene group.

<5> The negative type photosensitive resin composition according to any one of <1> to <4>, in which the constitutional unit A is a constitutional unit represented by Formula A-2.

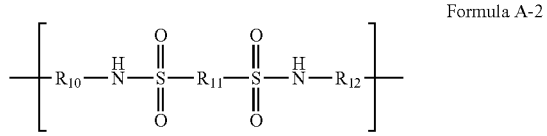

Formula A-2

In Formula A-2, $R_{10}$ to $R_{12}$ each independently represent a divalent linking group.

<6> The negative type photosensitive resin composition according to any one of <1> to <5>, in which the constitutional unit A is a constitutional unit represented by any of Formulae C-1 to C-6.

group, a phenolic hydroxyl group, a carboxy group, an alkyl group, or a halogen atom, $Z^{C11}$ represents $—C(R)_2—$, $—O—$, $—NR—$, $—S—$, $—C(=O)—$, or a single bond, $Z^{C21}$ represents $—C(R)_2—$, $—O—$, $—NR—$, $—S—$, or a single bond, R represents a hydrogen atom or an alkyl group, $X^{C21}$ represents $—C(R')_2—$, $—O—$, $—NR—$, $—S—$, or a single bond, R' represents a hydrogen atom or an alkyl group, $Q^{C11}$, $Q^{C12}$, $Q^{C21}$, $Q^{C22}$, $Q^{C31}$, $Q^{C32}$, $Q^{C41}$, $Q^{C42}$, $Q^{C51}$, $Q^{C52}$, $Q^{C61}$, and $Q^{C62}$ each independently represent an alkylene group, an arylene group, a divalent saturated alicyclic hydrocarbon group, a divalent unsaturated alicyclic hydrocarbon group, or a divalent group formed by a plurality of these groups being linked to one another, and nC11, nC12, nC21, nC22, nC31, nC32, nC41, nC42, nC51, nC52, nC61, and nC62 each independently represent an integer of 1 or greater.

<7> The negative type photosensitive resin composition according to any one of <1> to <6>, in which the constitutional unit C is a constitutional unit having a group selected from the group consisting of an acryloyl group, a methacryloyl group, a styryl group, and an allyl group.

<8> The negative type photosensitive resin composition according to any one of <1> to <7>, in which the constitu-

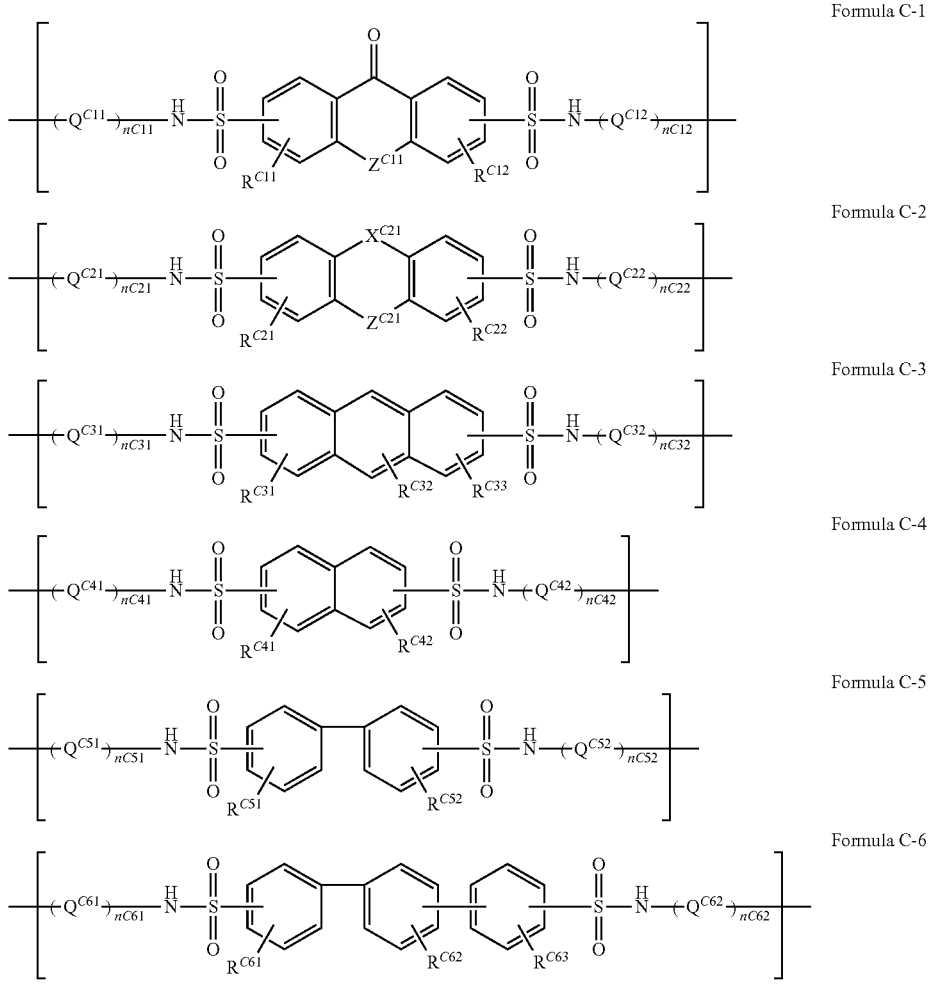

In Formulae C-1 to C-6, $R^{C11}$, $R^{C12}$, $R^{C21}$, $R^{C22}$, $R^{C31}$ to $R^{C33}$, $R^{C41}$, $R^{C42}$, $R^{C51}$, $R^{C52}$, and $R^{C61}$ to $R^{C63}$ each independently represent a hydrogen atom, a sulfonamide tional unit C is a constitutional unit having a group selected from the group consisting of an acryloyl group and a methacryloyl group.

<9> The negative type photosensitive resin composition according to any one of <1> to <8>, in which the polymerization initiator is an onium salt compound.

<10> The negative type photosensitive resin composition according to any one of <1> to <9>, in which the polymerization initiator is a diaryl iodonium salt compound or a triaryl sulfonium salt compound.

<11> The negative type photosensitive resin composition according to any one of <1> to <10>, further comprising: a sensitizing dye having a maximum absorption wavelength of 700 to 1300 nm.

<12> The negative type photosensitive resin composition according to any one of <1> to <10>, further comprising: a sensitizing dye having a maximum absorption wavelength of 300 to 600 nm.

<13> A negative type planographic printing plate precursor comprising: an image recording layer which contains the negative type photosensitive resin composition according to any one of <1> to <12>.

<14> A method of preparing a planographic printing plate, comprising, in order:
an exposure step of image-exposing the negative type planographic printing plate precursor according to <13>; and a development step of performing development by removing a non-exposed portion of the exposed negative type planographic printing plate precursor using a developer.

According to an embodiment of the present invention, it is possible to provide a negative type photosensitive resin composition which is capable of forming an image recording layer with excellent printing durability and resistance to development scum at the time of preparing a printing plate; and a negative type planographic printing plate precursor and a method of preparing a planographic printing plate obtained by using the negative type photosensitive resin composition.

DESCRIPTION OF THE PREFERRED EMBODIMENTS

Hereinafter, the content of the present disclosure will be described in detail. The description of constituent elements below will be made based on representative embodiments of the present disclosure, but the present disclosure is not limited to such embodiments.

In the present specification, in a case where numerical ranges are shown using "to", the numerical ranges indicate ranges including the numerical values described before and after "to" as the lower limits and the upper limits.

In a case where groups (atomic groups) are noted without mentioning substitution and unsubstitution in the notation of compounds in the present specification, the concept thereof includes unsubstituted groups and groups having substituents. For example, the concept of an "alkyl group" includes not only an alkyl group (unsubstituted alkyl group) which does not have a substituent but also an alkyl group (substituted alkyl group) which has a substituent.

Further, the chemical structural formulae in the present specification may be simplified structural formulae by omitting hydrogen atoms.

Further, in the present specification, "(meth)acrylate" indicates acrylate and methacrylate; "(meth)acryl" indicates acryl and methacryl; and "(meth)acryloyl" indicates acryloyl and methacryloyl.

Further, in the present disclosure, "% by mass" has the same definition as that for "% by weight"; and "part by mass" has the same definition as that for "parts by weight".

In the present disclosure, "a constitutional unit represented by Formula B-1" or the like is also simply referred to as "a constitutional unit B-1" or the like.

In the present disclosure, a combination of two or more preferred aspects is a more preferred aspect.

(Negative Type Photosensitive Resin Composition)

A negative type photosensitive resin composition of the present disclosure (hereinafter, also simply referred to as a "photosensitive resin composition of the present disclosure" or a "photosensitive resin composition") includes a polymer compound (hereinafter, also referred to as a "specific polymer compound") which has, in a main chain thereof, a constitutional unit A represented by Formula A-1, a constitutional unit B that is at least one of constitutional units represented by Formulae B-1, B-2, B-3, B-4, B-5, B-6, or B-7, and a constitutional unit C containing an ethylenically unsaturated group; and a polymerization initiator.

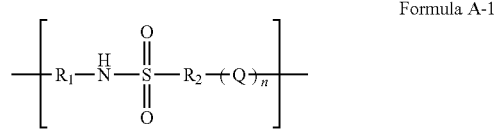

Formula A-1

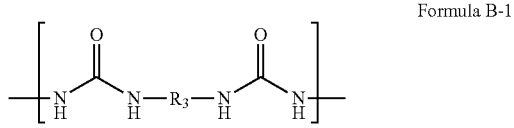

Formula B-1

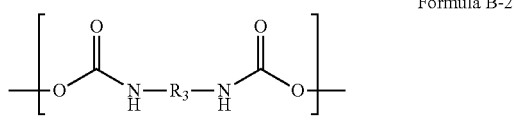

Formula B-2

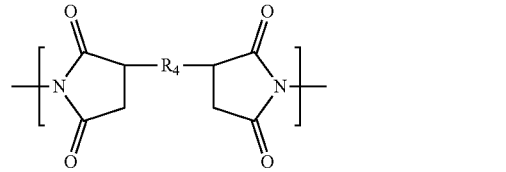

Formula B-3

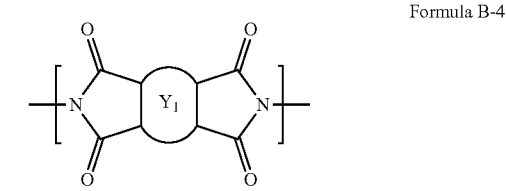

Formula B-4

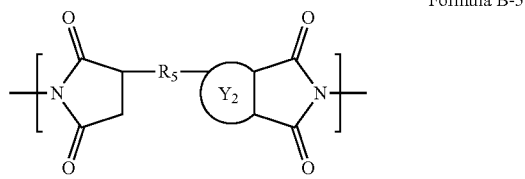

Formula B-5

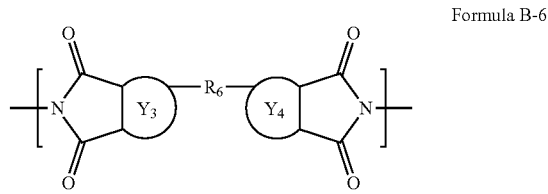

Formula B-6

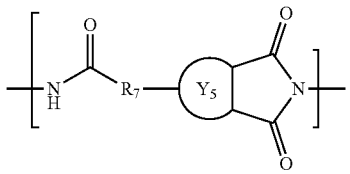

Formula B-7

In Formulae A-1 and B-1 to B-7, $R_1$ to $R_3$ each independently represent a divalent linking group, Q represents a divalent structure containing a sulfonamide group, n represents an integer of 0 or greater, $R_4$ to $R_7$ each independently represent a single bond or a divalent linking group, and $Y_1$ to $Y_5$ each independently represent an aromatic hydrocarbon ring or an aliphatic hydrocarbon ring.

In addition, the negative type photosensitive resin composition of the present disclosure can be suitably used for an image recording layer of a negative type planographic printing plate precursor.

As a result of extensive research conducted by the present inventors, the present inventors found that, in a case where the photosensitive resin composition contains a polymer compound having the above-described constitutional units A to C in the main chain; and a polymerization initiator, a negative type photosensitive resin composition from which an image recording layer with excellent printing durability and resistance to development scum at the time of preparing a printing plate can be formed can be provided.

Although the action mechanism in the present disclosure is not clear, it is estimated as follows.

Based on the research conducted by the present inventors, it was found that the film hardness of a resin is important for the printing durability in printing and the film hardness is significantly affected by an interaction between binders. In particular, this effect is significant in low-quality print materials, and sufficient film hardness is less likely to be imparted in a case of typical acrylic resins or polyurethane resins. It is considered that this is because inorganic salt particles (calcium carbonate, kaolin, or the like) contained in a print material (paper, ink, or the like) are eluted during printing, this polishes the image area of the printing plate, and thus abrasion is promoted. In contrast, since a binder polymer in the present disclosure contains a plurality of linking groups with an extremely high interaction, such as a urethane bond, a urea bond, an imide bond, or an amide bond, in addition to a sulfonamide bond in the main chain thereof, the printing durability is excellent. It is estimated that this is caused by improvement of the film hardness of the resin and effects of suppressing abrasion of the image area of the printing plate.

Further, based on the research conducted by the present inventors, it is considered that, since the polymer compound has a sulfonamide bond in the main chain, the polymer compound becomes an alkali-soluble decomposition product at the time of being decomposed during development and generation of development scum can be suppressed.

Hereinafter, each component in the negative type photosensitive resin composition of the present disclosure will be described in detail.

<Specific Polymer Compound>

The photosensitive resin composition of the present disclosure contains a polymer compound (specific polymer compound) which has, in the main chain thereof, a constitutional unit A represented by Formula A-1, a constitutional unit B that is at least one of constitutional units represented by Formulae B-1, B-2, B-3, B-4, B-5, B-6, or B-7, and a constitutional unit C containing an ethylenically unsaturated group.

Hereinafter, each constitutional unit of the polymer compound and a combination of constitutional units will be described.

[Constitutional Unit A]

The specific polymer compound used in the present disclosure has a constitutional unit represented by Formula A-1 in the main chain.

Further, in the present disclosure, the "main chain" indicates the relatively longest bonding chain in a molecule of a polymer compound constituting a resin and the "side chain" indicates a molecular chain branched from the main chain.

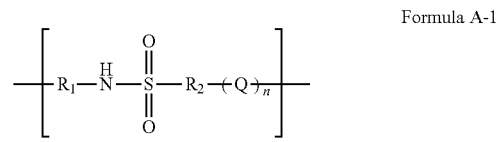

Formula A-1

In Formula A-1, $R_1$ and $R_2$ each independently represent a divalent linking group, Q represents a divalent structure containing a sulfonamide group, and n represents an integer of 0 or greater.

In Formula A-1, $R_1$ represents preferably an alkylene group or an arylene group, more preferably an alkylene group having 1 to 4 carbon atoms or an arylene group having 6 to 10 carbon atoms, and still more preferably a phenylene group.

Further, $R_2$ represents preferably an arylene group, more preferably an arylene group having 6 to 10 carbon atoms, and still more preferably a phenylene group.

It is preferable that both of $R_1$ and $R_2$ represent an arylene group and more preferable that both of $R_1$ and $R_2$ represent a phenylene group.

The alkylene group or the arylene group as $R_1$ and $R_2$ may be substituted. As the substituent, an alkyl group having 1 to 6 carbon atoms, an alkoxy group having 1 to 6 carbon atoms, or a halogen atom is preferable; and an alkyl group having 1 to 4 carbon atoms is more preferable.

Q represents a divalent structure containing a sulfonamide group, and a structure represented by Formula Q-1 is preferable.

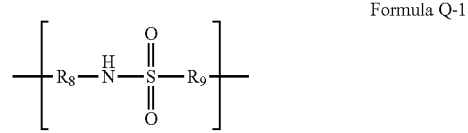

Formula Q-1

In Formula Q-1, $R_8$ and $R_9$ each independently represent a single bond or a divalent linking group.

In Formula Q-1, $R_8$ represents preferably a single bond, an alkylene group, or an arylene group, more preferably an alkylene group or an arylene group, still more preferably an alkylene group having 1 to 4 carbon atoms or an arylene group having 6 to 10 carbon atoms, and particularly preferably a phenylene group. The arylene group or the alkylene group as $R_8$ may be substituted. As the substituent, a group selected from the group consisting of an alkyl group having 1 to 6 carbon atoms, an alkoxy group having 1 to 6 carbon atoms, or a halogen atom is preferable; and an alkyl group having 1 to 4 carbon atoms is more preferable.

In Formula Q-1, $R_9$ represents preferably a single bond, an alkylene group, an arylene group, a carbonyl group, an ether bond, an amide bond, a sulfonyl group, or a group represented by a combination of these linking groups and more preferably a group formed by combining one or more structures selected from the group consisting of a single bond and an arylene group with one or more bonds selected from the group consisting of a sulfonyl bond and an ether bond.

In a case where $R_9$ represents a group formed by combining an arylene group with one or more bonds selected from the group consisting of a sulfonyl bond and an ether bond, it is preferable that the arylene group is directly bonded to a sulfur atom of the sulfonamide group in Formula Q-1.

The alkylene group as $R_9$ may be linear, branched, or cyclic. Further, an alkylene group having 1 to 6 carbon atoms is preferable, and the alkylene group as $R_9$ may be further substituted with a group selected from the group consisting of a halogen atom, an aryl group, and an alkoxy group.

In Formula A-1, $R_8$ may be bonded to $R_2$ in Formula A-1 and $R_9$ may be bonded to $R_2$, in the structure represented by Formula Q-1. Between these, it is preferable that $R_9$ is bonded to $R_2$.

In Formula A-1, n represents preferably 0 or 1 and more preferably 1.

Further, it is preferable that the constitutional unit A is a constitutional unit represented by Formula A-2.

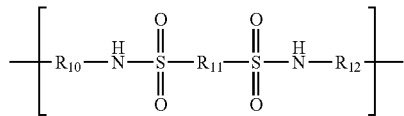

Formula A-2

In Formula A-2, $R_{10}$ to $R_{12}$ each independently represent a divalent linking group.

In Formula A-2, $R_{10}$ and $R_{12}$ each independently represent preferably an alkylene group or an arylene group, more preferably an alkylene group having 1 to 4 carbon atoms or an arylene group having 6 to 10 carbon atoms, and still more preferably a phenylene group. It is preferable that both of $R_{10}$ and $R_{12}$ represent an arylene group and more preferable that both of $R_{10}$ and $R_{12}$ represent a phenylene group.

The arylene group or the alkylene group as $R_{10}$ and $R_{12}$ may be substituted. As the substituent, an alkyl group having 1 to 6 carbon atoms, an alkoxy group having 1 to 6 carbon atoms, or a halogen atom is preferable; and an alkyl group having 1 to 4 carbon atoms is more preferable.

In Formula A-2, $R_{11}$ represents preferably an arylene group, $-R_{13}-O-R_{14}-$ or $-R_{13}-SO_2-R_{14}-$, more preferably an arylene group, and still more preferably a phenylene group. $R_{13}$ and $R_{14}$ each independently represent an arylene group and preferably a phenylene group.

The arylene group or the phenylene group as $R_{11}$ may be substituted. As the substituent, a group selected from the group consisting of an alkyl group having 1 to 6 carbon atoms, an alkoxy group having 1 to 6 carbon atoms, and a halogen atom is preferable and an alkyl group having 1 to 4 carbon atoms is more preferable.

It is preferable that the constitutional unit A has a constitutional unit represented by any of Formulae C-1 to C-6 and more preferable that the constitutional unit A is a constitutional unit represented by any of Formulae C-1 to C-6.

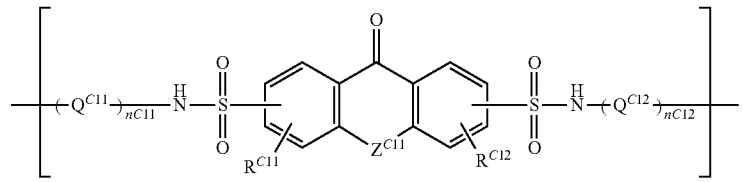

Formula C-1

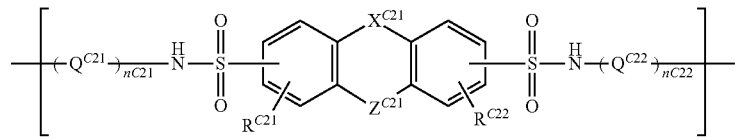

Formula C-2

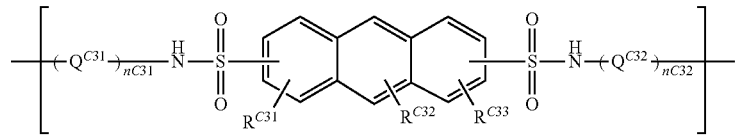

Formula C-3

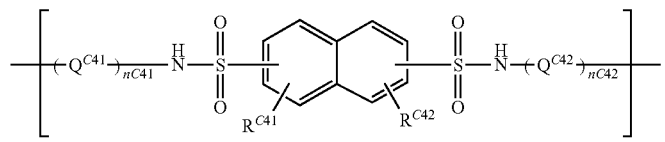

Formula C-4

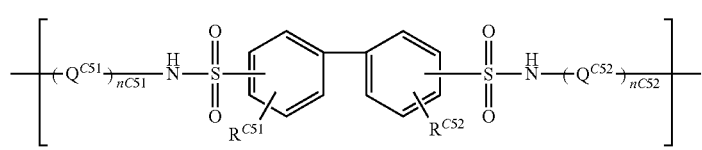

Formula C-5

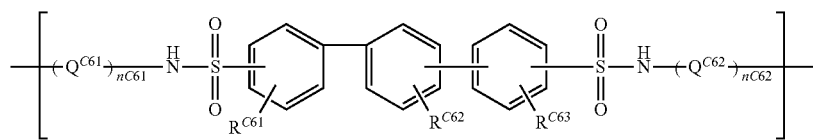

Formula C-6

In Formulae C-1 to C-6, $R^{C11}$, $R^{C12}$, $R^{C21}$, $R^{C22}$, $R^{C31}$ to $R^{C33}$, $R^{C41}$, $R^{C42}$, $R^{C51}$, $R^{52}$, and $R^{C61}$ to $R^{C63}$ each independently represent a hydrogen atom, a sulfonamide group, a phenolic hydroxyl group, a carboxy group, an alkyl group, or a halogen atom, $Z^{C11}$ represents —C(R)$_2$—, —O—, —NR—, —S—, —C(=O)—, or a single bond, $Z^{C21}$ represents —C(R)$_2$—, —O—, —NR—, —S—, or a single bond, R represents a hydrogen atom or an alkyl group, $X^{C21}$ represents —C(R')$_2$—, —O—, —NR—, —S—, or a single bond, R' represents a hydrogen atom or an alkyl group, $Q^{C11}$, $Q^{C12}$, $Q^{C21}$, $Q^{C22}$, $Q^{C31}$, $Q^{C32}$, $Q^{C41}$, $Q^{C42}$, $Q^{C51}$, $Q^{C52}$, $Q^{C61}$, and $Q^{C62}$ each independently represent an alkylene group, an arylene group, a divalent saturated alicyclic hydrocarbon group, a divalent unsaturated alicyclic hydrocarbon group, or a divalent group formed by a plurality of these groups being linked to one another, and nC11, nC12, nC21, nC22, nC31, nC32, nC41, nC42, nC51, nC52, nC61, and nC62 each independently represent an integer of 1 or greater.

$R^{C11}$, $R^{C12}$, $R^{C21}$, $R^{C22}$, $R^{C31}$ to $R^{C33}$, $R^{C41}$, $R^{C42}$, $R^{C51}$, $R^{C52}$, and $R^{C61}$ to $R^{C63}$ each independently represent preferably a hydrogen atom or an alkyl group, more preferably a hydrogen atom or an alkyl group having 1 to 8 carbon atoms, still more preferably a hydrogen atom or an alkyl group having 1 to 4 carbon atoms, and particularly preferably a hydrogen atom.

$Z^{C11}$ represents preferably —O—, —NR—, —S—, or a single bond and more preferably —O—, —NR—, or —S—.

$Z^{C21}$ represents preferably —O—, —NR—, —S—, or a single bond and more preferably —O—, —NR—, or —S—.

R represents preferably an alkyl group and more preferably a methyl group.

$X^{C21}$ represents preferably —CH$_2$—, —O—, —NR—, or —S— and more preferably —O—, —NR—, or —S—.

R' represents preferably a hydrogen atom or a methyl group and more preferably a hydrogen atom.

The number of carbon atoms of $Q^{C11}$, $Q^{C12}$, $Q^{C21}$, $Q^{C22}$, $Q^{C31}$, $Q^{C32}$, $Q^{C41}$, $Q^{C42}$, $Q^{C51}$, $Q^{C52}$, $Q^{C61}$, or $Q^{C62}$ is each independently and preferably in a range of 1 to 60 and more preferably in a range of 2 to 30.

Further, $Q^{C11}$, $Q^{C12}$, $Q^{C21}$, $Q^{C22}$, $Q^{C31}$, $Q^{C32}$, $Q^{C41}$, $Q^{C42}$, $Q^{C51}$, $Q^{C52}$, $Q^{C61}$, or $Q^{C62}$ each independently represent preferably an alkylene group or an arylene group.

nC11, nC12, nC21, nC22, nC31, nC32, nC41, nC42, nC51, nC52, nC61, and nC62 each independently represent preferably an integer of 1 to 3 and more preferably 1.

It is preferable that the constitutional unit A in the specific polymer compound used in the present disclosure is a constitutional unit having a structure formed by removing two amino groups from among arbitrary exemplified compounds shown below.

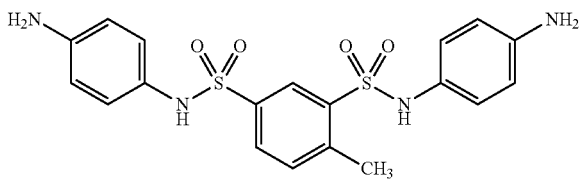

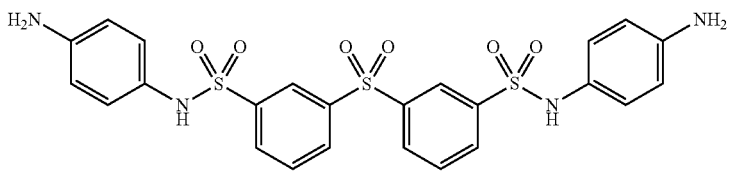

-continued
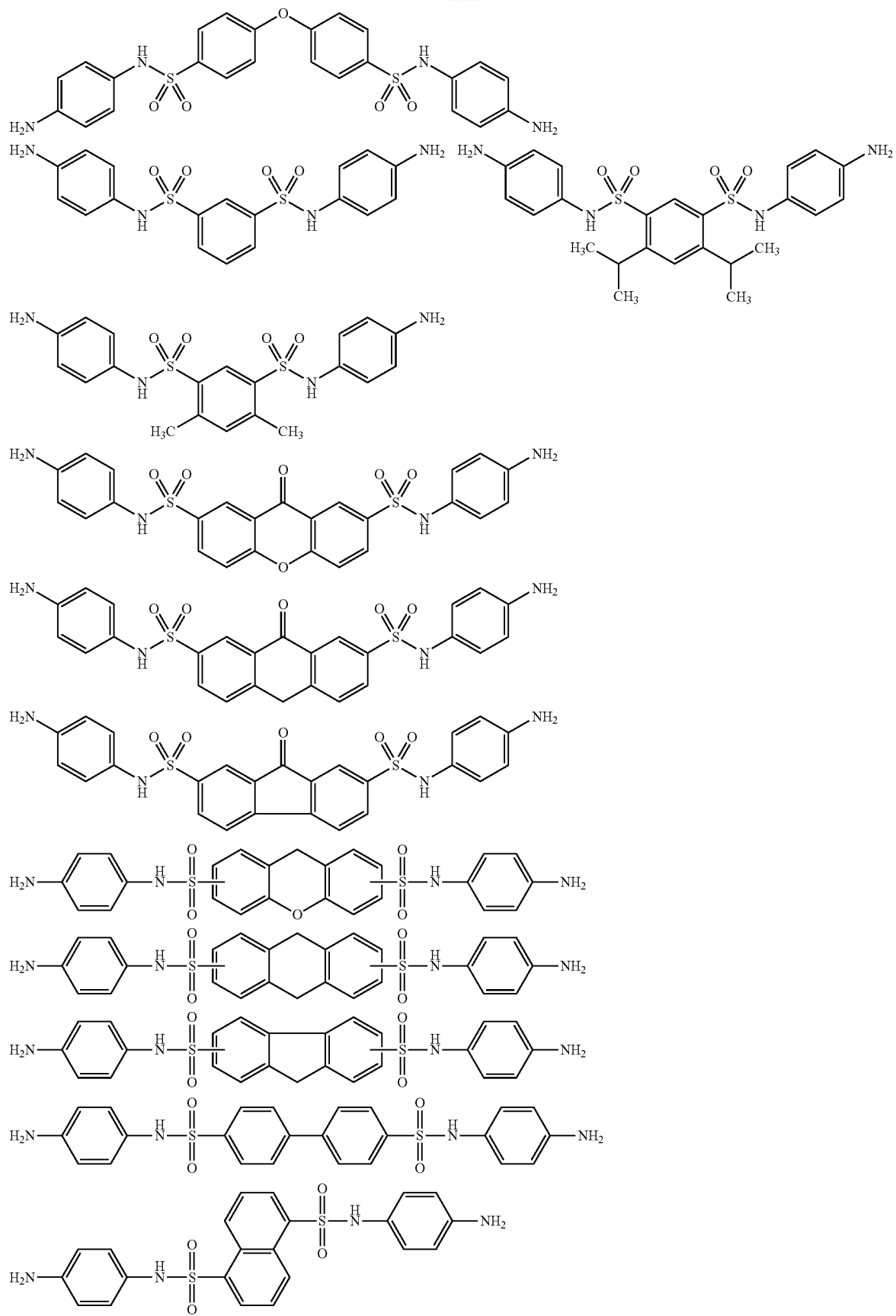

-continued
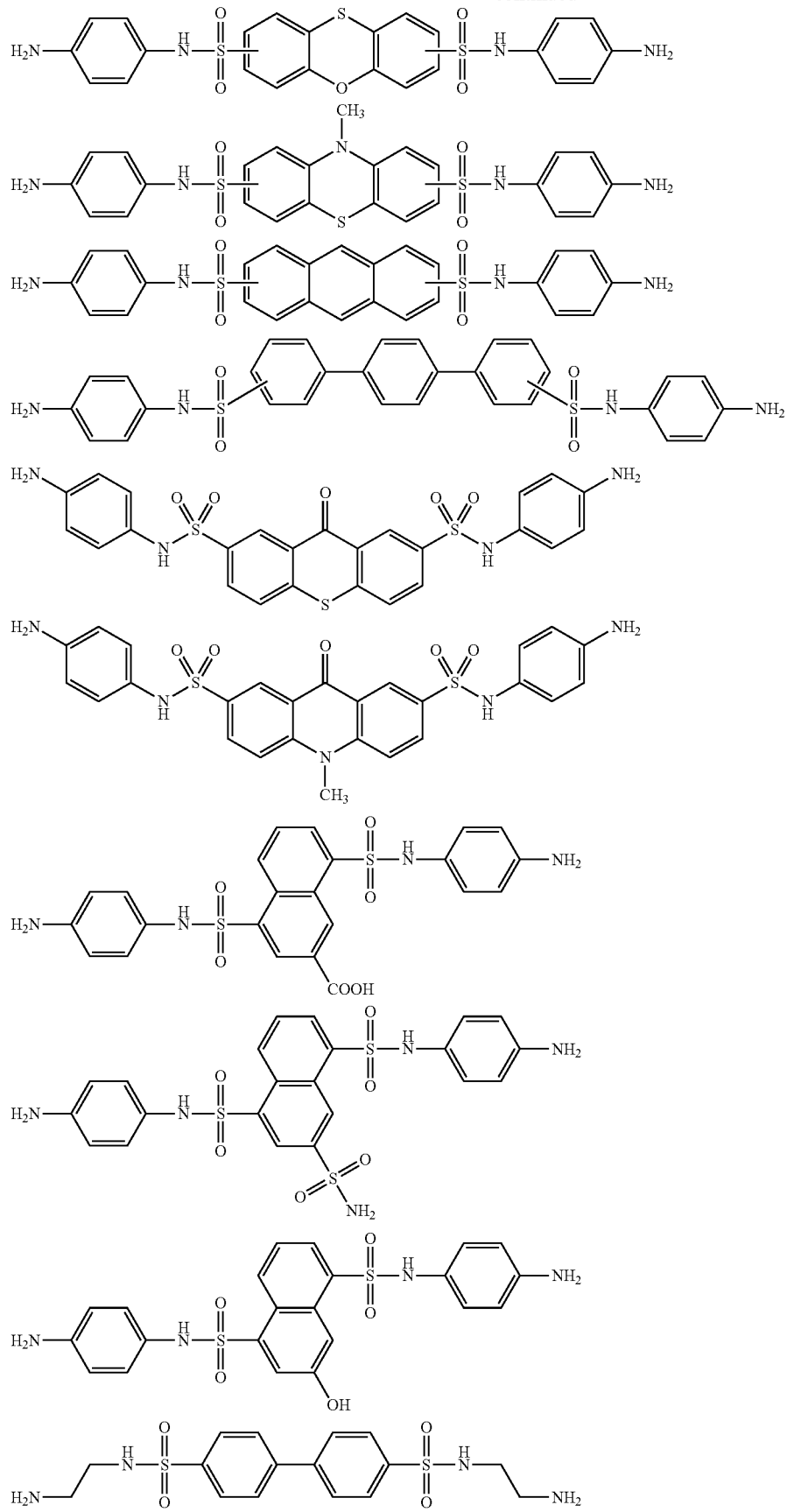

17
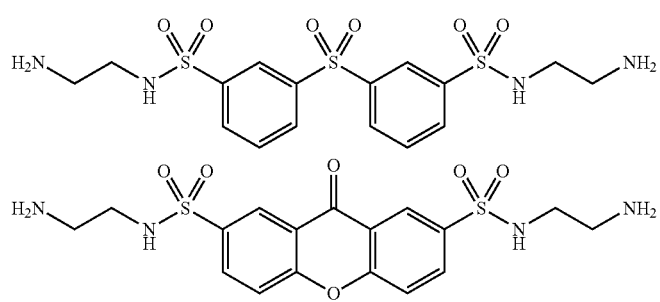
Further, it is preferable that the constitutional unit A in the specific polymer compound used in the present disclosure is a constitutional unit having a structure formed by removing two hydroxy groups from among arbitrary exemplified compounds shown below.
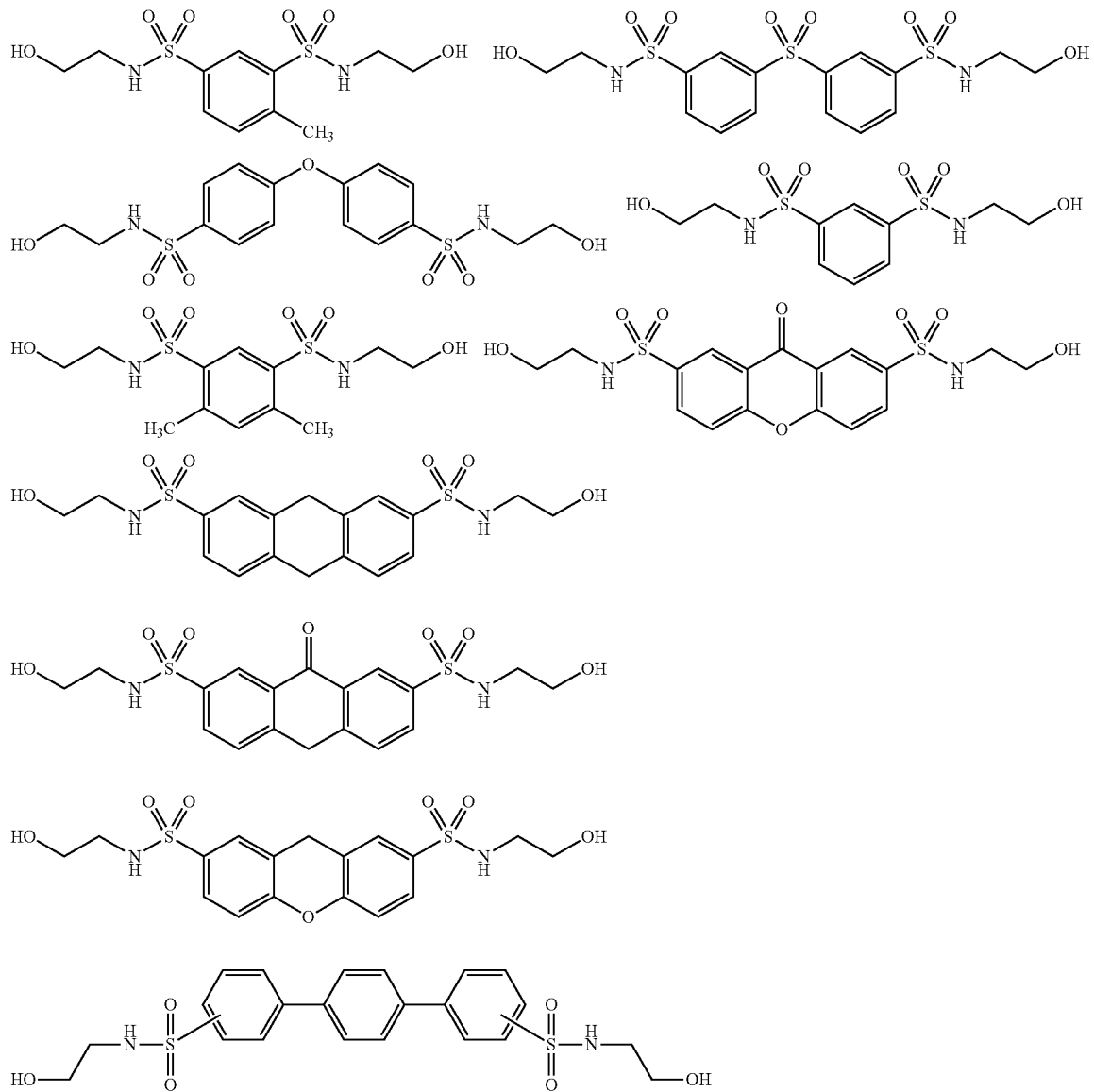

19                                    20
-continued
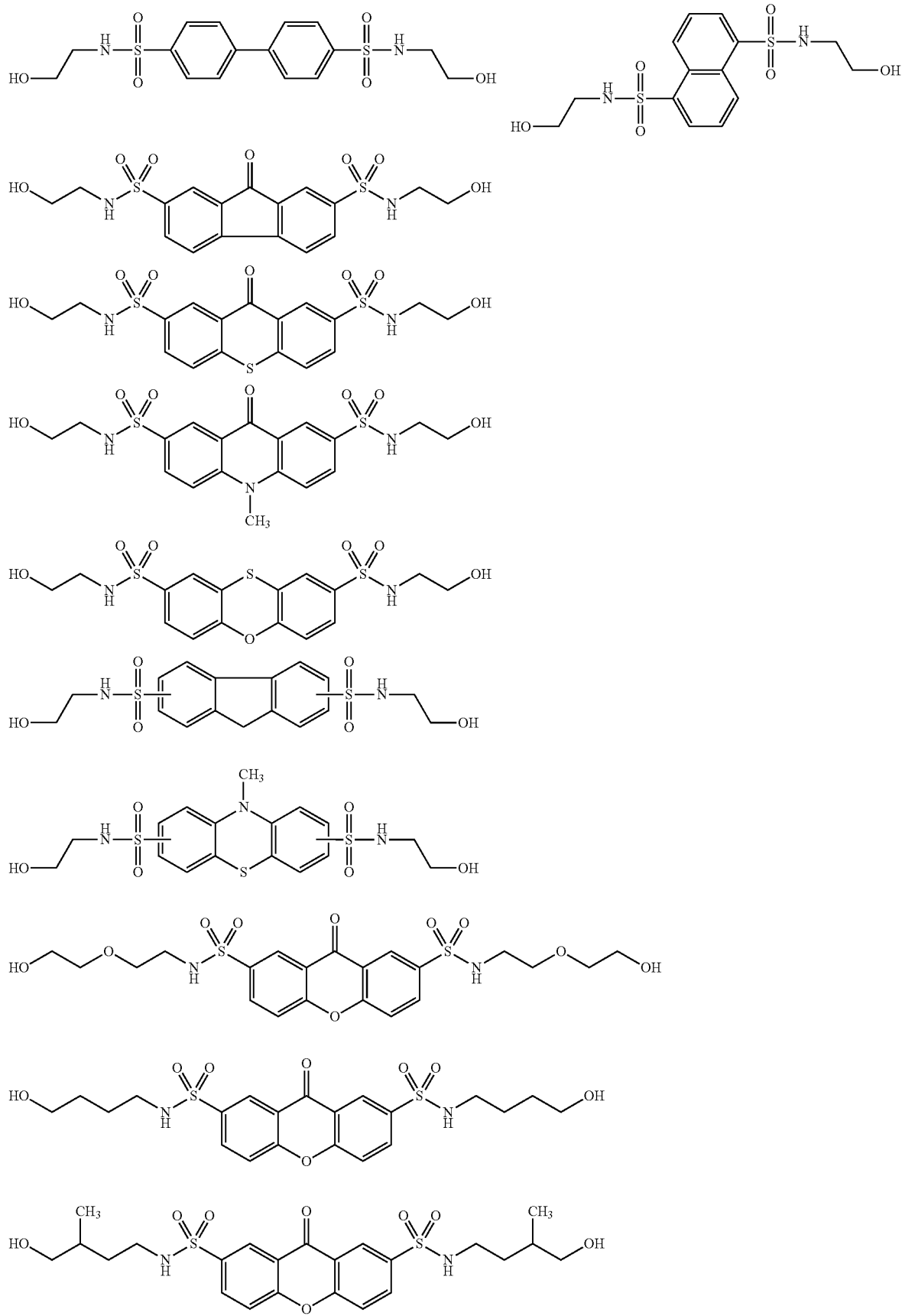

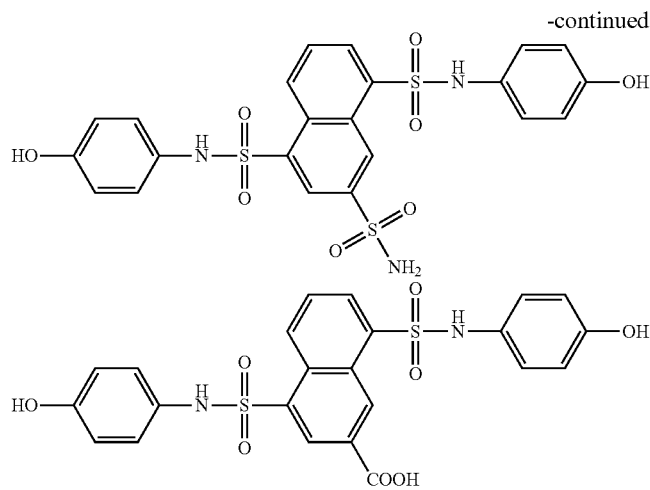

Further, the specific polymer compound used in the present disclosure may have a constitutional unit A' represented by Formula A-3 in the main chain.

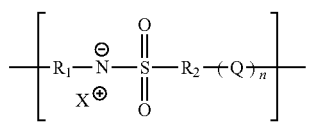

Formula A-3

In Formula A-3, $R_1$, $R_2$, Q, and n respectively have the same definitions as those for $R_1$, $R_2$, Q, and n in Formula A-1, and $X^+$ represents an organic or inorganic cation.

$X^+$ may represent an organic or inorganic cation, but a cation derived from a basic compound described below is preferable and a cation in which a basic compound described below is protonated is more preferable.

In a case where the specific polymer compound contains the constitutional unit A', a planographic printing plate precursor with excellent chemical resistance and printing durability is obtained.

The constitutional unit A' is generated as a result of dissociation of a hydrogen atom in the sulfonamide group in the constitutional unit A.

Further, in order for the constitutional unit A' to be generated from the constitutional unit A, it is preferable that the photosensitive resin composition contains a monovalent basic compound shown below.

$R_1$, $R_2$, Q, and n in the constitutional unit A' in the specific polymer compound used in the present disclosure respectively have the same definitions as those for $R_1$, $R_2$, Q, and n in Formula A-1 and the preferable aspect is the same as described above.

The proportion of the constitutional unit A is preferably in a range of 5% to 90% by mass and more preferably in a range of 30% to 60% by mass with respect to the total mass of the constitutional unit A and the constitutional unit A' in the specific polymer compound used in the present disclosure.

[Constitutional Unit B]

The specific polymer compound used in the present disclosure contains at least one constitutional unit B from among constitutional units represented by Formulae B-1, B-2, B-3, B-4, B-5, B-6, or B-7.

Further, it is preferable that the constitutional unit B has a constitutional unit represented by Formula B-1, B-2, or B-7 and more preferable that the constitutional unit B has a constitutional unit represented by Formula B-1 or B-2.

From the viewpoint of synthesis, it is preferable that the constitutional unit B is a constitutional unit represented by Formula B-1. Further, from the viewpoint of heat resistance of a printing plate to be obtained, it is preferable that the constitutional unit B is a constitutional unit represented by any of Formulae B-3 to B-7 and more preferable that the constitutional unit B is a constitutional unit represented by Formula B-7.

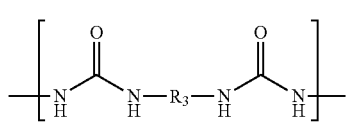

Formula B-1

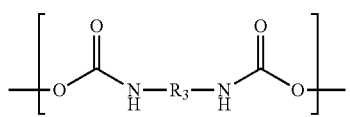

Formula B-2

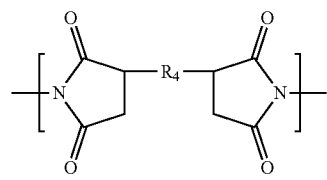

Formula B-3

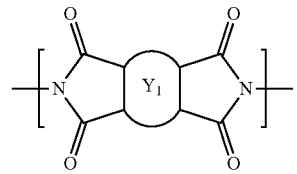

Formula B-4

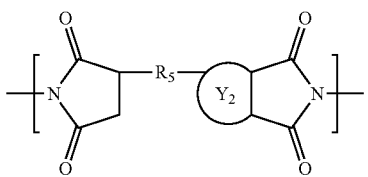

Formula B-5

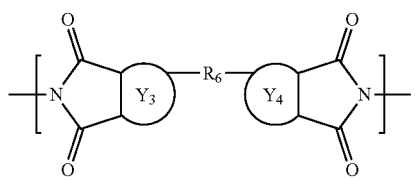

Formula B-6

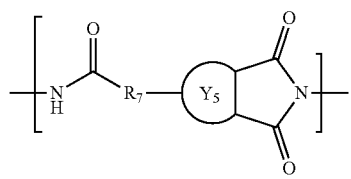

Formula B-7

In Formulae B-1 to B-7, $R_3$'s each independently represent a divalent linking group, $R_4$ to $R_7$ each independently represent a single bond or a divalent linking group, and $Y_1$ to $Y_5$ each independently represent an aromatic hydrocarbon ring or an aliphatic hydrocarbon ring.

—Constitutional Unit B-1 and Constitutional Unit B-2—

It is preferable that the constitutional unit B has a constitutional unit selected from the group consisting of a constitutional unit represented by Formula B-1 and a constitutional unit represented by Formula B-2 and preferable that the constitutional unit B has a constitutional unit represented by Formula B-1 or a constitutional unit represented by Formula B-2.

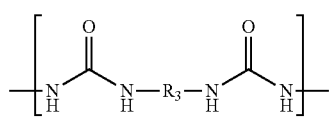

Formula B-1

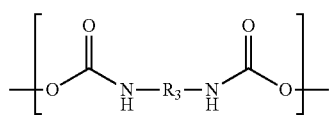

Formula B-2

In Formulae B-1 and B-2, $R_3$'s each independently represent a divalent linking group.

In Formulae B-1 and B-2, it is preferable that $R_3$ represents an alkylene group, an arylene group, a group formed by combining these groups, or a group formed by bonding two or more groups selected from the group consisting of an alkylene group and an arylene group to one or more linking groups selected from the group consisting of a carbonyl group, a sulfonyl group, a urethane bond, an ester bond, and an ether bond.

In a case where $R_3$ represents an alkylene group, the alkylene group may be linear, branched, or cyclic or may be a group formed by bonding these to one another.

The number of carbon atoms of the linear or branched alkylene group is preferably in a range of 1 to 20, more preferably in a range of 2 to 14, and still more preferably in a range of 2 to 10. The alkylene group may have a substituent, and examples of the substituent include a halogen atom, an aryl group, and an alkoxy group.

In a case where $R_3$ represents an arylene group, the number of carbon atoms of the arylene group is preferably in a range of 6 to 18 and a phenylene group is more preferable as the arylene group. Further, a plurality of arylene groups may be linked to one another through a linking group such as a carbonyl group, an ester bond, or an ether bond. The arylene group or the phenylene group may have a substituent. As the substituent, a group selected from the group consisting of an alkyl group having 1 to 6 carbon atoms, an alkoxy group having 1 to 6 carbon atoms, and a carboxy group is preferable and a carboxy group is more preferable.

In a case where $R_3$ represents a group formed by combining an alkylene group with an arylene group, a linear alkylene group having 1 to 6 carbon atoms is preferable as the alkylene group. The alkylene group may have a linking group such as a carbonyl group, an ester bond, or an ether bond. Further, the alkylene group may have a substituent, and examples of the substituent include a halogen atom, an aryl group, and an alkoxy group. A phenylene group is preferable as the arylene group. The phenylene group may be substituted. As the substituent, an alkyl group having 1 to 6 carbon atoms, an alkoxy group having 1 to 6 carbon atoms, or a carboxy group is preferable and a carboxy group is more preferable.

In addition, a plurality of arylene groups and alkylene groups may be combined with one another.

It is preferable that the group formed by bonding two or more groups selected from the group consisting of an alkylene group and an arylene group to one or more linking groups selected from the group consisting of a carbonyl group, a sulfonyl group, a urethane bond, an ester bond, and an ether bond is a group formed by bonding a urea bond in Formula B-1 or a urethane bond in Formula B-2 to a group selected from the group consisting of an alkylene group and an arylene group.

Further, as the group formed by bonding two or more groups selected from the group consisting of an alkylene group and an arylene group to one or more linking groups selected from the group consisting of a urethane bond, a group formed by bonding two or more groups selected from the group consisting of an alkylene group and an arylene group to one or more urethane bonds is preferable and a group formed by bonding three groups selected from the group consisting of an alkylene group and an arylene group to two urethane bonds is more preferable.

The specific polymer compound used in the present disclosure may have only one kind of constitutional unit B-1 or may have two or more kinds of constitutional units B-1.

Further, the specific polymer compound used in the present disclosure may have only one kind of constitutional unit B-2 or may have two or more kinds of constitutional units B-2.

Furthermore, the specific polymer compound used in the present disclosure may have one or more kinds of constitutional units B-1 and one or more kinds of constitutional units B-2.

It is preferable that the constitutional unit B-1 in the specific polymer compound used in the present disclosure is a constitutional unit formed by reacting a diamine compound with a diisocyanate compound shown below.

Further, it is preferable that the constitutional unit B-2 in the specific polymer compound used in the present disclosure is a constitutional unit formed by reacting a diol compound with a diisocyanate compound shown below.

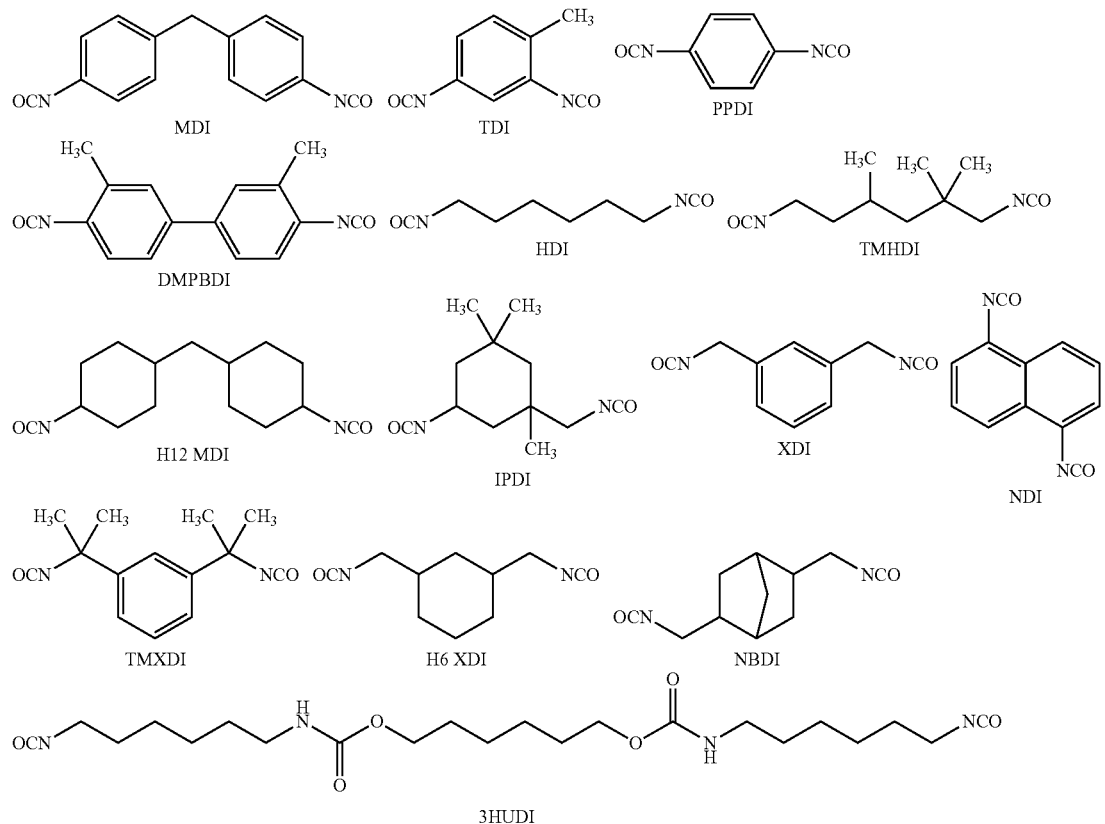

—Constitutional Unit B-3 to Constitutional Unit B-7—

It is preferable that the constitutional unit B has at least one constitutional unit from among constitutional units represented by Formulae B-3, B-4, ..., or B-7.

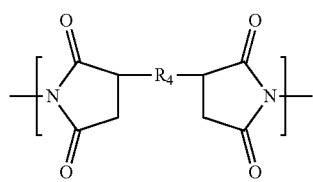

Formula B-3

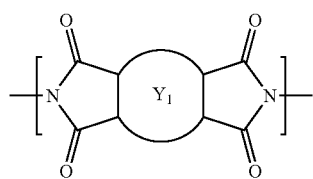

Formula B-4

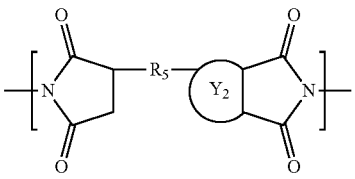

Formula B-5

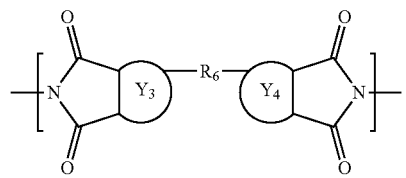

Formula B-6

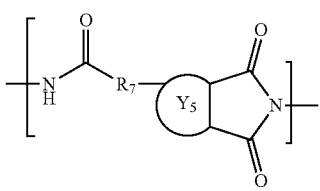

Formula B-7

In Formulae B-3 to B-7, $R_4$ to $R_7$ each independently represent a single bond or a divalent linking group, and $Y_1$ to $Y_5$ each independently represent an aromatic hydrocarbon ring or an aliphatic hydrocarbon ring.

In Formula B-3, $R_4$ represents preferably a single bond, an alkylene group, or an arylene group and more preferably a single bond.

In a case where $R_4$ represents an alkylene group, the alkylene group may be linear, branched, or cyclic.

The number of carbon atoms of the linear or branched alkylene group is preferably in a range of 1 to 20, more preferably in a range of 1 to 14, and still more preferably in a range of 1 to 10. The alkylene group may have a substituent, and preferred examples of the substituent include a halogen atom, an aryl group, and an alkoxy group.

In a case where R$_4$ represents an arylene group, the number of carbon atoms of the arylene group is preferably in a range of 6 to 20 and more preferably in a range of 6 to 16. The arylene group may have a substituent, and preferred examples of the substituent include an alkyl group having 1 to 6 carbon atoms, an alkoxy group having 1 to 6 carbon atoms, and a halogen atom.

In Formula B-4, Y$_1$ represents preferably an aromatic hydrocarbon ring and more preferably a benzene ring.

Further, in a case where Y$_1$ represents an aliphatic hydrocarbon ring, an aliphatic hydrocarbon ring having 4 to 20 carbon atoms is preferable and an aliphatic hydrocarbon ring having 4 to 10 carbon atoms is more preferable.

Y$_1$ may be substituted, and preferred examples of the substituent include an alkyl group having 1 to 6 carbon atoms, an alkoxy group having 1 to 6 carbon atoms, and a halogen atom.

In Formula B-5, Y$_2$ represents preferably an aromatic hydrocarbon ring and more preferably a benzene ring.

Further, in a case where Y$_2$ represents an aliphatic hydrocarbon ring, an aliphatic hydrocarbon ring having 4 to 20 carbon atoms is preferable and an aliphatic hydrocarbon ring having 4 to 12 carbon atoms is more preferable.

Y$_2$ may be substituted, and preferred examples of the substituent include an alkyl group having 1 to 6 carbon atoms, an alkoxy group having 1 to 6 carbon atoms, a halogen atom, and an aryl group.

In Formula B-5, R$_5$ represents preferably a single bond, an alkylene group, or an arylene group and more preferably a single bond.

In a case where R$_5$ represents an alkylene group, the alkylene group may be linear, branched, or cyclic.

The number of carbon atoms of the linear or branched alkylene group is preferably in a range of 1 to 20, more preferably in a range of 1 to 14, and still more preferably in a range of 1 to 10. The alkylene group may have a substituent, and preferred examples of the substituent include a halogen atom, an aryl group, and an alkoxy group.

In Formula B-6, both of Y$_3$ and Y$_4$ represent preferably an aromatic hydrocarbon ring and more preferably a benzene ring.

Y$_3$ and Y$_4$ may be substituted, and preferred examples of the substituent include a hydrocarbon group having 1 to 6 carbon atoms, a halogen atom, and an alkoxy group having 1 to 6 carbon atoms.

In Formula B-6, R$_6$ represents preferably a single bond, an alkylene group, a carbonyl group, an ether bond, an amide bond, an arylene group, a sulfonyl group, or a group represented by a combination of these linking groups and more preferably a single bond.

The alkylene group may be linear, branched, or cyclic. Further, an alkylene group having 6 or less carbon atoms is preferable as the alkylene group, and the alkylene group may be substituted with a halogen atom, an aryl group, or an alkoxy group.

Further, in a case where at least one of Y$_3$ or Y$_4$ represents an aliphatic hydrocarbon ring, it is preferable that R$_5$ includes an arylene group.

In Formula B-7, Y$_5$ represents preferably an aromatic hydrocarbon ring and more preferably a benzene ring.

Y$_5$ may be substituted, and preferred examples of the substituent include a hydrocarbon group having 1 to 12 carbon atoms, a halogen atom, and an alkoxy group having 1 to 12 carbon atoms.

In Formula B-7, R$_7$ represents preferably a single bond, an alkylene group, or an arylene group and more preferably a single bond.

The constitutional unit B may have only one kind of constitutional units B-3 to B-7 or may have two or more kinds of constitutional units B-3 to B-7.

Further, the constitutional unit B may have two or more kinds of constitutional units B-3 and the same applies to the constitutional units B-4 to B-7.

Further, it is preferable that the constitutional units B-3 to B-7 in the specific polymer compound used in the present disclosure are constitutional units derived from exemplary compounds shown below.

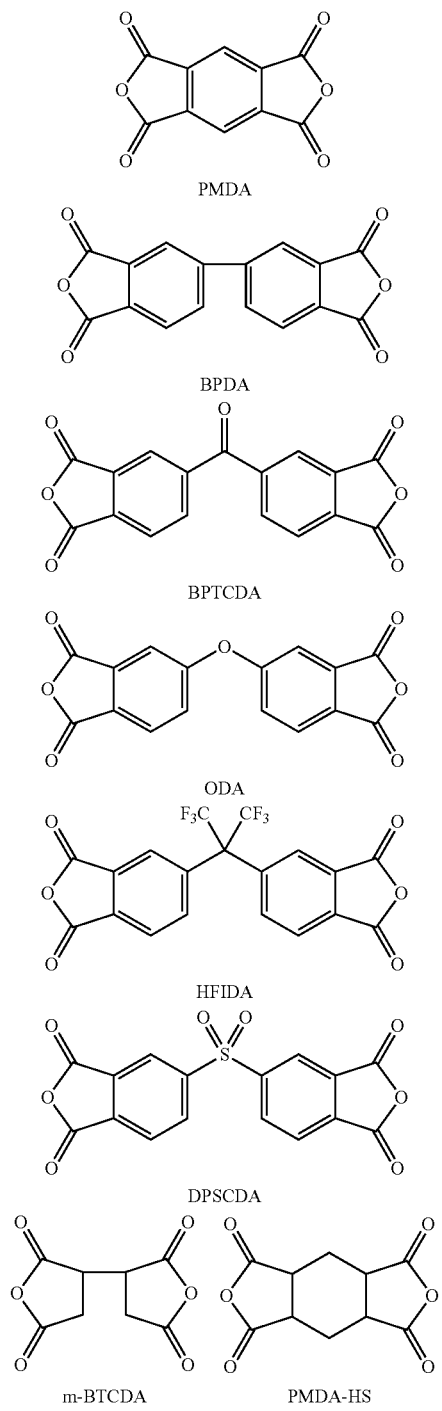

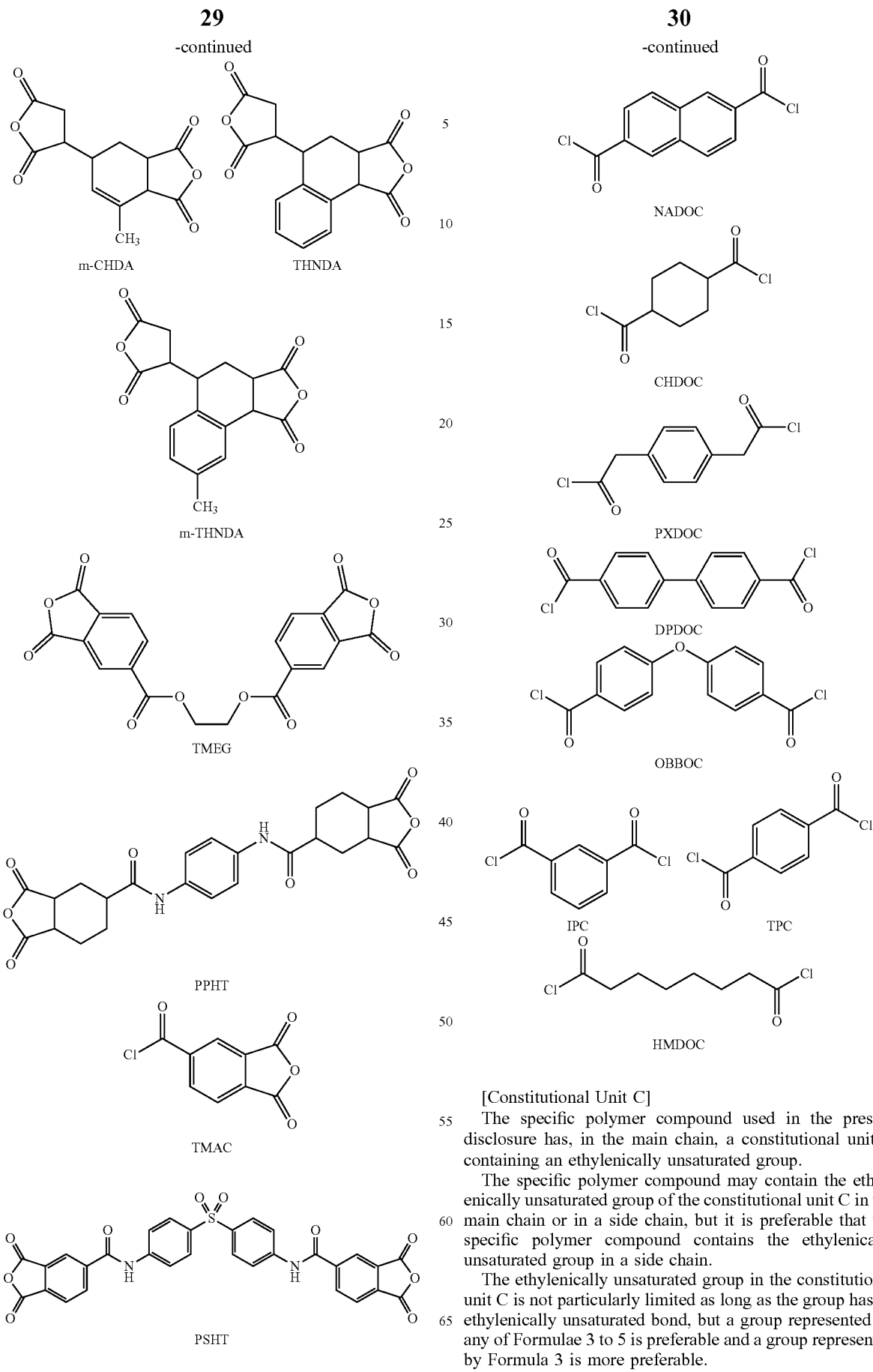

[Constitutional Unit C]

The specific polymer compound used in the present disclosure has, in the main chain, a constitutional unit C containing an ethylenically unsaturated group.

The specific polymer compound may contain the ethylenically unsaturated group of the constitutional unit C in the main chain or in a side chain, but it is preferable that the specific polymer compound contains the ethylenically unsaturated group in a side chain.

The ethylenically unsaturated group in the constitutional unit C is not particularly limited as long as the group has an ethylenically unsaturated bond, but a group represented by any of Formulae 3 to 5 is preferable and a group represented by Formula 3 is more preferable.

Hereinafter, the group represented by any of Formulae 3 to 5 will be described in detail.

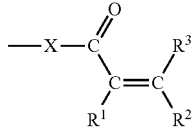

Formula 3

In Formula 3, $R^1$ to $R^3$ each independently represent a hydrogen atom or a monovalent organic group, X represents an oxygen atom, a sulfur atom, or —N($R^{12}$)—, and $R^{12}$ represents a hydrogen atom or a monovalent organic group.

In Formula 3, it is preferable that $R^1$ represents a hydrogen atom or an alkyl group which may have a substituent. Among these, from the viewpoint of high radical reactivity, a hydrogen atom or a methyl group is particularly preferable.

Further, it is preferable that $R^2$ and $R^3$ each independently represent a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, from the viewpoint of high radical reactivity, a hydrogen atom, a carboxyl group, an alkoxycarbonyl group, an alkyl group which may have a substituent, or an aryl group which may have a substituent is particularly preferable.

It is preferable that X in Formula 3 represents an oxygen atom or —N($R^{12}$)—.

It is preferable that $R^{12}$ represents a hydrogen atom or an alkyl group which may have a substituent. Among these, from the viewpoint of high radical reactivity, a hydrogen atom, a methyl group, an ethyl group, or an isopropyl group is particularly preferable.

Here, examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, and an arylsulfonyl group.

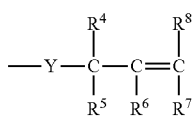

Formula 4

In Formula 4, $R^4$ to $R^8$ each independently represent a hydrogen atom or a monovalent organic group, Y represents an oxygen atom, a sulfur atom, or —N($R^{12}$)—, and $R^{12}$ represents a hydrogen atom or a monovalent organic group.

In Formula 4, it is preferable that $R^4$ to $R^8$ each independently represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, a hydrogen atom, a carboxyl group, an alkoxycarbonyl group, an alkyl group which may have a substituent, or an aryl group which may have a substituent is more preferable.

Examples of the substituent which can be introduced are the same as those for the substituent in Formula 3 described above.

Further, it is preferable that Y represents an oxygen atom.

$R^{12}$ in Formula 4 has the same definition as that for $R^{12}$ in Formula 3 and the preferable aspect thereof is the same as described above.

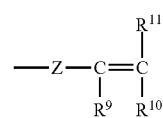

Formula 5

In Formula 5, $R^9$ to $R^{11}$ each independently represent a hydrogen atom or a monovalent organic group, Z represents an oxygen atom, a sulfur atom, —N($R^{13}$)—, or an arylene group, and $R^{13}$ represents a monovalent organic group.

In Formula 5, it is preferable that $R^9$ represents a hydrogen atom or an alkyl group which may have a substituent. Among these, from the viewpoint of high radical reactivity, a hydrogen atom or a methyl group is particularly preferable.

Further, it is preferable that $R^{10}$ and $R^{11}$ each independently represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, from the viewpoint of high radical reactivity, a hydrogen atom, a carboxyl group, an alkoxycarbonyl group, an alkyl group which may have a substituent, or an aryl group which may have a substituent is more preferable.

Further, Z represents preferably an oxygen atom, a sulfur atom, —N($R^{13}$)—, or a phenylene group which may have a substituent and more preferably an oxygen atom or a phenylene group which may have a substituent.

It is preferable that $R^{13}$ represents an alkyl group which may have a substituent. Among these, from the viewpoint of high radical reactivity, a methyl group, an ethyl group, or an isopropyl group is particularly preferable.

Examples of the substituent which can be introduced are the same as those for the substituent in Formula 3 described above.

Further, it is preferable that the constitutional unit C is a constitutional unit containing a group selected from the group consisting of an acryloyl group, a methacryloyl group, a styryl group, and an allyl group and more preferable that the constitutional unit C is a constitutional unit containing a group selected from the group consisting of an acryloyl group and a methacryloyl group.

A method of introducing the constitutional unit C into the specific polymer compound is not particularly limited, and examples thereof include a method of using a polycondensable monomer that contains an ethylenically unsaturated group, a method of obtaining an ethylenically unsaturated group from a precursor group of an ethylenically unsaturated group after polymerization using a monomer having a precursor group of an ethylenically unsaturated group, and a method of introducing an ethylenically unsaturated group by performing a polymer reaction.

Preferred examples of the diisocyanate compound used to introduce the constitutional unit C into the specific polymer compound include a product obtained by performing an addition reaction on a triisocyanate compound with monofunctional alcohol containing an ethylenically unsaturated group or 1 equivalent of a monofunctional amine compound containing an ethylenically unsaturated group.

Examples of the triisocyanate compound include those described below, but the present invention is not limited thereto.

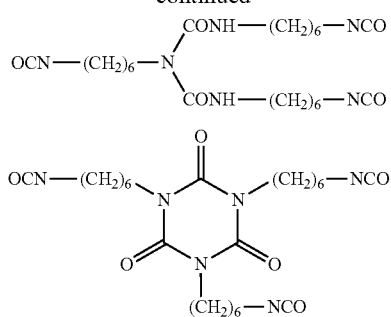

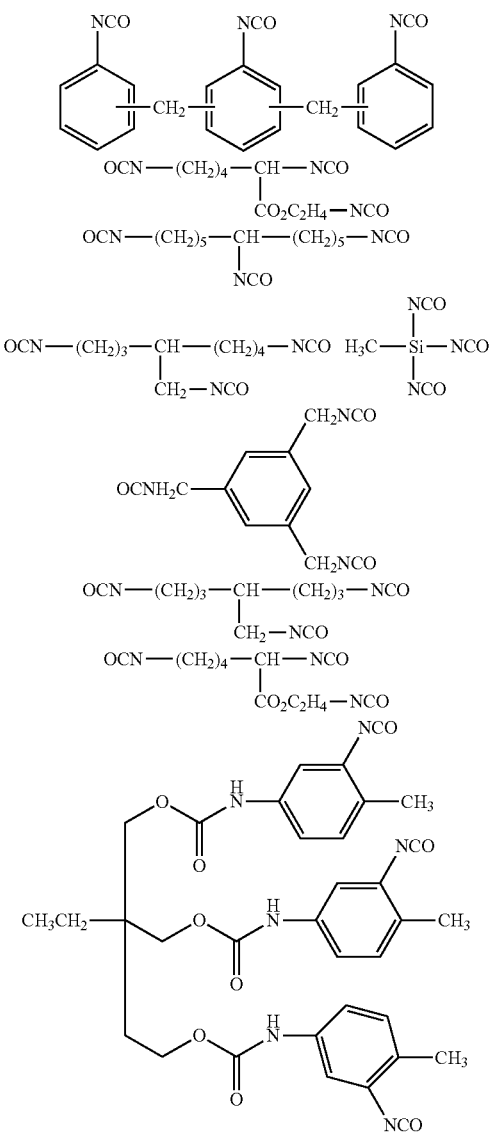

Examples of the monofunctional alcohol containing an ethylenically unsaturated group or a monofunctional amine compound containing an ethylenically unsaturated group include those described below, but the present invention is not limited thereto.

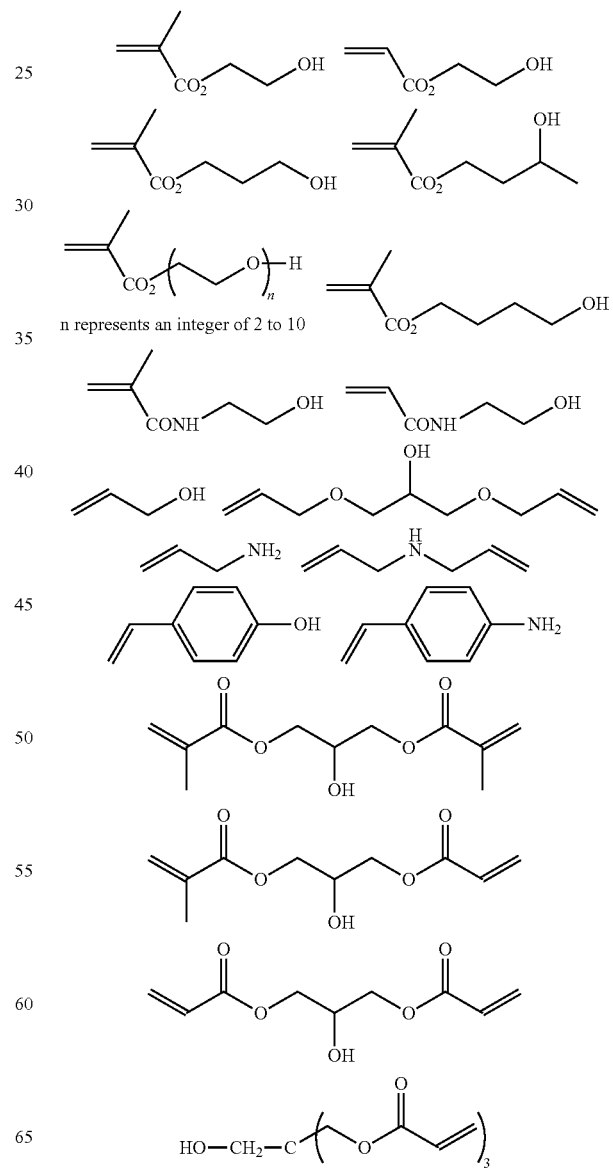

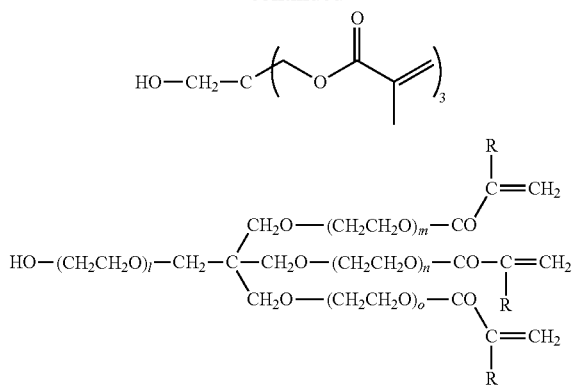

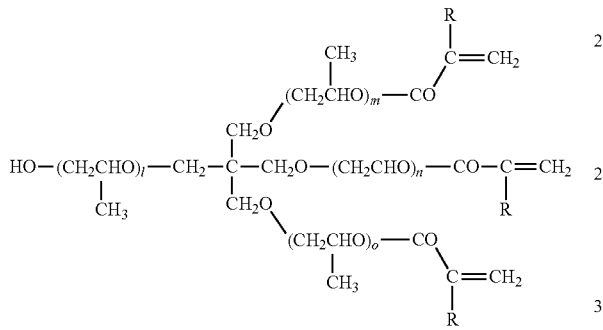

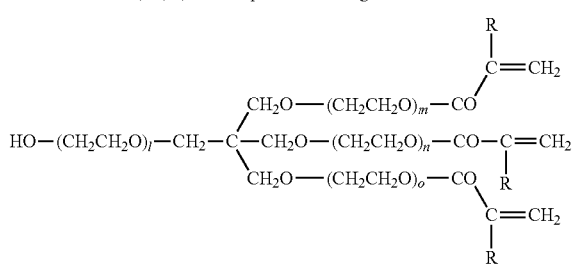

R represents a hydrogen atom or a methyl group
l, m, n, and o represent an integer of 1 to 20

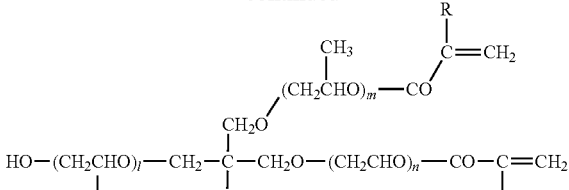

R represents a hydrogen atom or a methyl group
l, m, n, and o represent an integer of 1 to 20

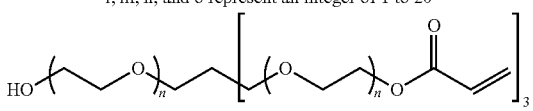

n represents an integer of 1 or 20

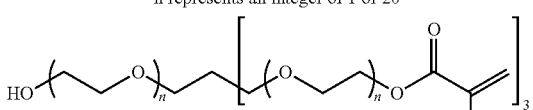

n represents an integer of 1 or 20

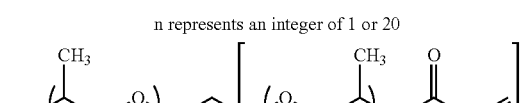

n represents an integer of 1 or 20

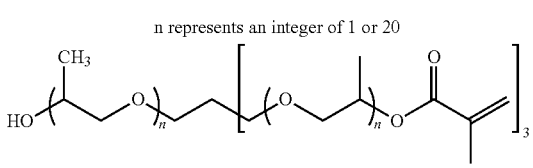

n represents an integer of 1 or 20

Examples of the diisocyanate compound which can be obtained by performing an addition reaction on a triisocyanate compound with monofunctional alcohol containing an ethylenically unsaturated group or 1 equivalent of a monofunctional amine compound containing an ethylenically unsaturated group include those described below, but the present invention is not limited thereto.

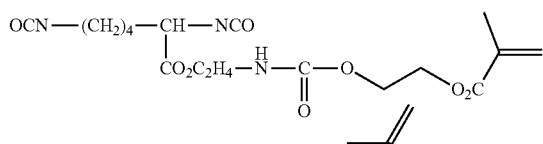

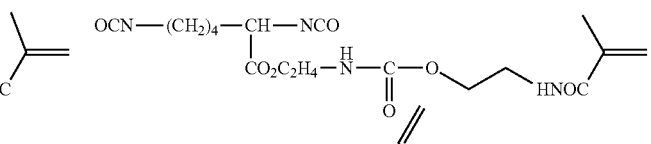

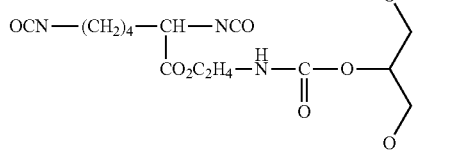

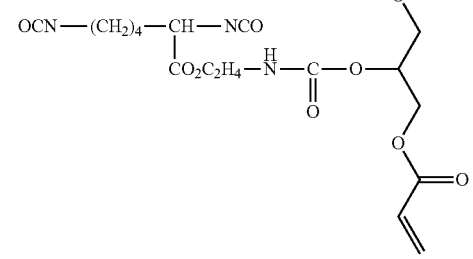

-continued
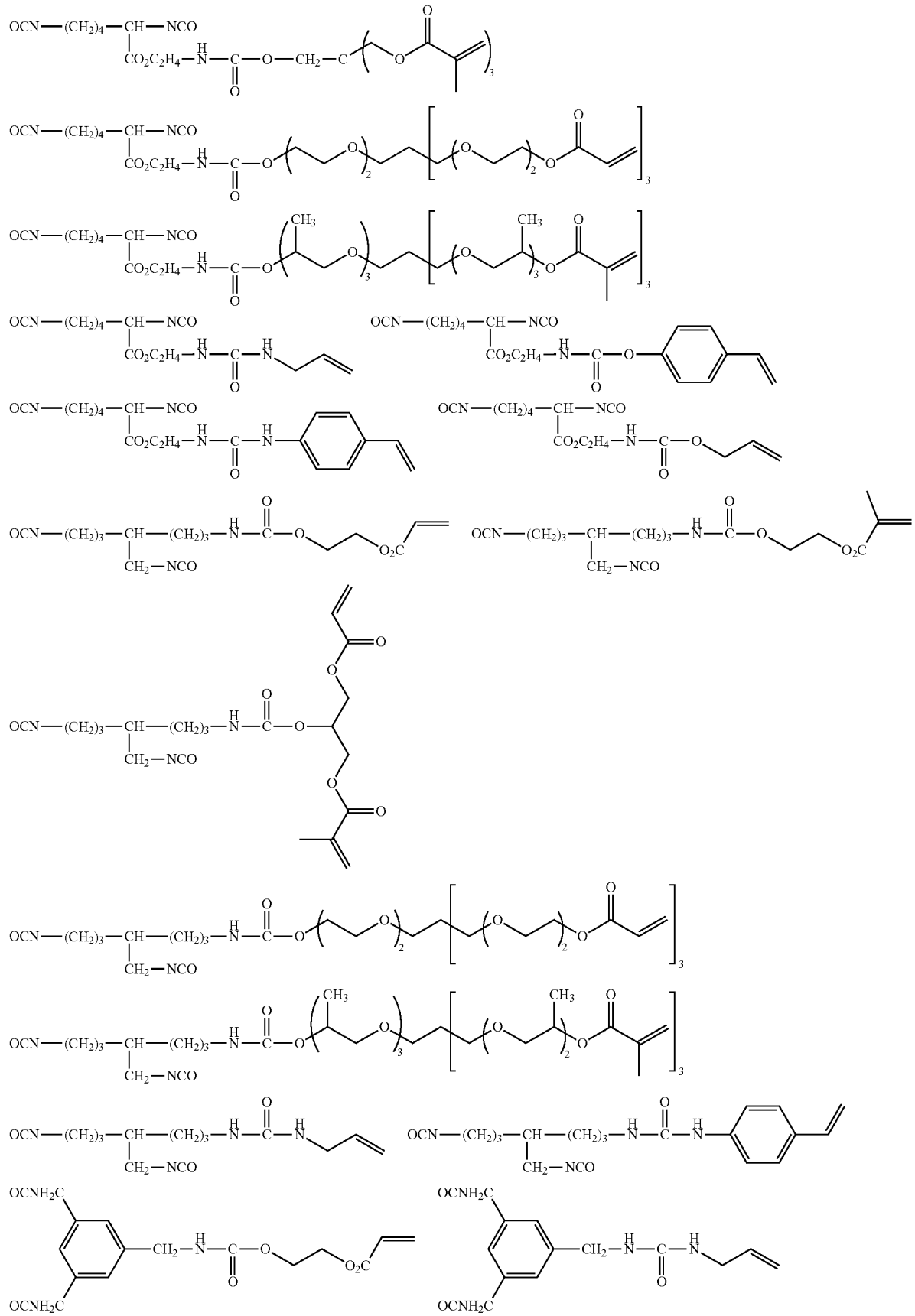

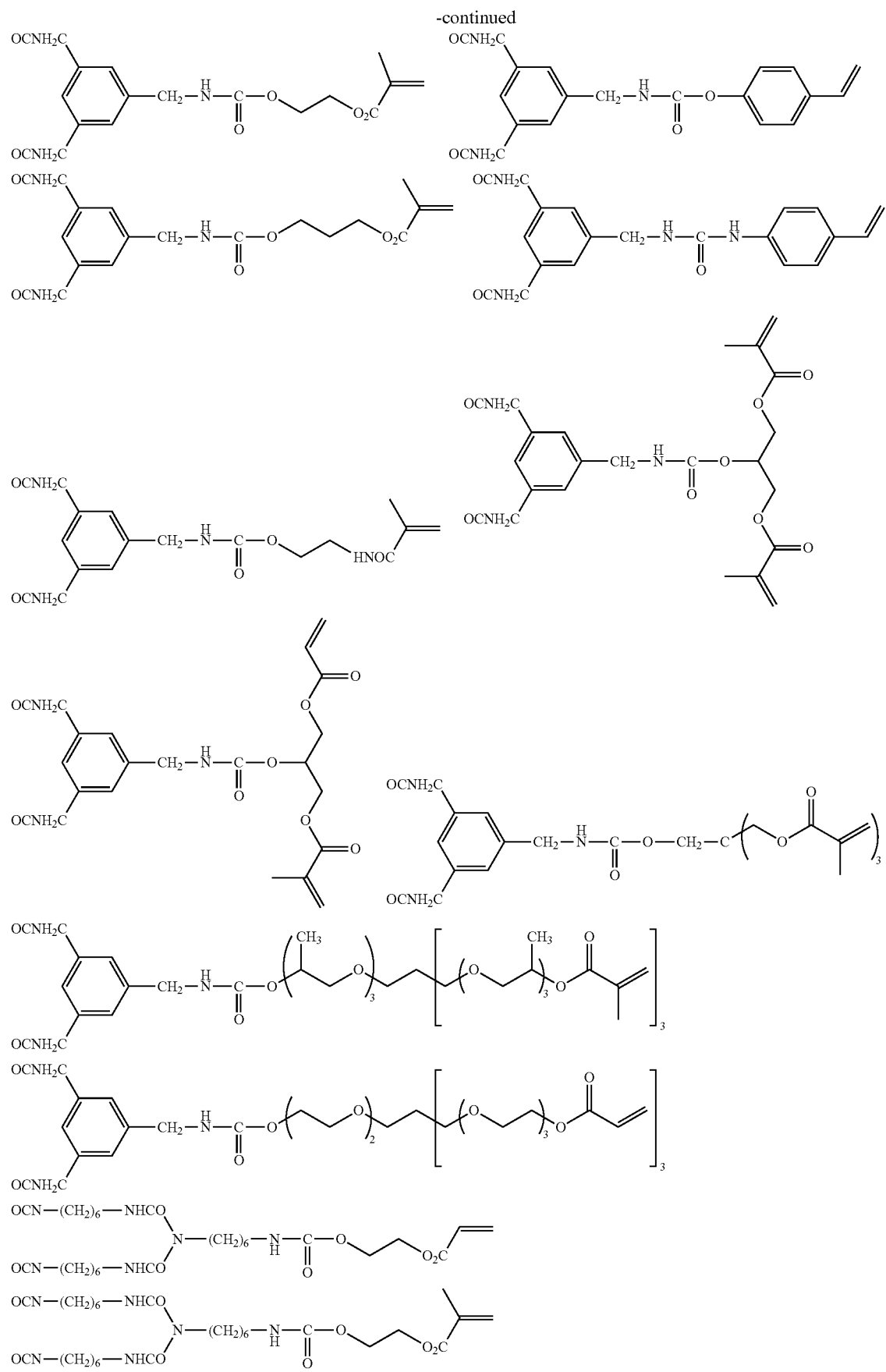
-continued

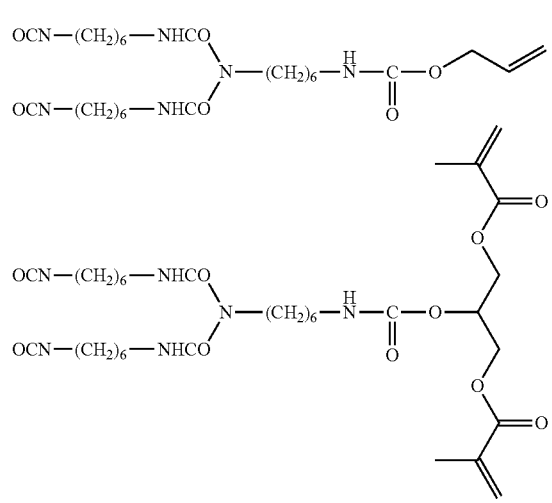
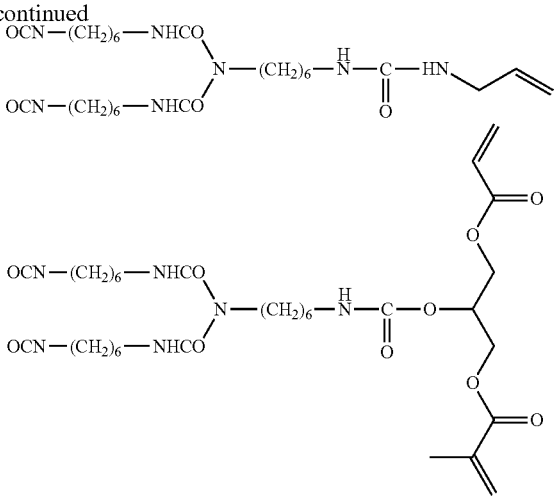
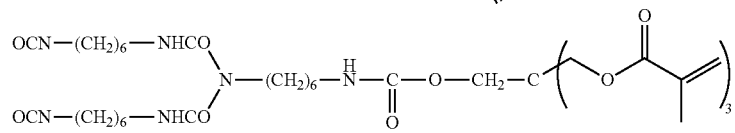
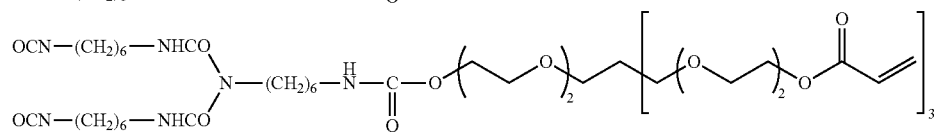
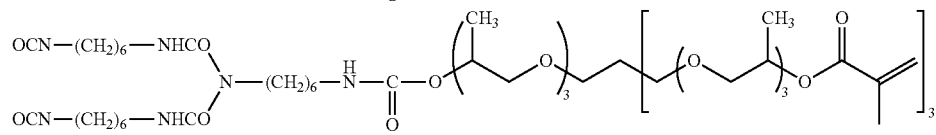

As the method of introducing the constitutional unit C into the specific polymer compound, a method of using, as a raw material, a diol compound that contains an ethylenically unsaturated group in a side chain is also suitably used. Such a diol compound may be a commercially available product such as trimethylolpropane monoallyl ether or a compound that is easily produced by reacting a halogenated diol compound, a triol compound, or an aminodiol compound with a carboxylic acid compound containing an ethylenically unsaturated group, an acid chloride compound, an isocyanate compound, an alcohol compound, an amine compound, a thiol compound, or a halogenated alkyl compound. Specific examples of these compounds include compounds described in paragraphs 0064 to 0066 of JP2002-251008 A.

Preferred specific examples of the constitutional unit C include those described below, but the present invention is not limited thereto. Further, R' represents a hydrogen atom or a single bond. In addition, a case where R' represents a single bond is a case where an imide group of a constitutional unit represented by any of Formulae B-3 to B-7 is formed.

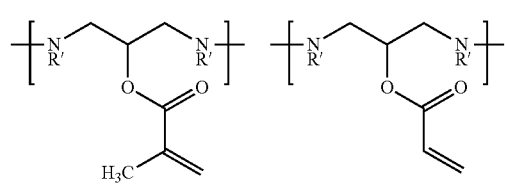
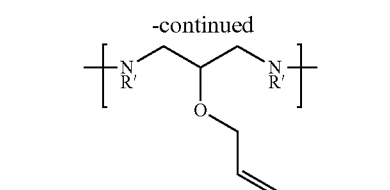
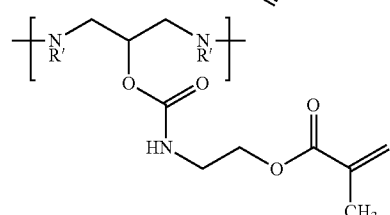
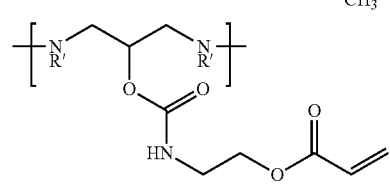
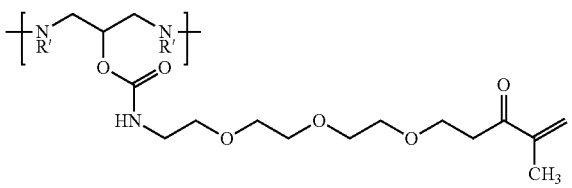

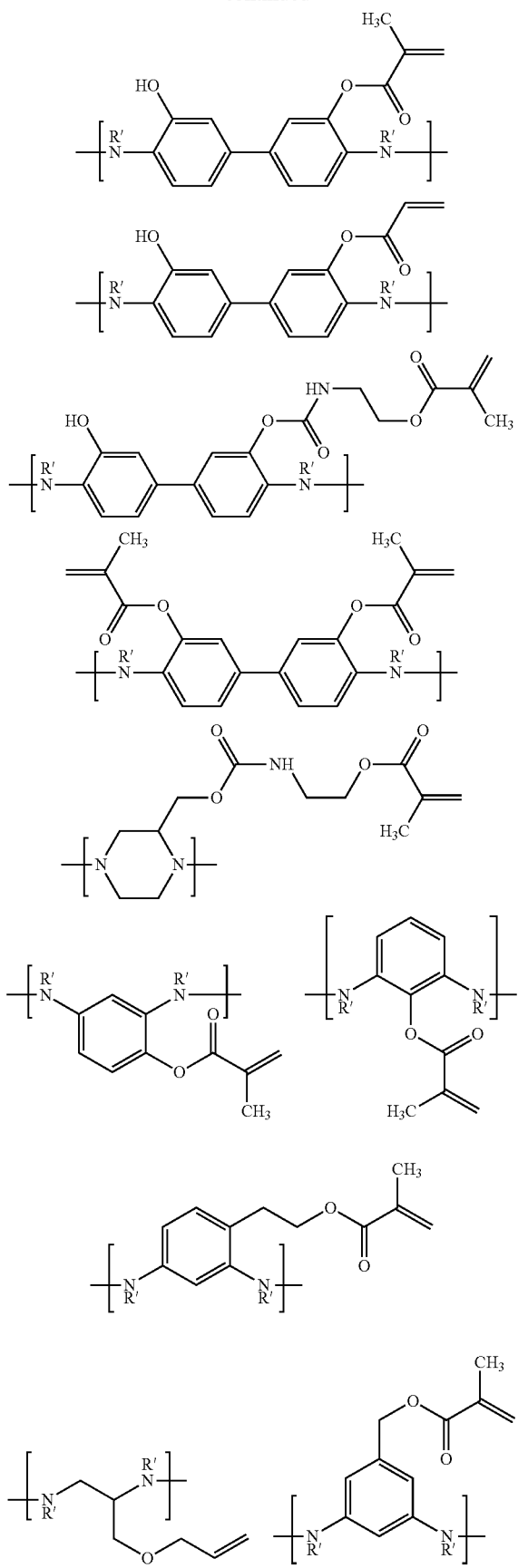
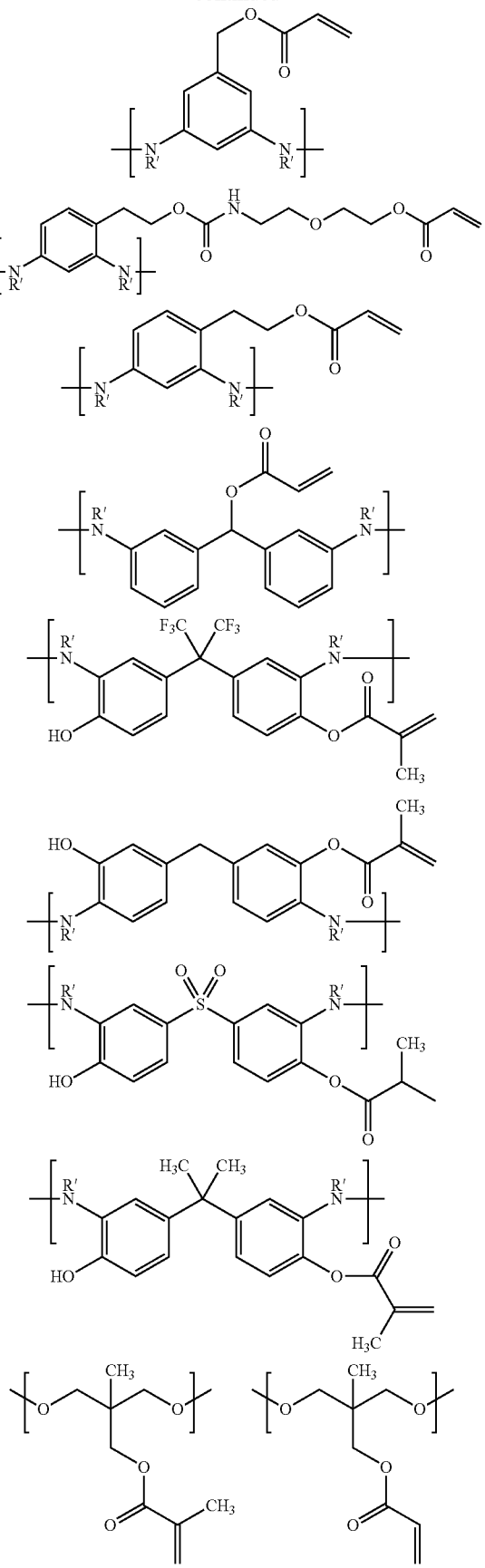

-continued

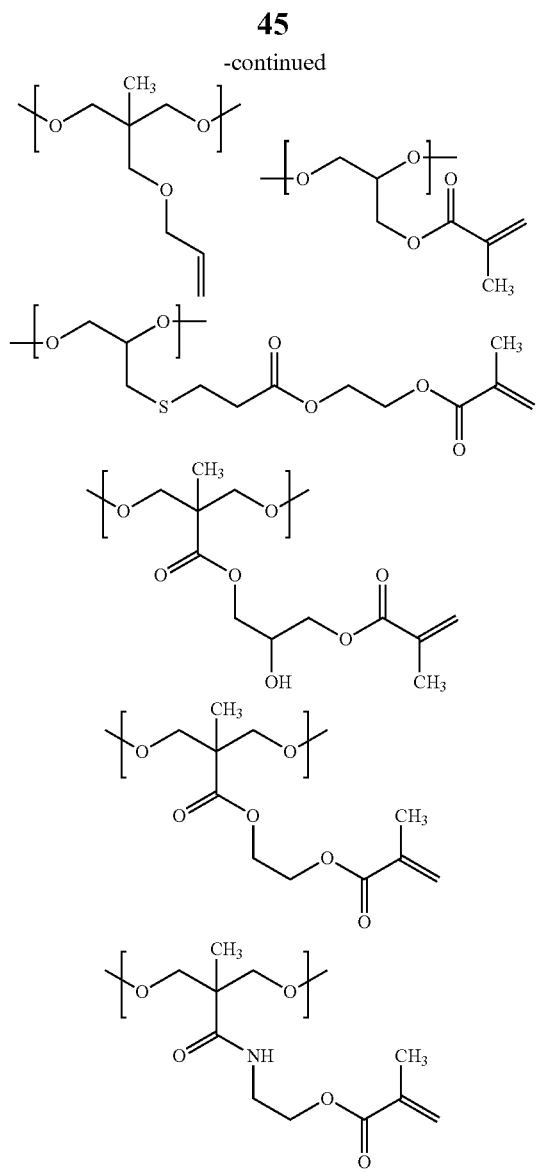

[Other Constitutional Units]

The specific polymer compound used in the present disclosure may have a constitutional unit other than the constitutional units A to C.

The specific polymer compound used in the present disclosure includes, as other constitutional units, preferably a constitutional unit containing a carboxyl group, more preferably a constitutional unit containing a carboxyl group that is directly bonded to an aromatic ring, and still more preferably at least the following constitutional units. Further, R' represents a hydrogen atom or a single bond. In addition, a case where R' represents a single bond is a case where an imide group of a constitutional unit represented by any of Formulae B-3 to B-7 is formed.

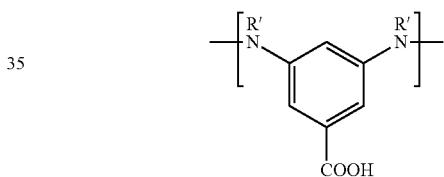

Further, examples of the diamine compound which is suitably obtained in order to form other constitutional units in the specific polymer compound are shown below.

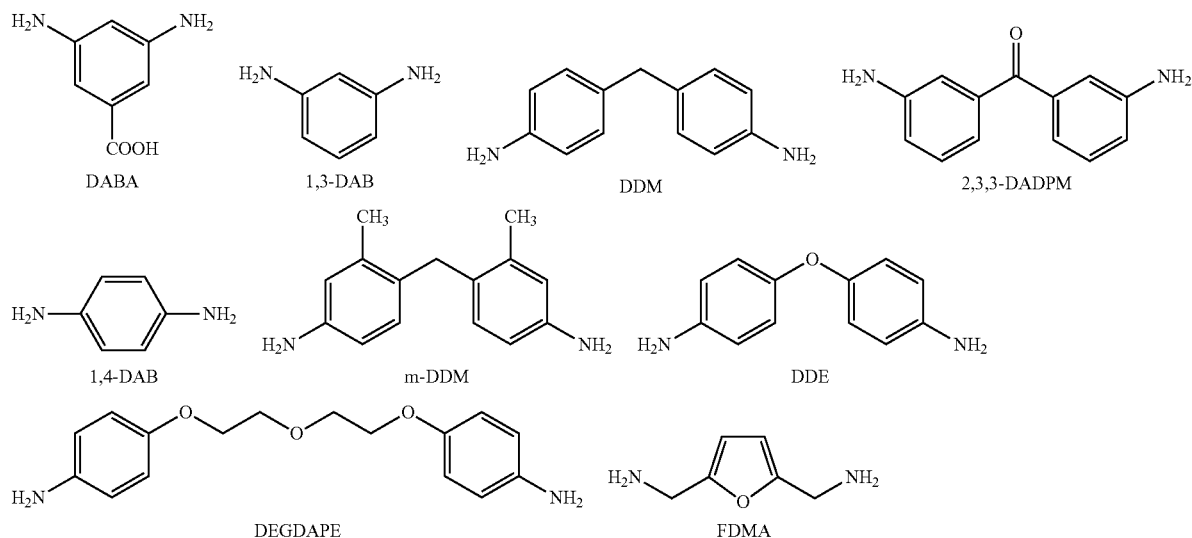

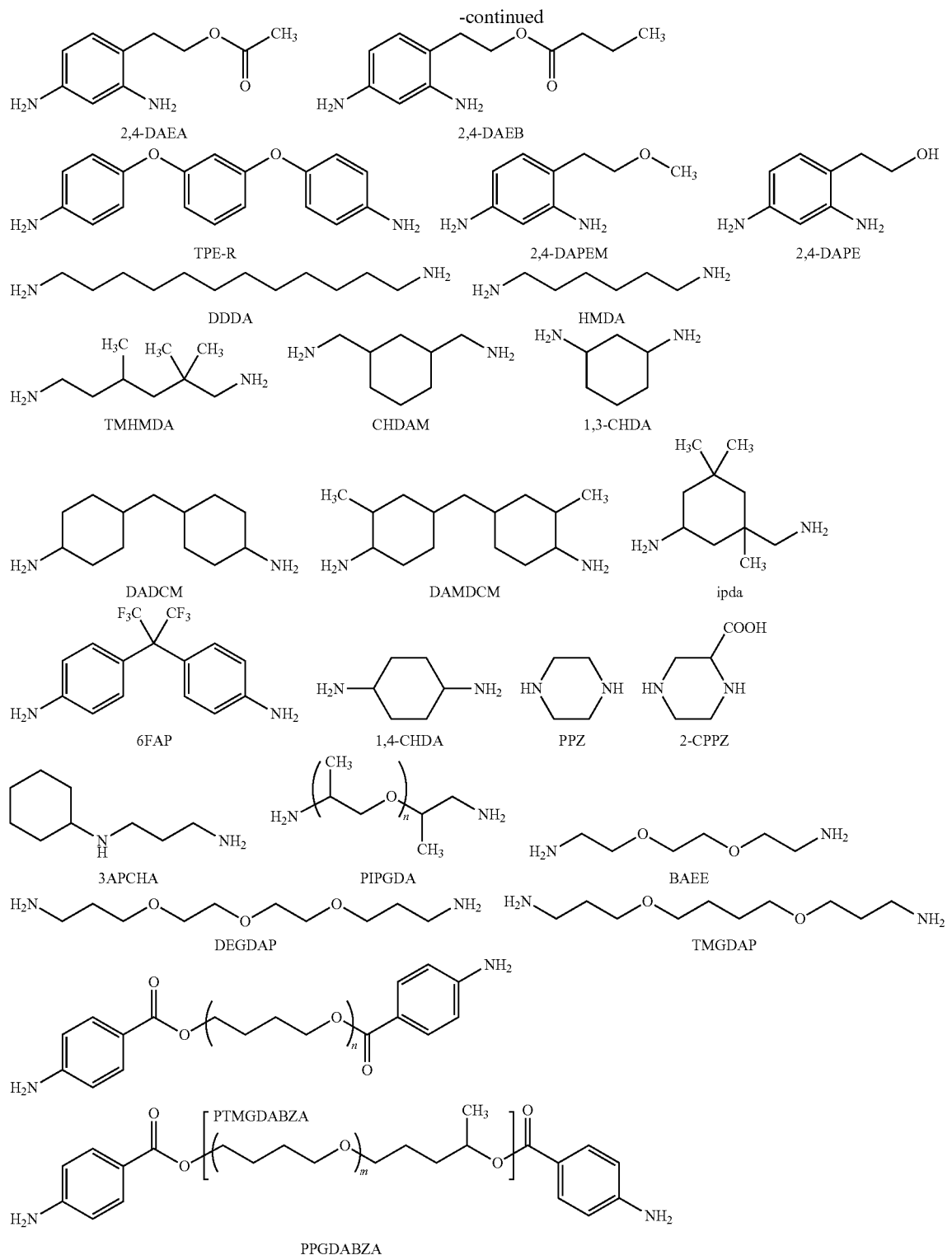

In addition, m and n each independently represent an integer of 1 to 100.

Specific examples of the specific polymer compound used in the present disclosure will be described below, but the present invention is not limited thereto. Further, the numerical values at the lower right of parentheses showing constitutional units indicate molar ratios. Moreover, the weight-average molecular weight (Mw) of an exemplary compound is a value measured according to a GPC method described below. R' in the following specific examples represents a hydrogen atom or a single bond. In addition, a case where R' represents a single bond is a case where an imide group is formed.

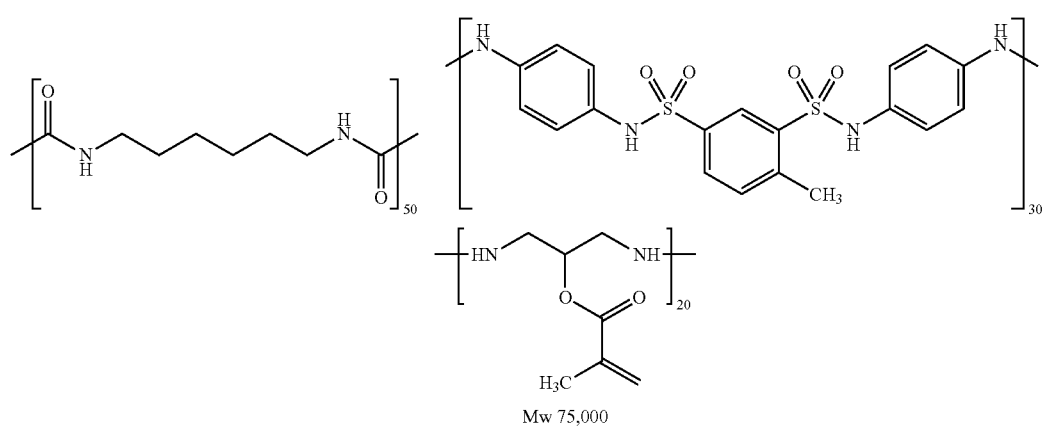
PU-1
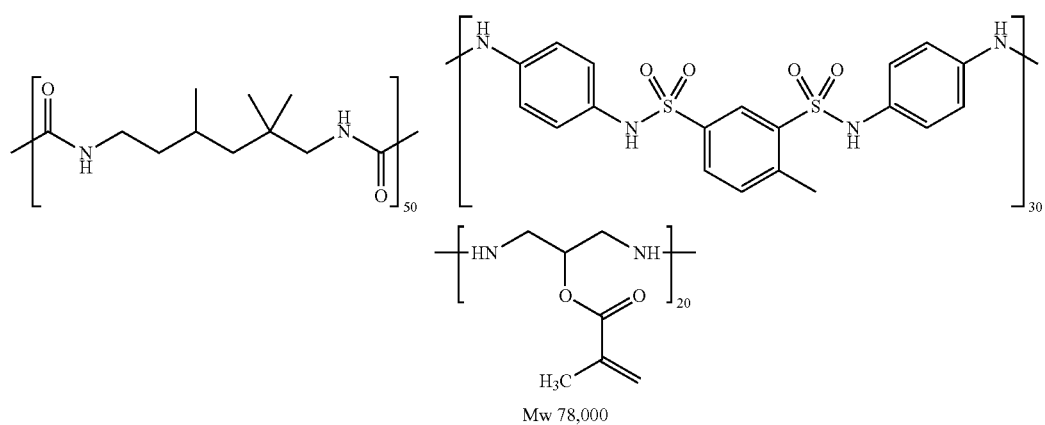
PU-2
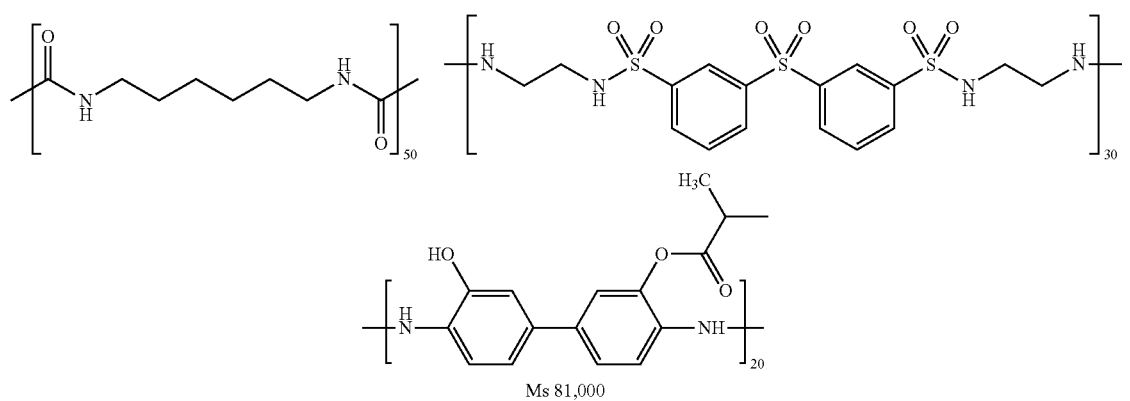
PU-3
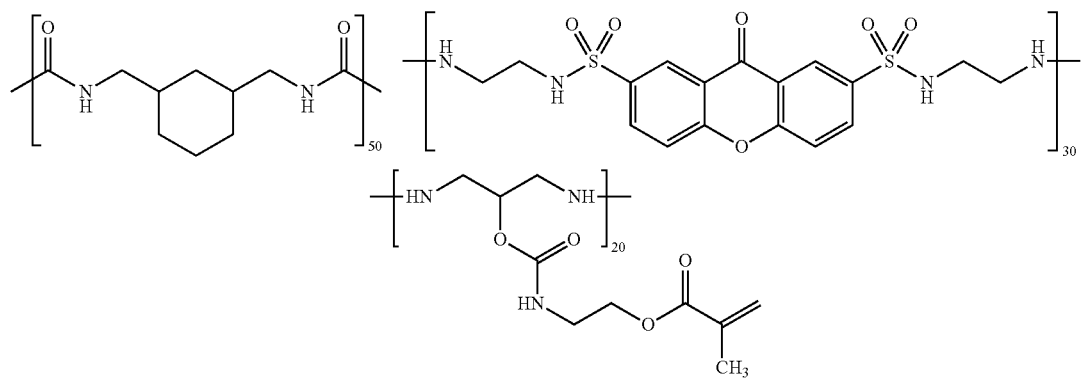
PU-4

-continued
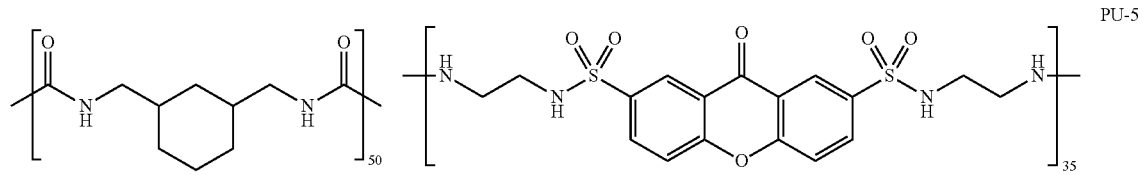
Mw 78,000
PU-5
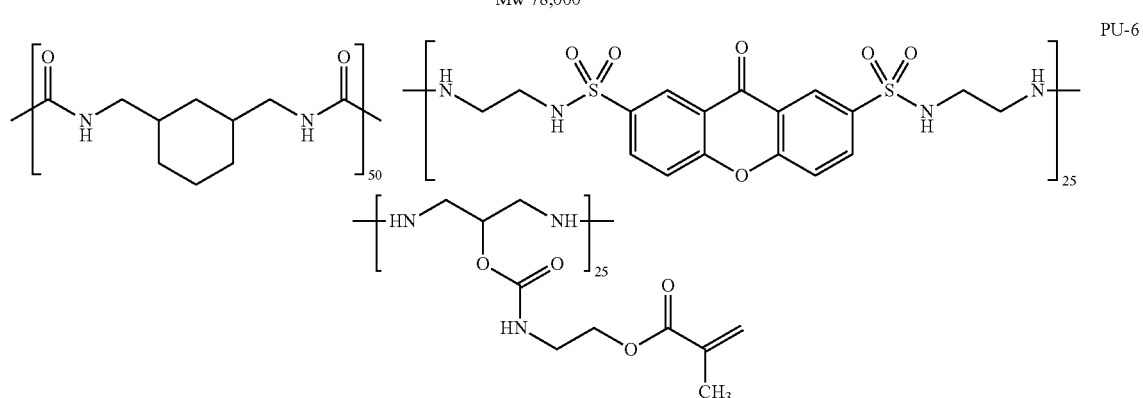
Mw 76,000
PU-6
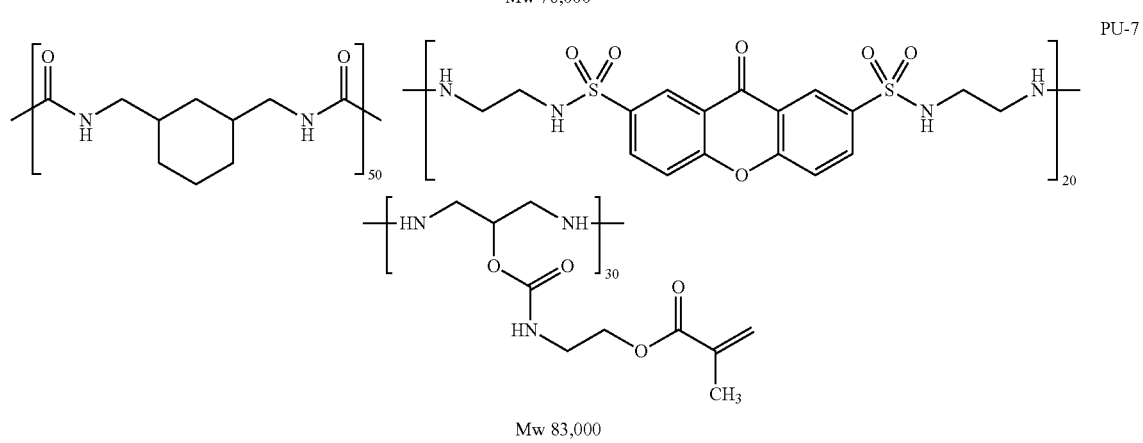
Mw 83,000
PU-7
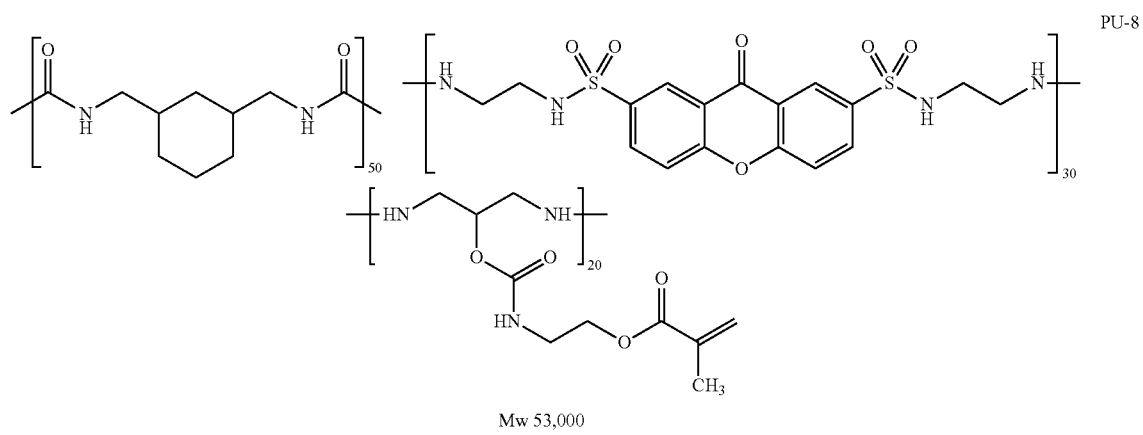
Mw 53,000
PU-8

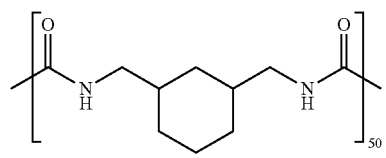
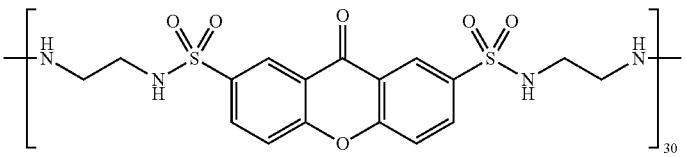
PU-9
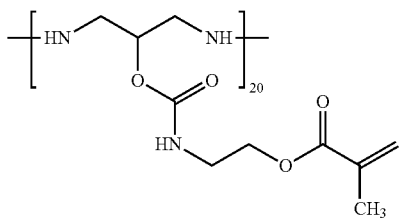
Mw 32,000
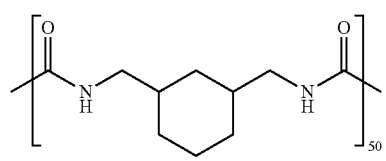
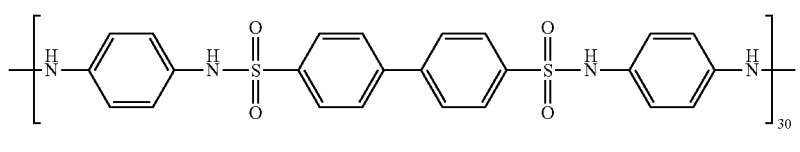
PU-10
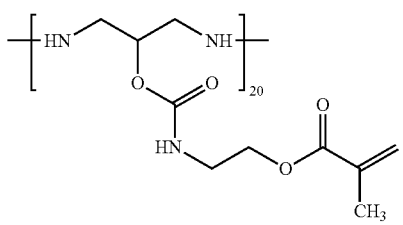
Mw 55,000
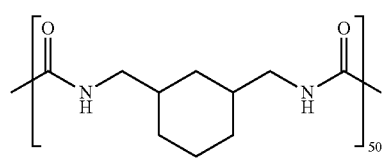
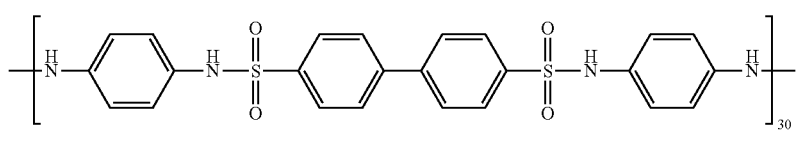
PU-11
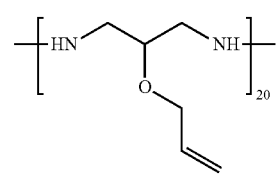
Mw 49,000
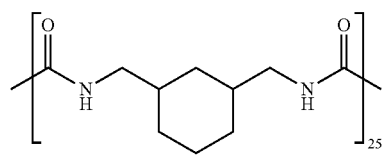
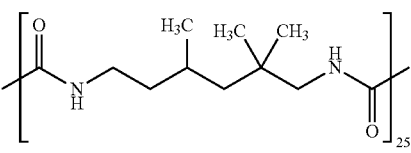
PU-12
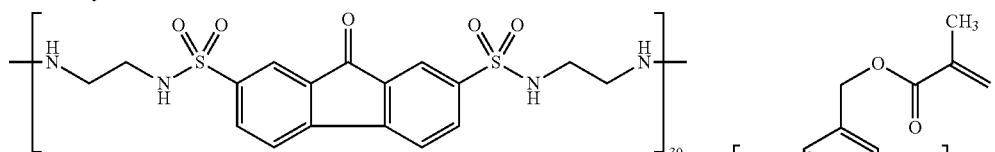
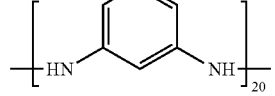
Mw 71,000

-continued
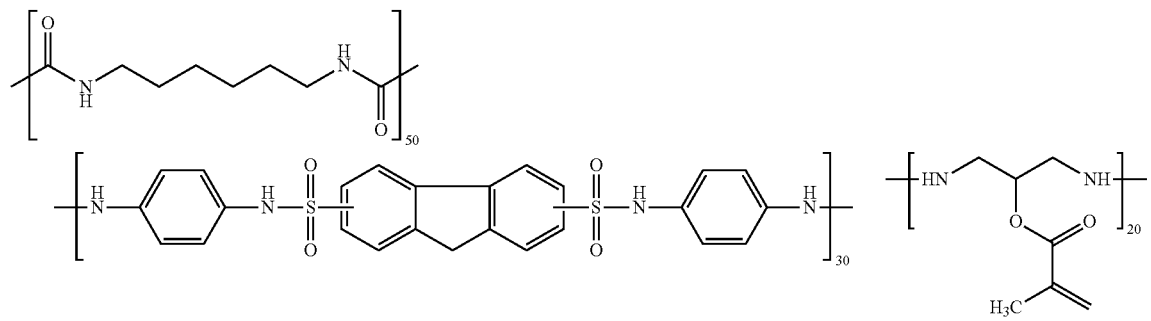
Mw 65,000
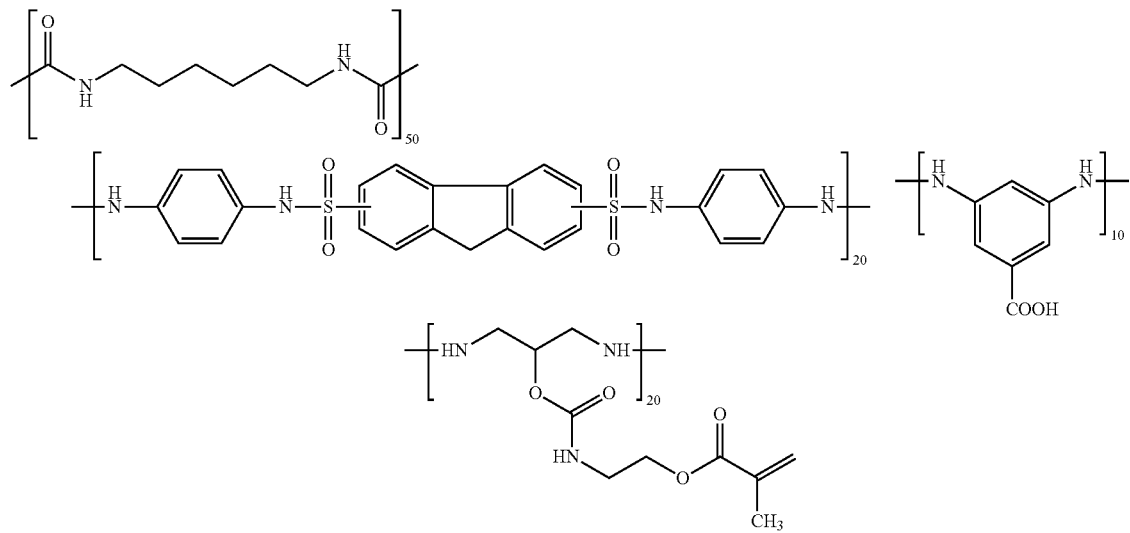
Mw 76,000
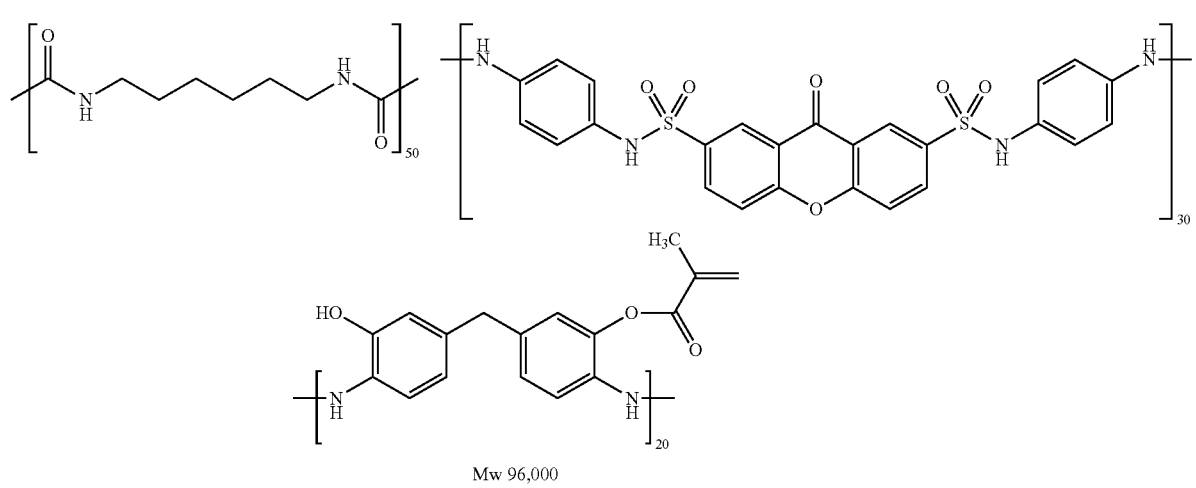
Mw 96,000
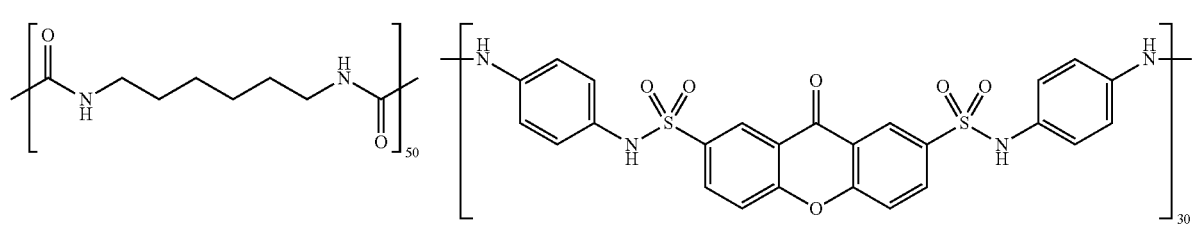

-continued
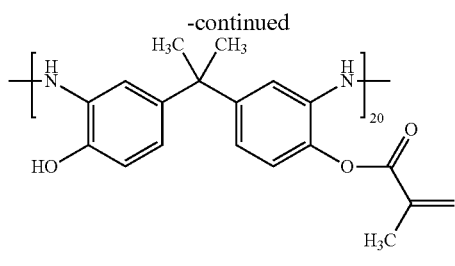
Mw 43,000
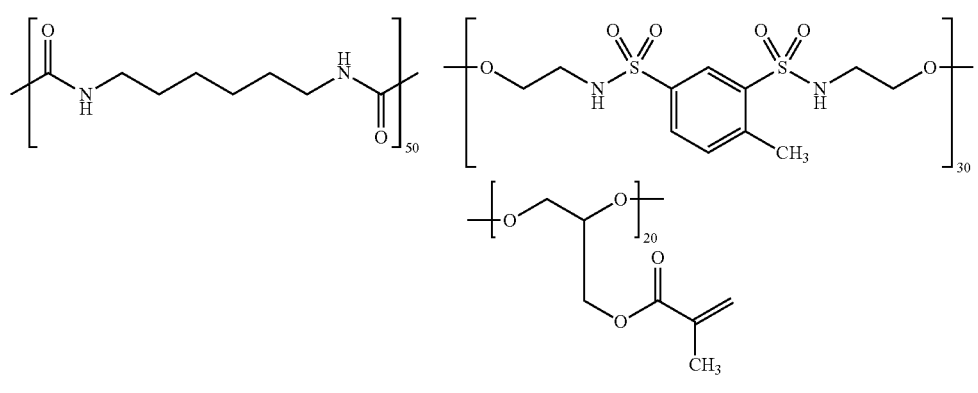
Mw 65,000
PUT-1
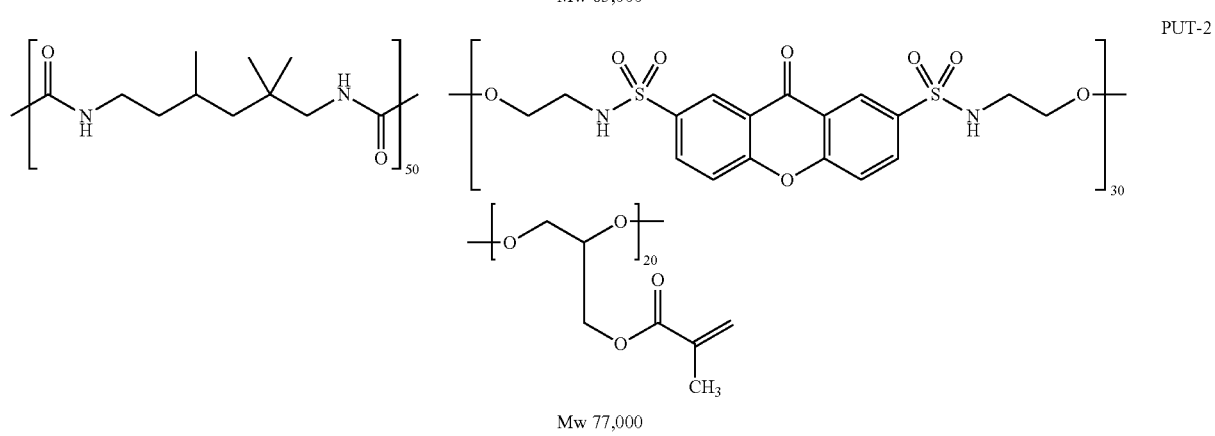
Mw 77,000
PUT-2
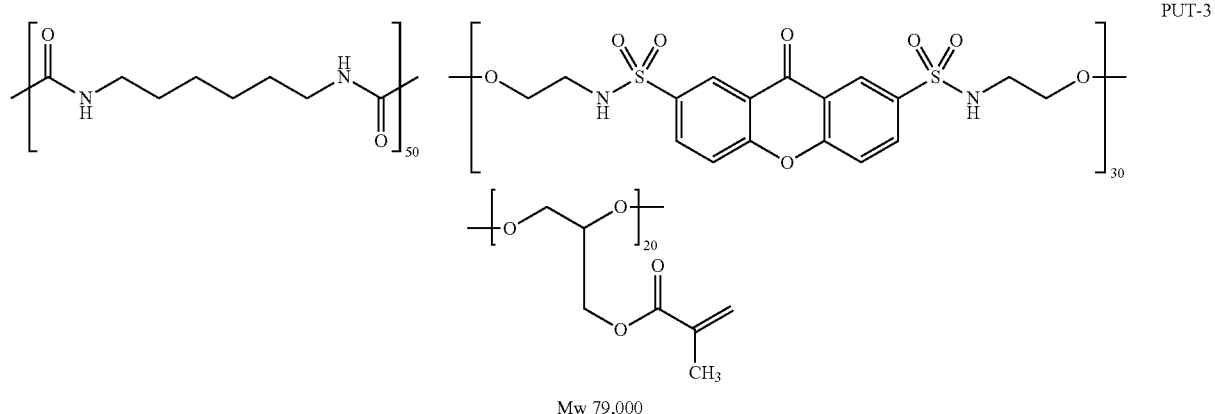
Mw 79,000
PUT-3
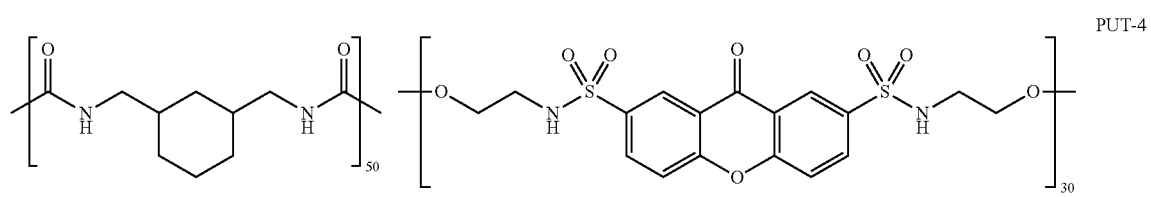
PUT-4

-continued
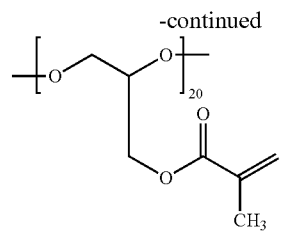
Mw 78,000
PUT-5
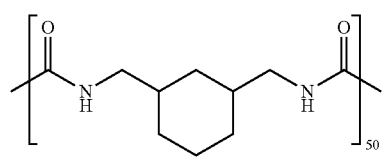 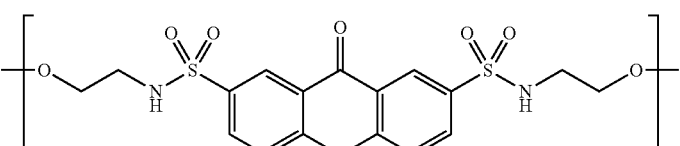
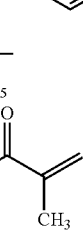
Mw 73,000
PUT-6
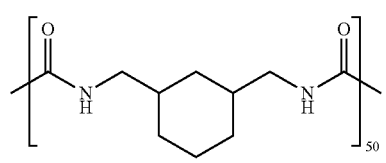 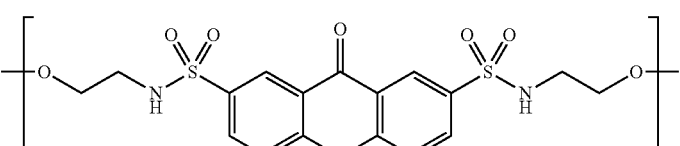
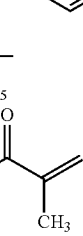
Mw 79,000
PUT-7
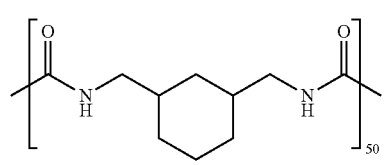 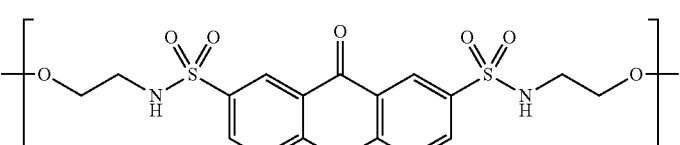
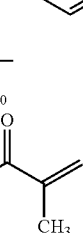
Mw 78,000
PUT-8
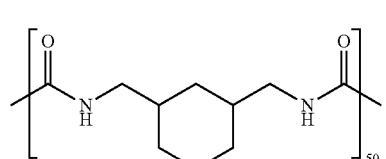 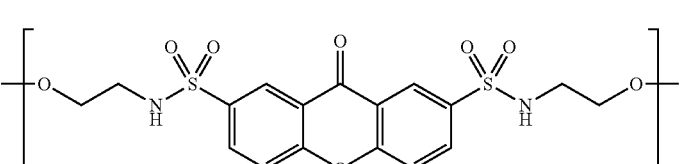

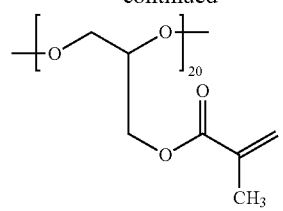
Mw 54,000
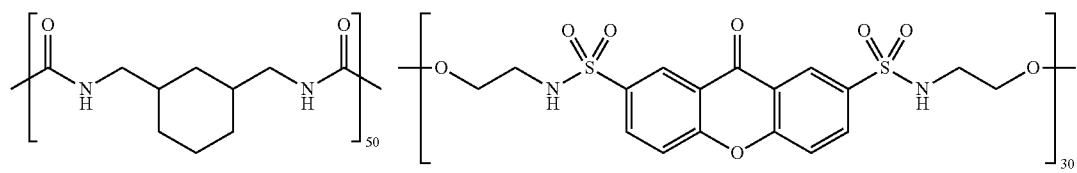
PUT-9
Mw 33,000
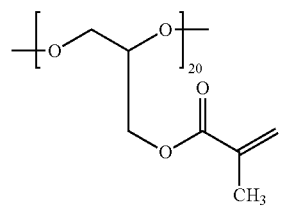
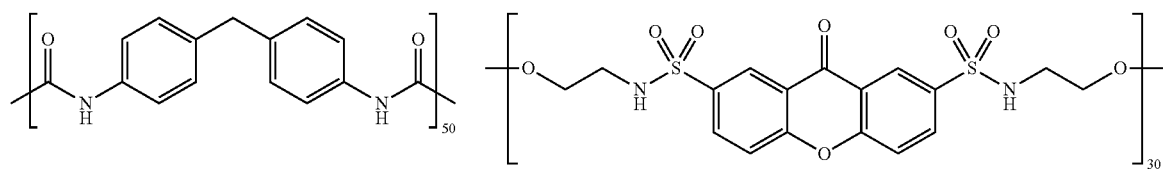
PUT-10
Mw 56,000
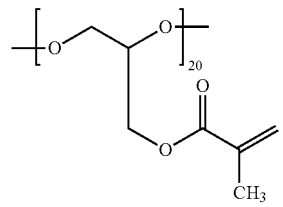
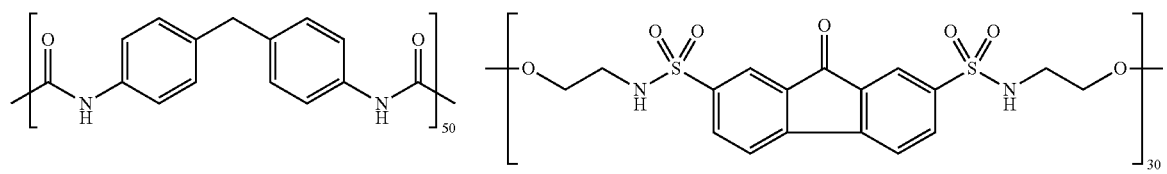
PUT-11
Mw 50,000
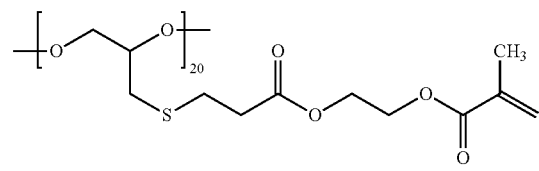
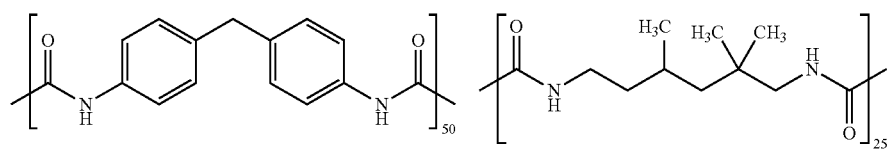
PUT-12

-continued
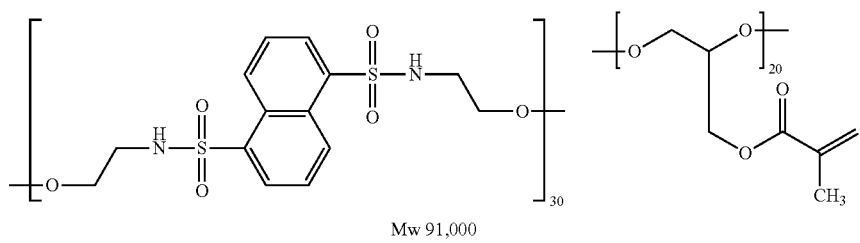
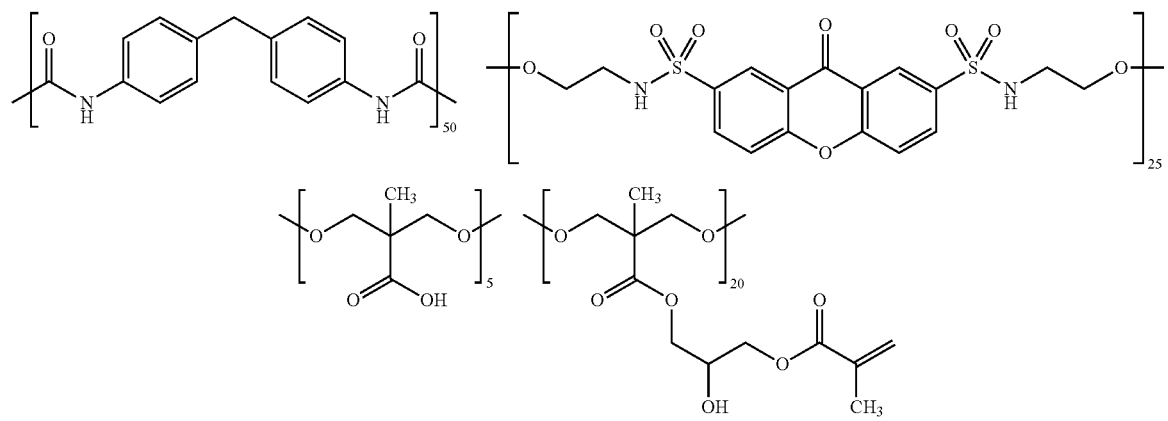
PUT-13
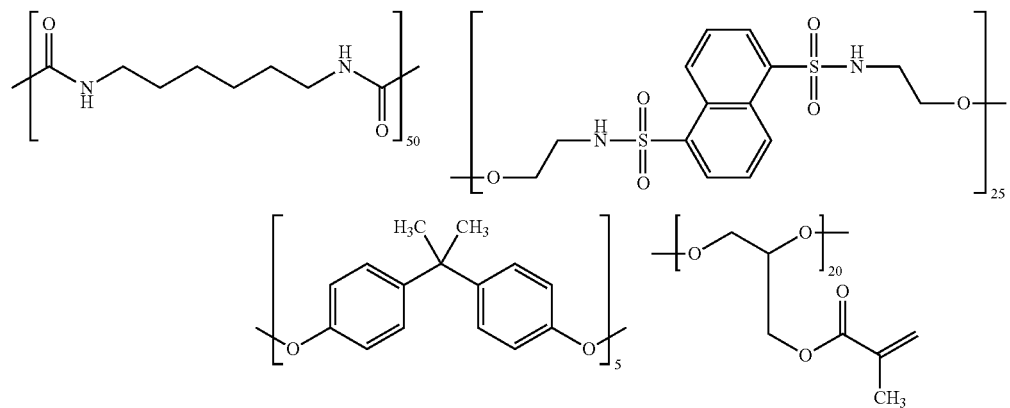
PUT-14
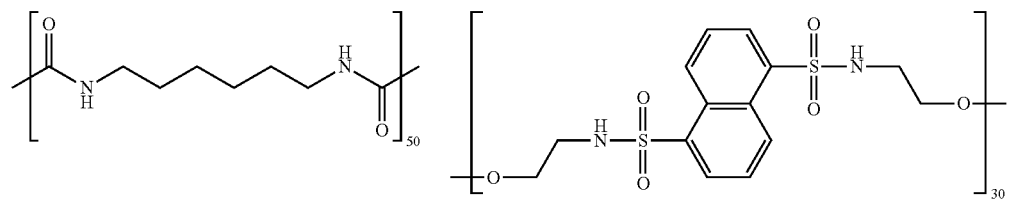
PUT-15

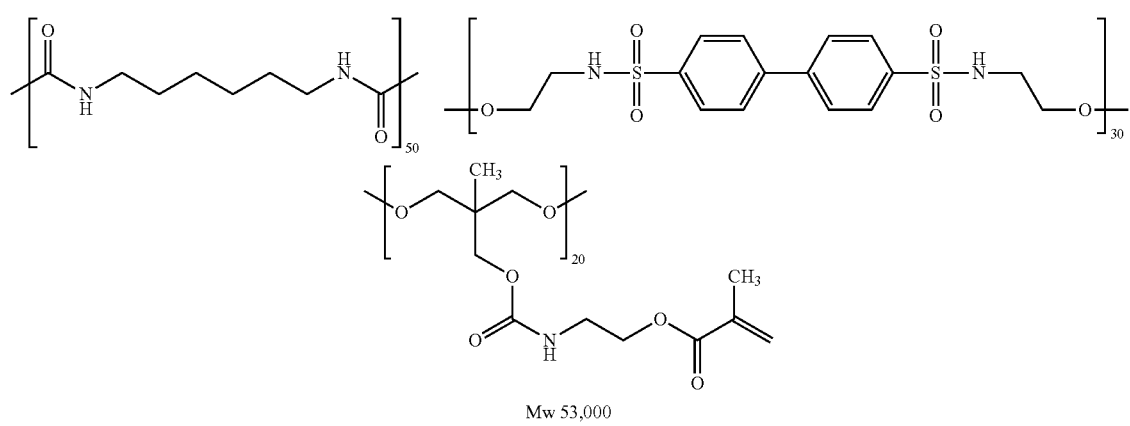
PUT-16
Mw 53,000
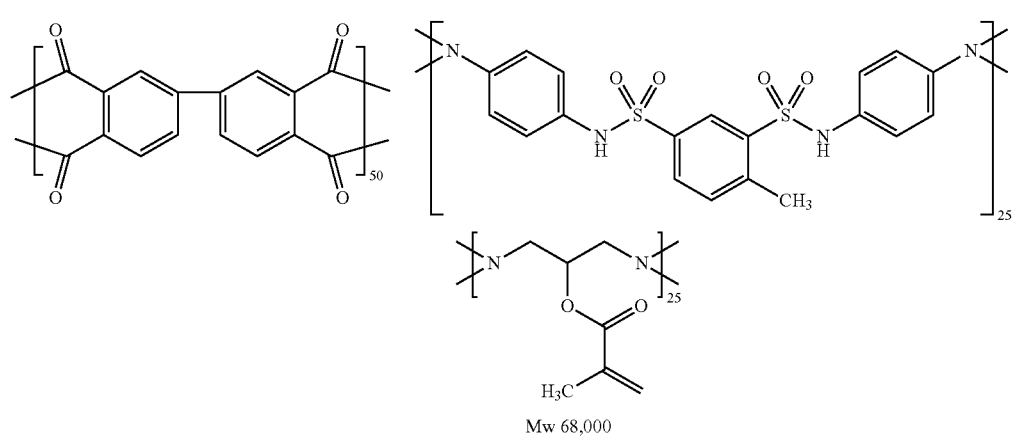
PA-1
Mw 68,000
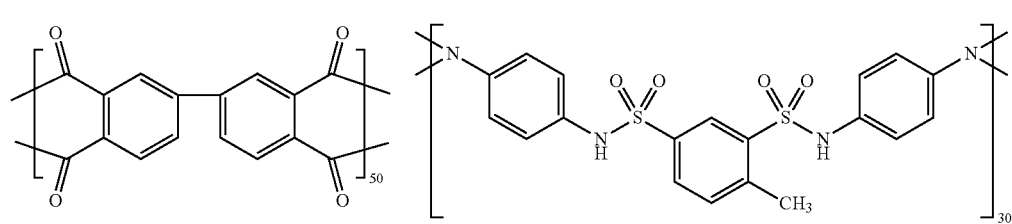
PA-2
Mw 77,000
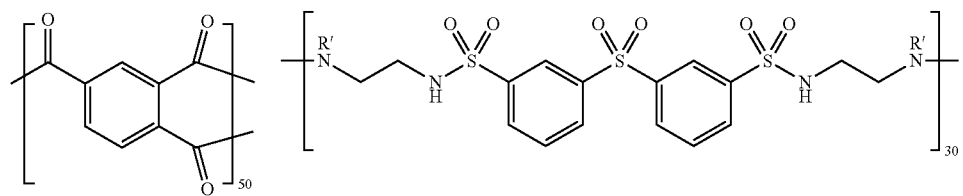
PA-3

-continued
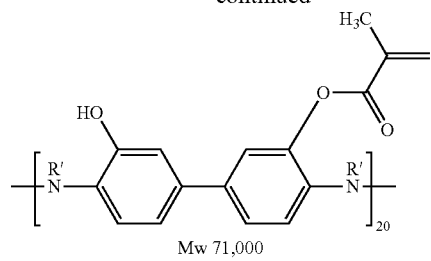
Mw 71,000
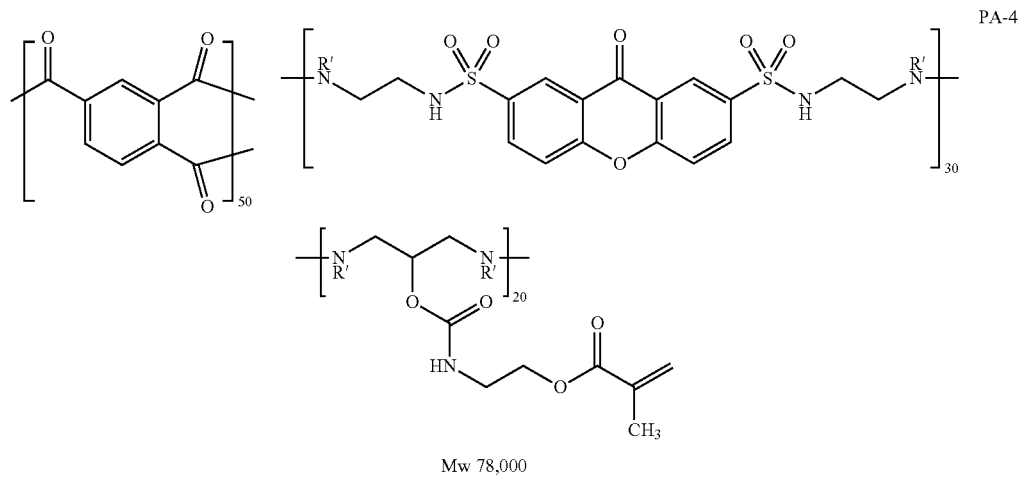
Mw 78,000
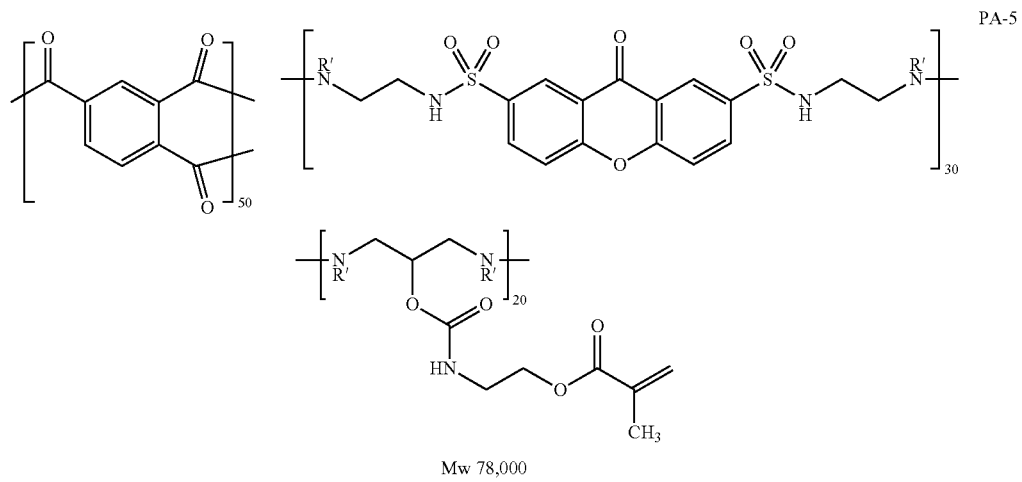
Mw 78,000
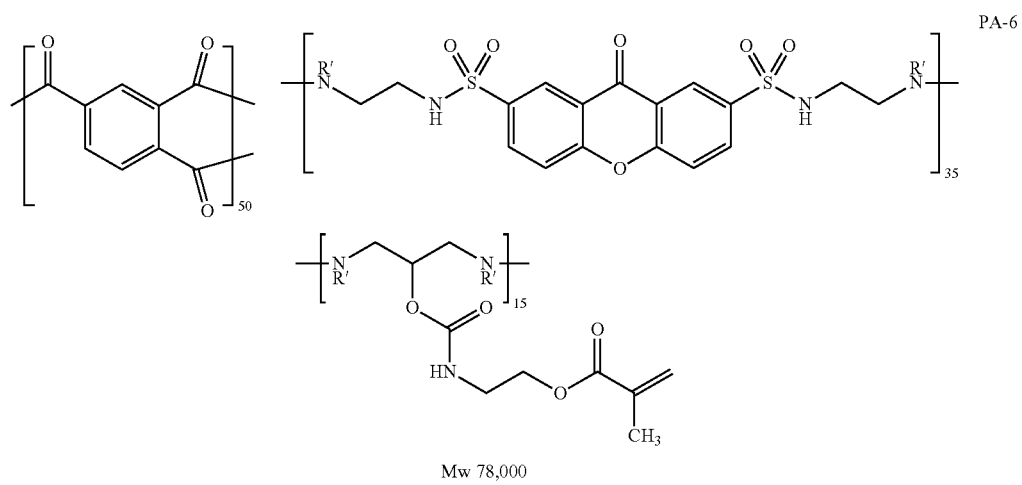
Mw 78,000

-continued
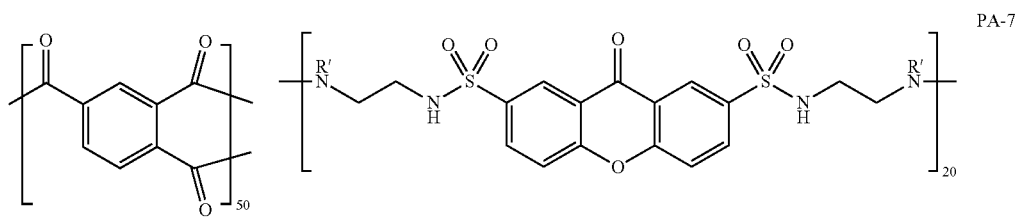
PA-7
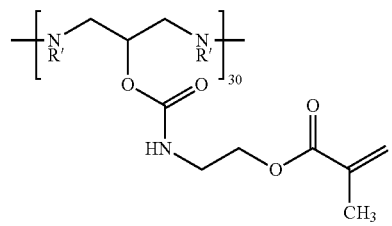
Mw 78,000
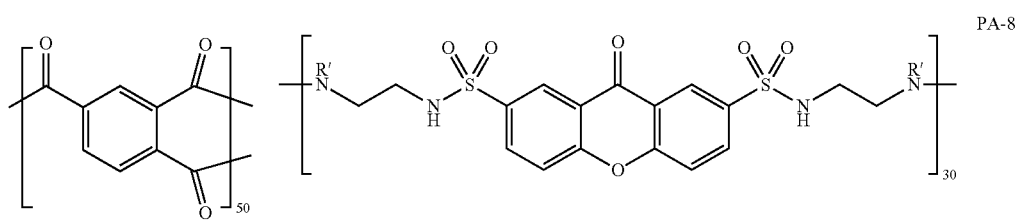
PA-8
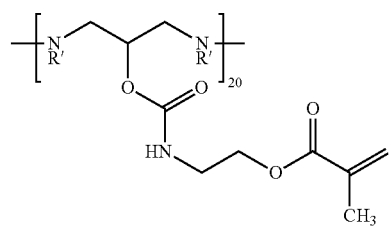
Mw 54,000
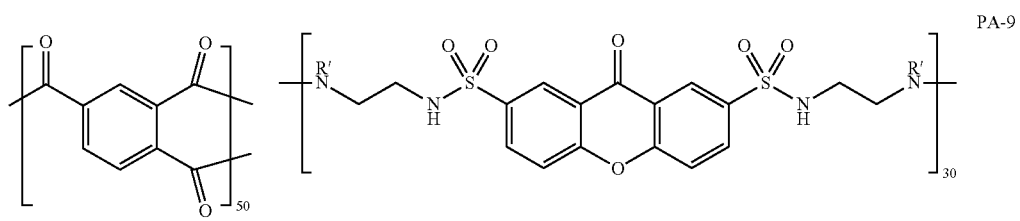
PA-9
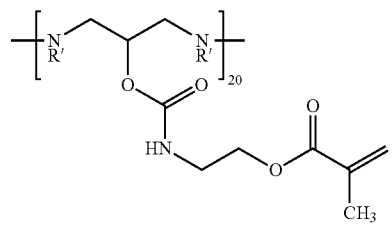
Mw 35,000
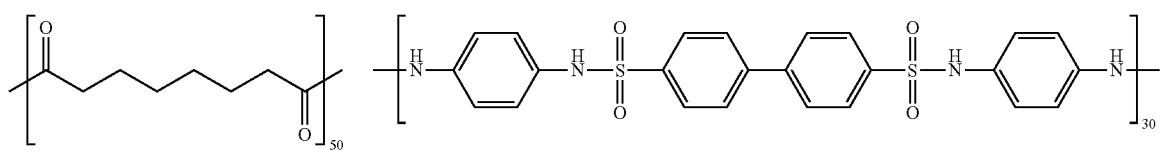
PA-10

-continued
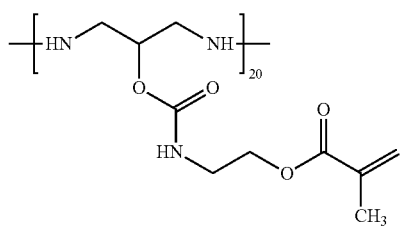
Mw 56,000
PA-11
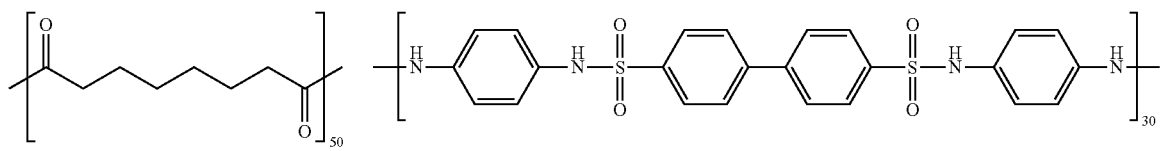
Mw 49,000
PA-12
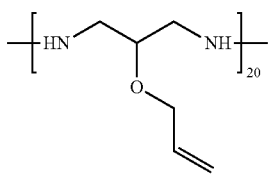
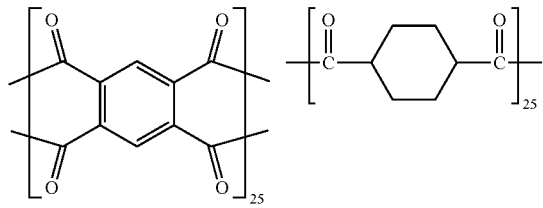
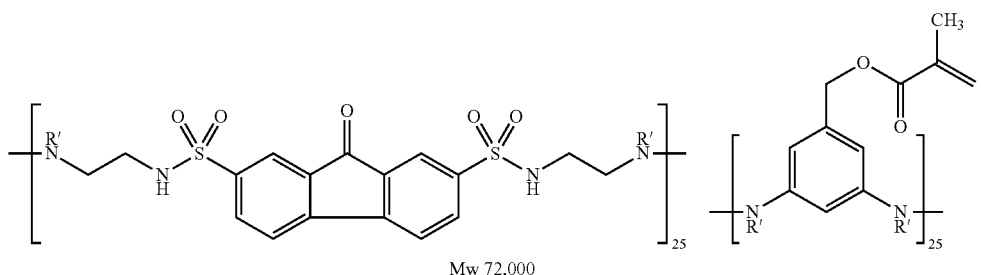
Mw 72,000
PA-13
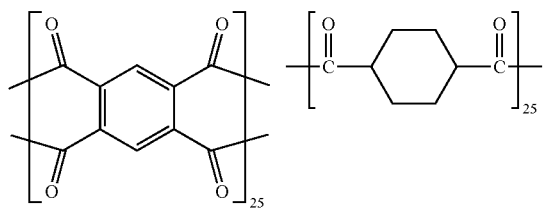
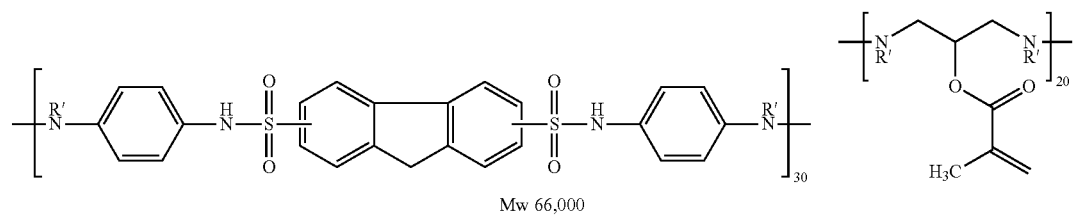
Mw 66,000

-continued
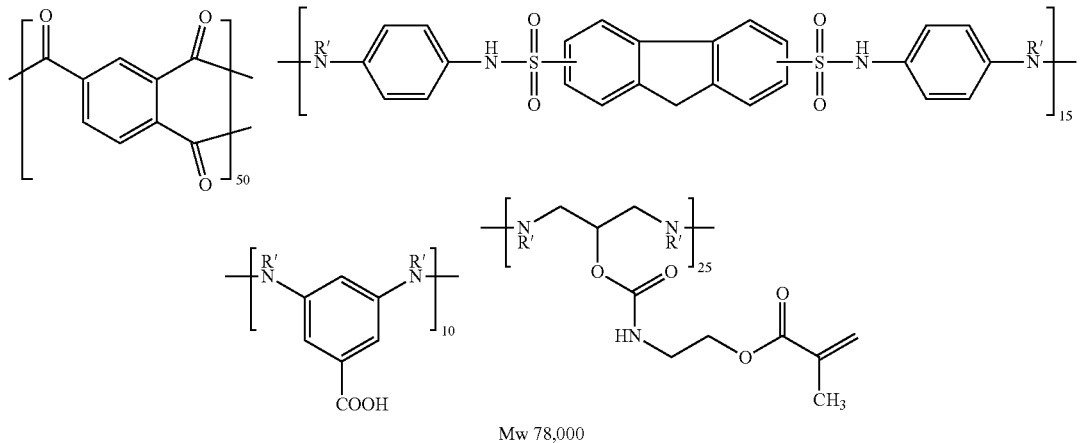
PA-14
Mw 78,000
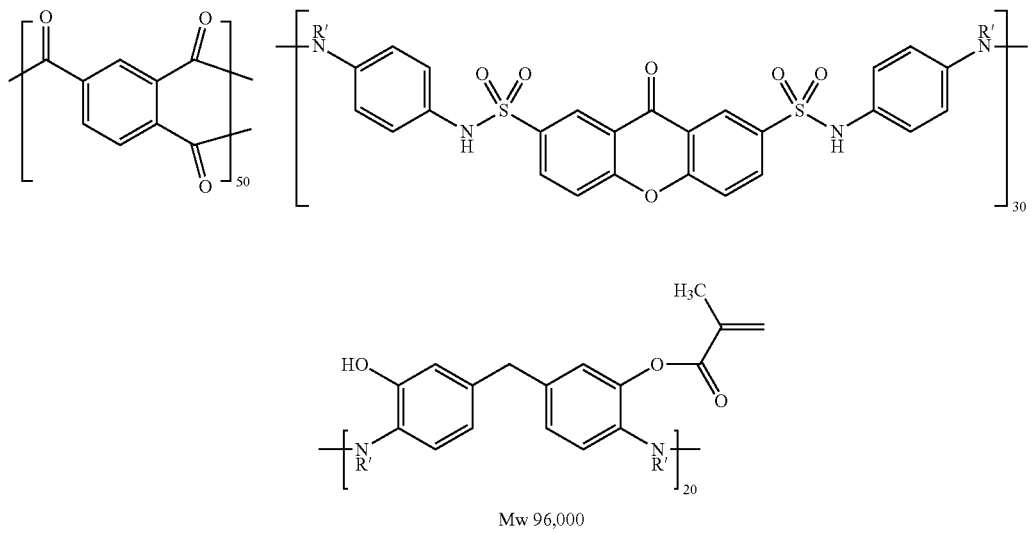
PA-15
Mw 96,000
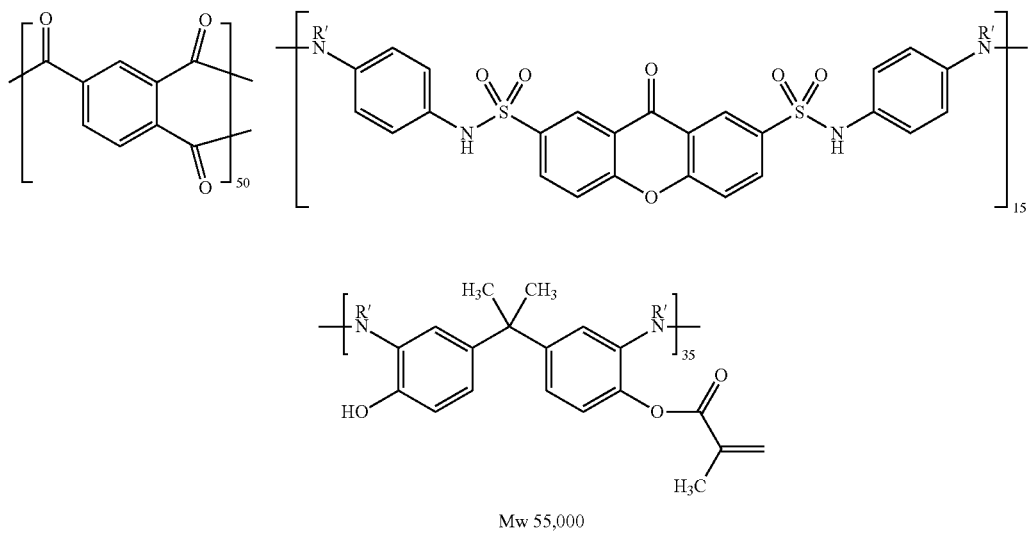
PA-16
Mw 55,000

Further, it is needless to say that the exemplary compounds can be rewritten as described below using PU-1 or PA-1 as an example.

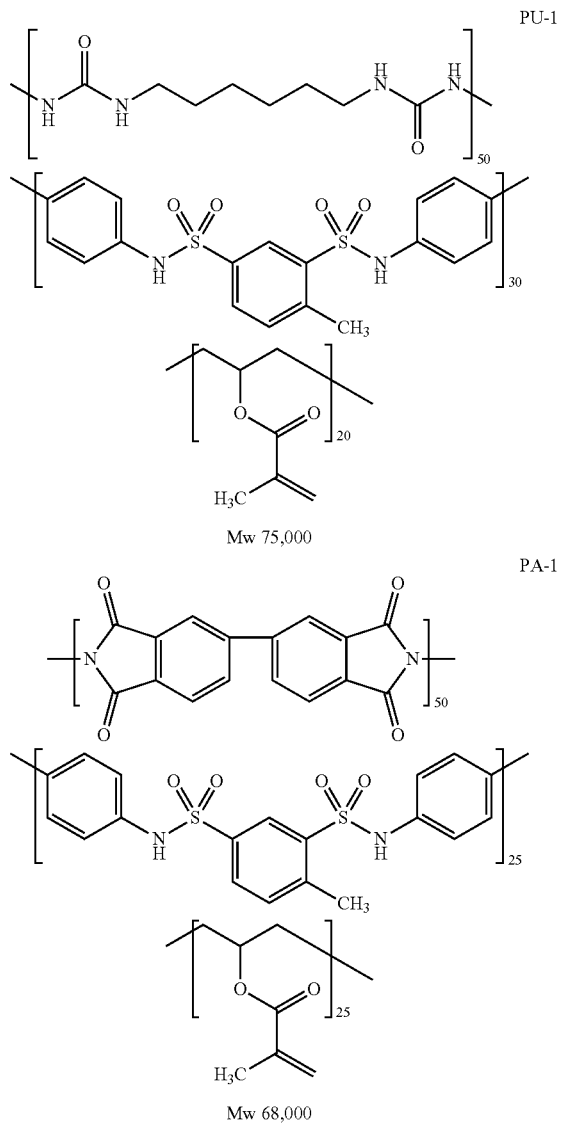

The molar ratio between the constitutional unit A and the constitutional unit B in the polymer compound having the constitutional unit A and the constitutional unit B is preferably in a range of 1.5:1 to 1:6, more preferably in a range of 1:1 to 1:4, and still more preferably in a range of 1:1 to 1:2. In a case where the content of the constitutional unit A and the constitutional unit B is in the above-described range, a planographic printing plate with excellent chemical resistance can be obtained.

The molar ratio between the constitutional unit A and the constitutional unit C in the polymer compound having the constitutional unit A and the constitutional unit C is preferably in a range of 3:1 to 1:3, more preferably in a range of 2:1 to 1:2, and still more preferably in a range of 1.5:1 to 1:1.5. In a case where the content of the constitutional unit A and the constitutional unit C is in the above-described range, a planographic printing plate which is capable of further suppressing generation of development scum at the time of development and has excellent printing durability can be obtained.

The molar ratio between the sulfonamide bond and the ethylenically unsaturated group in the specific polymer compound (sulfonamide bond:ethylenically unsaturated group) is preferably in a range of 10:1 to 1:2, more preferably in a range of 5:1 to 1:1.5, and particularly preferably in a range of 3:1 to 1:1. In a case where the molar ratio thereof is in the above-described range, a planographic printing plate which is capable of further suppressing generation of development scum at the time of development and has excellent printing durability can be obtained.

The weight-average molecular weight of the specific polymer compound in the photosensitive resin composition of the present disclosure is preferably in a range of 5000 to 300000, more preferably in a range of 10000 to 200000, and still more preferably in a range of 30000 to 100000.

Further, it is preferable that the weight-average molecular weight or the number average molecular weight in the present disclosure is measured according to a standard polystyrene conversion method using a gel permeation chromatography (GPC) method. It is preferable that the measurement according to the gel permeation chromatography method in the present disclosure is performed using a column filled with a polystyrene cross-linked gel (TSKgel SuperAWM-H; manufactured by Tosoh Corporation) as a GPC column and N-methylpyrrolidone (0.01 mol/L of each of phosphoric acid and lithium bromide) as a GPC solvent.

The specific polymer compound may be used alone or in combination of two or more kinds thereof.

The content of the specific polymer compound in the photosensitive resin composition of the present disclosure is preferably in a range of 10% to 90% by mass, more preferably in a range of 20% to 80% by mass, and still more preferably in a range of 40% to 70% by mass with respect to the total solid content of the photosensitive resin composition. In a case where the content is in the above-described range, the pattern formability at the time of development becomes excellent. Further, the total solid content of the photosensitive resin composition indicates an amount obtained by excluding volatile components such as a solvent.

<Polymerization Initiator>

The photosensitive resin composition of the present disclosure contains a polymerization initiator.

As the polymerization initiator used in the present disclosure, a compound that generates a radical using light or heat or the energy of both light and heat, and starts and promotes polymerization of a polymerizable compound can be used. Specific examples thereof include known thermal polymerization initiators, compounds having bonds with small bond dissociation energy, and photopolymerization initiators.

In the present disclosure, it is preferable that the polymerization initiator is a photopolymerization initiator. The polymerization initiator can be used alone or in combination of two or more kinds thereof.

Examples of the radical generator include (a) an organic halogenated compound, (b) a carbonyl compound, (c) an organic peroxide compound, (d) an azo type polymerization initiator, (e) an azide compound, (f) a metallocene compound, (g) a hexaarylbiimidazole compound, (h) an organic boric acid compound, (i) a disulfonic acid compound, (j) an oxime ester compound, and (k) an onium salt compound.

Particularly from the viewpoints of reactivity and stability, a diazonium salt, an iodonium salt, and a sulfonium salt included in the (g) hexaarylbiimidazole compound, the (j) oxime ester compound, and the (k) onium salt compound from among the above-described compounds are suitably exemplified as the polymerization initiator in the present disclosure. In the present disclosure, the onium salt functions not as an acid generator but as an ionic radical polymerization initiator.

As the polymerization initiator, an onium salt compound is preferable, an iodonium salt compound or a sulfonium salt compound is more preferable, and a diaryliodonium salt compound or a triaryl sulfonium salt compound is still more preferable.

As the diaryliodonium salt compound or the triaryl sulfonium salt compound, from the viewpoint of the balance between reactivity and stability, a diaryliodonium salt compound having an electron-donating group on an aromatic ring or a triaryl sulfonium salt compound having an electron-withdrawing group on an aromatic ring is preferable; a diaryliodonium salt compound having two or more alkoxy groups on an aromatic ring is more preferable; and a diaryliodonium salt compound having three or more alkoxy groups on an aromatic ring is particularly preferable.

The polymerization initiator may be used alone or in combination of two or more kinds thereof.

The content of the polymerization initiator in the photosensitive resin composition of the present disclosure is preferably in a range of 0.1% to 50% by mass, more preferably in a range of 0.5% to 30% by mass, and particularly preferably in a range of 1% to 20% by mass with respect to the total solid content of the photosensitive resin composition. In a case where the content thereof is in the above-described range, curability with high sensitivity is obtained and excellent sensitivity and excellent stain resistance of a non-image area during printing are obtained.

<Polymerizable Compound>

The photosensitive resin composition of the present disclosure may contain a polymerizable compound.

The polymerizable compound used in the present disclosure is a polymerizable compound containing at least one ethylenically unsaturated group and is selected from compounds containing at least one and preferably two or more terminal ethylenically unsaturated groups. Such a compound group has been widely known in the industrial field and these can be used without particular limitation in the present disclosure. The polymerizable compounds have chemical forms such as a monomer, a pre-polymer, that is, a dimer, a trimer, an oligomer, and a copolymer of these.

As the examples of the monomer and the copolymer thereof, compounds having an ethylenically unsaturated double bond described in paragraphs 0105 to 0119 of JP2008-107758 A are suitably used.

The details of the structures of the polymerizable compounds, whether to be used alone or in combination, and the usage method such as the addition amount can be arbitrarily set according to the performance design of the planographic printing plate precursor. For example, from the viewpoint of the photosensitive speed, a structure having a large amount of unsaturated groups per molecule is preferable. In many cases, bi- or high functional groups are preferable. Further, in order to increase the strength of an image area, that is, a cured film, tri- or high functional groups may be suitable, and a method of adjusting both of photosensitivity and strength by combining polymerizable compounds having different functional numbers or different polymerizable groups (for example, an acrylic acid ester compound, a methacrylic acid ester compound, a styrene compound, and a vinyl ether compound) is useful. Compounds having a high molecular weight or compounds having excellent hydrophobicity are excellent in photosensitive speed or film hardness. However, the development speed or deposition in a developer is not preferable in some cases. In terms of compatibility with other components (for example, a binder polymer, a polymerization initiator, and a colorant) in an image recording layer and dispersibility, a method of selecting or using a polymerization compound is an important factor. For example, the compatibility can be improved by using compounds with low purity or combining two or more compounds.

The polymerizable compound may be used alone or in combination of two or more kinds thereof.

The content of the polymerizable compound in the photosensitive resin composition of the present disclosure is preferably in a range of 5% to 80% by mass and more preferably in a range of 25% to 75% by mass with respect to the total solid content of the photosensitive resin composition.

<Sensitizing Dye>

It is preferable that the photosensitive resin composition of the present disclosure contains a sensitizing dye.

The sensitizing dye used in the present disclosure can be used without particular limitation as long as the sensitizing dye absorbs light at the time of image exposure to enter an excited state, donates energy to the polymerization initiator through electron transfer, energy transfer, or heat generation, and improves the function of initiating polymerization. Particularly, a sensitizing dye having a maximum absorption wavelength at 300 to 600 nm or 700 to 1300 nm is preferably used.

Preferred examples of the sensitizing dye having a maximum absorption wavelength at 300 to 600 nm include dyes such as merocyanines, benzopyrans, coumarins, aromatic ketones, anthracenes, styryls, and oxazoles.

Specific preferred examples of such sensitizing dyes include compounds described in paragraphs 0047 to 0053 of JP2007-58170 A, paragraphs 0036 and 0037 of JP2007-93866 A, and paragraphs 0042 to 0047 of JP2007-72816 A.

Further, sensitizing dyes described in JP2006-189604 A, JP2007-171406 A, JP2007-206216 A, JP2007-206217 A, JP2007-225701 A, JP2007-225702 A, JP2007-316582 A, and JP2007-328243 A can be also preferably used.

It is preferable that the photosensitive resin composition of the present disclosure contains a sensitizing dye (hereinafter, also referred to as an "infrared absorbent") having a maximum absorption wavelength of 700 to 1300 nm.

In the present disclosure, in a case where exposure is performed using laser emitting infrared rays having a wavelength of 700 to 1300 nm as a light source, an infrared absorbent having maximum absorption wavelength in this wavelength range is preferably used as a sensitizing dye.

The infrared absorbent has a function of converting absorbed infrared rays into heat. Due to the heat generated at this time, the radical generator (polymerization initiator) is thermally decomposed to generate a radical.

As the infrared absorbent used in the present disclosure, a dye or a pigment having a maximum absorption wavelength of 700 to 1300 nm is preferable. Infrared absorbents described in paragraphs 0123 to 0139 of JP2008-107758 A are suitably used as the infrared absorbent.

Specifically, commercially available dyes or known dyes described in documents (for example, "Dye Handbook", compiled by The Society of Synthetic Organic Chemistry, Japan, published in 1970) can be used as the dye. Specific examples thereof include dyes such as an azo dye, a metal complex azo dye, a pyrazolone azo dye, a naphthoquinone dye, an anthraquinone dye, a phthalocyanine dye, a carbonium dye, a quinone imine dye, a methine dye, a cyanine dye, a squarylium coloring agent, a pyrylium salt, and a metal thiolate complex.

Preferred examples of such dyes include cyanine dyes described in JP1983-125246 A (JP-S58-125246 A), JP1984-84356 A (JP-S59-84356 A), JP1984-202829 A (JP-S59-202829 A), or JP1985-78787 A (JP-S60-78787 A), methine dyes described in JP1983-173696 A (JP-S58-173696 A), JP1983-181690 A (JP-S58-181690 A), or JP1983-194595 A (JP-S58-194595 A), naphthoquinone dyes described in JP1983-112793 A (JP-S58-112793 A), JP1983-224793 A (JP-S58-224793 A), JP1984-48187 A (JP-S59-48187 A), JP1984-73996 A (JP-S59-73996 A), JP1985-52940 A (JP-S60-52940 A), or JP1985-63744 A (JP-S60-63744 A), squarylium coloring agents described in JP1983-112792 A (JP-S58-112792 A), and cyanine dyes described in GB434875B.

A), JP1983-220143 A (JP-S58-220143 A), JP1984-41363 A (JP-S59-41363 A), JP1984-84248 A (JP-S59-84248 A), JP1984-84249 A (JP-S59-84249 A), JP1984-146063 A (JP-S59-146063 A), or JP1984-146061 A (JP-S59-146061 A), cyanine coloring agents described in JP1984-216146 A (JP-S59-216146 A), pentamethinethiopyrylium salts described in U.S. Pat. No. 4,283,475 A, or pyrylium compounds described in JP1993-13514B (JP-H05-13514B) or JP1993-19702B (JP-H05-19702B) are preferably used. Further, preferred other examples of the dye include near infrared absorbing dyes represented by Formulae (I) and (II) which are described in U.S. Pat. No. 4,756,993 A.

In addition, other preferred examples of the infrared absorbing coloring agent of the present disclosure include specific indolenine cyanine coloring agents described in JP2002-278057 A shown below.

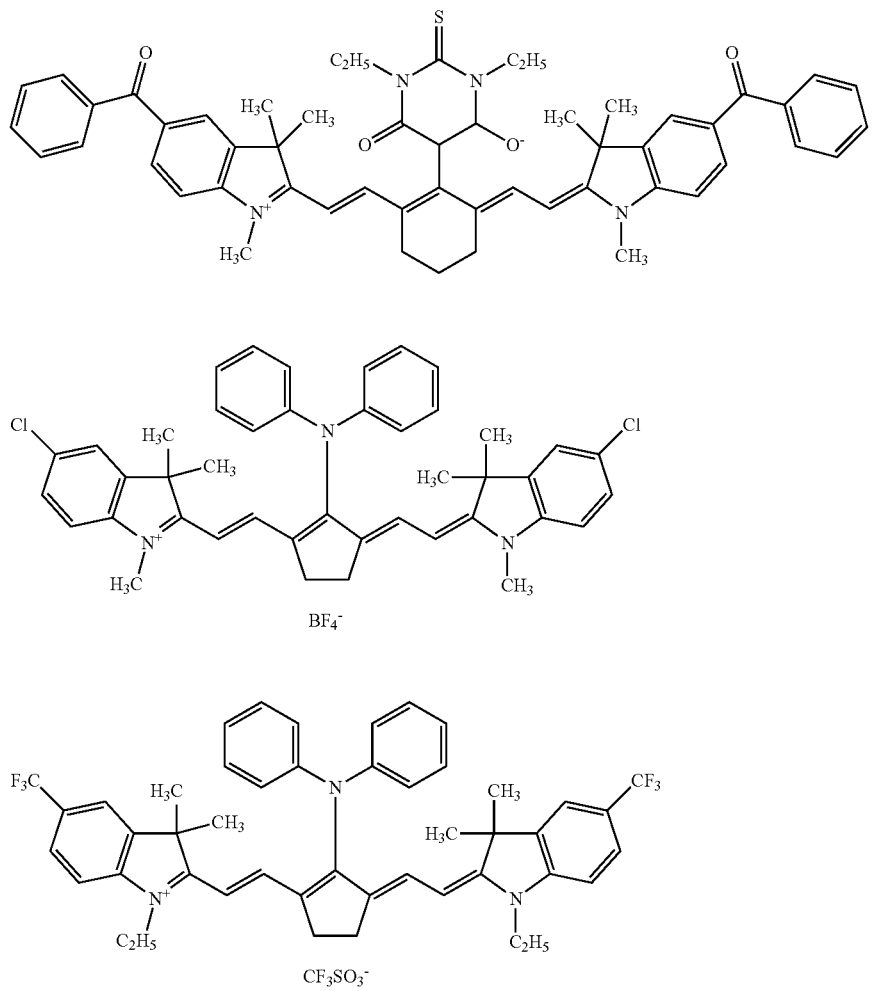

In addition, as the dye, the near infrared absorbing sensitizers described in U.S. Pat. No. 5,156,938 A are also suitably used, also, substituted aryl benzo(thio)pyrylium salts described in U.S. Pat. No. 3,881,924 A, trimethine thiapyrylium salts described in JP1982-142645 A (JP-S57-142645 A) (U.S. Pat. No. 4,327,169 A), pyrylium-based compounds described in JP1983-181051 A (JP-S58-181051

Among these dyes, a cyanine coloring agent, a squarylium coloring agent, a pyrylium salt, a nickel thiolate complex, and an indolenine cyanine coloring agent are more preferable. Furthermore, a cyanine coloring agent or an indolenine cyanine coloring agent is preferable and a cyanine coloring agent represented by Formula a is particularly preferable. The cyanine coloring agent represented by Formula a imparts high polymerization activity in an image recording layer and has excellent stability and economic efficiency.

Formula a

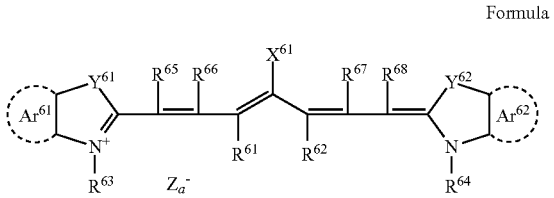

In Formula a, $X^{61}$ represents a hydrogen atom, a halogen atom, $-N(Ar^{63})_2$, $-X^{62}-L^{61}$, or a group represented by Formula a-1. Here, $Ar^{63}$ represents an aromatic hydrocarbon group having 6 to 14 carbon atoms, and the aromatic hydrocarbon group may include one or more substituents selected from the group consisting of a halogen atom, an alkyl group, an allyl group, an alkenyl group, an alkynyl group, a cyano group, a carboxy group, a nitro group, an amide group, an ester group, an alkoxy group, an amino group, and a hetero ring group. In addition, these substituents may be substituted with the above-described substituents. Further, $X^{62}$ represents an oxygen atom, a sulfur atom, or $-N(R_x)-$, and $R_x$ represents a hydrogen atom or a hydrocarbon group having 1 to 10 carbon atoms. $L^{61}$ represents a hydrocarbon group having 1 to 12 carbon atoms, an aromatic ring group having heteroatoms, or a hydrocarbon group having heteroatoms and 1 to 12 carbon atoms. Further, the heteroatom here indicates N, S, O, a halogen atom, or Se.

Formula a-1

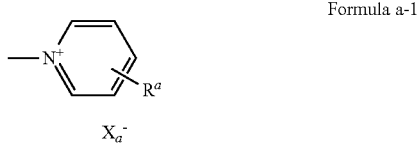

In Formula a-1, $X_a^-$ has the same definition as that for $Z_a^-$ described below, and $R^a$ represents a substituent selected from the group consisting of a hydrogen atom, an alkyl group, an aryl group, a substituted or unsubstituted amino group, and a halogen atom.

$R^{61}$ and $R^{62}$ each independently represent a hydrocarbon group having 1 to 12 carbon atoms. From the viewpoint of storage stability of the photosensitive resin composition, it is preferable that $R^{61}$ and $R^{62}$ represent a hydrocarbon group having 2 to 12 carbon atoms and also preferable that both of $R^{61}$ and $R^{62}$ are bonded to each other to form a 5- or 6-membered ring.

$Ar^{61}$ and $Ar^{62}$ may be the same as or different from each other and represent an aromatic hydrocarbon group which may have a substituent. Preferred examples of the aromatic hydrocarbon group include a benzene ring and a naphthalene ring. Further, preferred examples of the substituent include a hydrocarbon group having 1 to 12 carbon atoms, a halogen atom, and an alkoxy group having 1 to 12 carbon atoms.

$Y^{61}$ and $Y^{62}$ may be the same as or different from each other and represent a sulfur atom or a dialkylmethylene group having 12 or less carbon atoms.

$R^{63}$ and $R^{64}$ may be the same as or different from each other and represent a hydrocarbon group having 1 to 20 carbon atoms which may have a substituent. Preferred examples of the substituent include an alkoxy group having 1 to 12 carbon atoms, a carboxyl group, and a sulfo group.

$R^{65}$ to $R^{68}$ may be the same as or different from one another and each represent a hydrogen atom or a hydrocarbon group having 1 to 12 carbon atoms. From the viewpoint of availability of a raw material, it is preferable that $R^{65}$ to $R^{68}$ each represent a hydrogen atom. In addition, $Z_a^-$ represents a counter anion. Here, in a case where the cyanine coloring agent represented by Formula a has an anionic substituent in the structure thereof so that neutralization of the charge is not necessary, $Z_a^-$ is not necessary. From the viewpoint of the storage stability of the photosensitive resin composition, as $Z_a^-$, a halide ion, a perchlorate ion, a tetrafluoroborate ion, a hexafluorophosphate ion, or a sulfonate ion is preferable; and a perchlorate ion, a hexafluorophosphate ion, or an arene sulfonate ion is more preferable.

The sensitizing dye may be used alone or in combination of two or more kinds thereof.

Further, a cyanine coloring agent containing an electron-withdrawing group or a heavy atom-containing substituent at an indolenine site of both terminals is preferable, and the coloring agents described in JP2002-278057 A are suitably used as the cyanine coloring agent. It is most preferable that $X^{61}$ represents a diarylamino group, and a cyanine coloring agent containing an electron-withdrawing group at an indolenine site of both terminals.

The amount of the sensitizing dye to be added in the photosensitive resin composition of the present disclosure is preferably in a range of 0.5% to 20% by mass and more preferably in a range of 1.0% to 10% by mass with respect to the total solid content of the photosensitive resin composition. In a case where the amount thereof is in the above-described range, the absorption of actinic rays through exposure is efficiently performed so that high sensitivity is also achieved, and there is no concern that the uniformity or strength of a film is adversely affected.

<Other Components>

Other components can be appropriately added to the photosensitive resin composition of the present disclosure according to the use thereof, the production method, and the like.

As other components, known additives can be used, and examples thereof include a basic compound, a chain transfer agent, a solvent, a development accelerator, a hydrophilic polymer, a surfactant, a print-out agent or a colorant, a polymerization inhibitor, a hydrophobic low-molecular-weight compound, inorganic particles, organic particles, a co-sensitizer, a plasticizer, and a wax agent.

Hereinafter, preferred additives will be described.

It is preferable that the photosensitive resin composition of the present disclosure contains a basic compound.

The basic compound used in the present disclosure indicates a basic compound which can form a salt structure together with the constitutional unit A in the specific polymer compound, and preferred examples thereof include a hydroxide or an oxide of an alkali metal, hydrocarbonate, alkoxide (ROM), phenoxide (ArONa), ammonia (gas or an aqueous solution), amines obtained by excluding diarylamine and triarylamine (diarylamine and triarylamine are excluded because these are close to neutrality and salt formability together with an acid group is insufficient), a heterocyclic base such as pyridine, quinoline, or piperidine, a hydrazine derivative, an amidine derivative, and tetraalkylammonium hydroxide.

Further, "forming a salt structure" in the present disclosure means that a compound and a group defined therein directly form a salt and also means that a part of the compound thereof and a part of a salt are combined with each other to form a salt. For example, an anion of a specific compound is dissociated and only a cationic moiety forms a salt together with a sulfonamide group. Further, the "salt structure" described above may be present in a state of being dissociated in a layer of the photosensitive resin composition.

Preferred examples of the basic compound which can be used in the present disclosure include a hydroxide or an oxide of an alkali metal, hydrocarbonate, alkoxide (ROM), phenoxide (ArONa), ammonia (gas or an aqueous solution), and a nitrogen-containing compound.

It is preferable that the photosensitive resin composition of the present disclosure contains a chain transfer agent.

The chain transfer agent is defined, for example, in Polymer Dictionary Third Edition (edited by The Society of Polymer Science, Japan, 2005), pp. 683 to 684. For example, a compound group having SH, PH, SiH, and GeH in a molecule is used as the chain transfer agent. With these, radicals are generated by donating hydrogen to low active radical species or radicals can be generated by deprotonation after oxidation.

Further, particularly, thiol compounds (such as 2-mercaptobenzimidazoles, 2-mercaptobenzthiazoles, 2-mercaptobenzoxazoles, 3-mercaptotriazoles, and 5-mercaptotetrazoles) can be preferably used as the chain transfer agent.

The content of the chain transfer agent in the photosensitive resin composition of the present disclosure is preferably in a range of 0.01 to 20 parts by mass, more preferably in a range of 1 to 10 parts by mass, and particularly preferably in a range of 1 to 5 parts by mass with respect to 100 parts by mass of the total solid content of the photosensitive resin composition.

The photosensitive resin composition of the present disclosure may further contain various additives as necessary.

Examples of the additives include a surfactant for promoting developability and improving the coated surface state; a hydrophilic polymer for improving developability and improving dispersion stability of microcapsules; a colorant or a print-out agent for visually recognizing an image area and a non-image area; a polymerization inhibitor for preventing unnecessary thermal polymerization of a polymerizable compound during production or storage of the image recording layer; a hydrophobic low-molecular-weight compound such as a higher fatty derivative for preventing polymerization inhibition due to oxygen; inorganic particles and organic particles for improving cured film hardness of an image area; a co-sensitizer for improving sensitivity; and a plasticizer for improving plasticity. As these compounds, known compounds described in paragraphs 0161 to 0215 of JP2007-206217 A, paragraph 0067 of JP2005-509192 A, and paragraphs 0023 to 0026 and 0059 to 0066 of JP2004-310000 A can be used. As the surfactant, the following surfactants which may be added to a developer can also be used.

(Negative Type Planographic Printing Plate Precursor)

The negative type planographic printing plate precursor of the present disclosure (hereinafter, also simply referred to as a "planographic printing plate precursor") includes an image recording layer containing the photosensitive resin composition of the present disclosure.

Further, it is preferable that the planographic printing plate precursor of the present disclosure includes an image recording layer containing the photosensitive resin composition of the present disclosure on a support.

In the planographic printing plate precursor of the present disclosure, an undercoat layer can be suitably provided between the support and the image recording layer and a protective layer can be suitably provided on the image recording layer.

Hereinafter, constituent elements of the planographic printing plate precursor will be described.

<Image Recording Layer>

The planographic printing plate precursor of the present disclosure includes an image recording layer containing the photosensitive resin composition of the present disclosure.

The image recording layer can be formed by dissolving respective components of the photosensitive resin composition of the present disclosure in a solvent and coating a suitable support with the solution.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, and toluene, and the present disclosure is not limited to these. These solvents are used alone or in mixture.

—Formation of Image Recording Layer—

The image recording layer in the planographic printing plate precursor of the present disclosure can be formed by coating the support with the photosensitive resin composition of the present disclosure or the photosensitive resin composition of the present disclosure which includes a solvent according to a known method such as bar coater coating and drying the support. The coating amount (solid content) of the image recording layer on the support to be obtained after being applied and dried varies depending on the use thereof, but is preferably in a range of 0.3 to 3.0 g/m². In a case where the amount thereof is in the above-described range, excellent sensitivity and excellent film properties of the image recording layer are obtained.

<Undercoat Layer>

It is preferable that the planographic printing plate precursor of the present disclosure includes an undercoat layer.

Since the undercoat layer functions as a heat insulating layer at the time of image exposure, heat generated by exposure using an infrared laser or the like does not diffuse to the support and is efficiently used. Therefore, the undercoat layer contributes to improvement of the sensitivity.

It is preferable that the undercoat layer is formed of an alkali-soluble polymer. An alkali-soluble polymer in a non-image area is rapidly dissolved in a developer and removed by using an alkali-soluble polymer, and thus contributes to improvement of developability.

Hereinafter, specific examples of the alkali-soluble polymer preferably used for the undercoat layer will be described, but the present disclosure is not limited thereto. In the specific examples below, Mw represents the weight-average molecular weight, and the numerical value accompanying a repeating unit represents the content (% by mole) of the repeating unit.

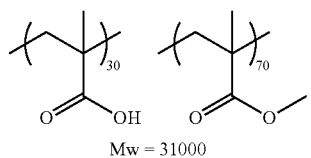

(a-1)

Mw = 31000

(a-2) 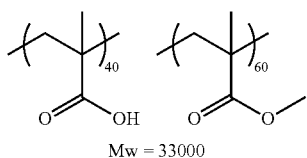

(a-3) 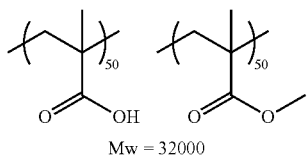

(a-4) 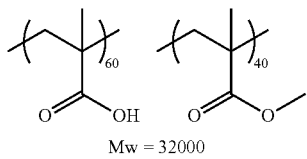

(a-5) 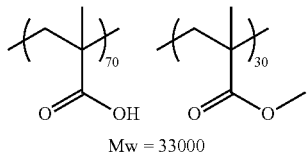

(a-6) 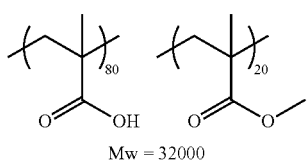

(a-7) 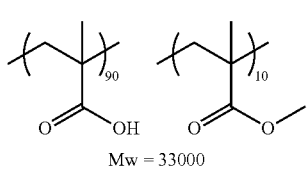

(a-8) 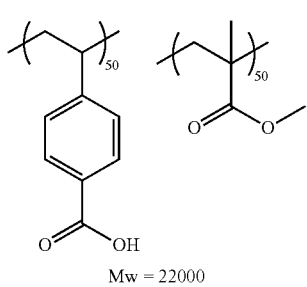

(a-9) 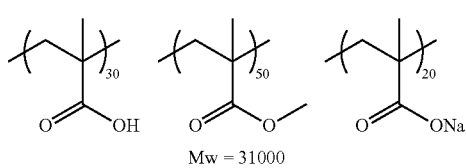

(a-10) 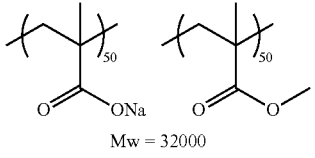

The undercoat layer can be formed by coating the support with an undercoat layer coating solution that contains an alkali-soluble polymer. The coating amount of the undercoat layer coating solution is preferably in a range of 1 to 1000 mg/m$^2$, more preferably in a range of 1 to 50 mg/m$^2$, and still more preferably in a range of 5 to 20 mg/m$^2$.

A pH adjusting agent such as phosphoric acid, phosphorus acid, hydrochloric acid, or low-molecular-weight organic sulfonic acid or a wetting agent such as saponin can be added, as an arbitrary component, to the undercoat layer coating solution within a range not impairing the effects of the planographic printing plate precursor of the present disclosure.

The forming amount (solid content) of the undercoat layer in the planographic printing plate precursor of the present disclosure is preferably in a range of 1 to 200 mg/m$^2$, more preferably in a range of 1 to 50 mg/m$^2$, and still more preferably in a range of 5 to 20 mg/m$^2$. In a case where the coating amount thereof is in the above-described range, printing durability can be sufficiently obtained.

<Support>

It is preferable that the planographic printing plate precursor of the present disclosure includes an image recording layer containing the photosensitive resin composition of the present disclosure on the support.

Examples of the support in the planographic printing plate precursor of the present disclosure include a polyester film and an aluminum plate. Among these, an aluminum plate which has excellent dimensional stability, is relatively inexpensive, and can be provided with a surface that is excellent in hydrophilicity or strength by performing a surface treatment as necessary is preferable. Further, a composite sheet formed by bonding an aluminum sheet onto a polyethylene terephthalate film described in JP1973-18327B (JP-S48-18327B) is also preferable.

An aluminum plate as a suitable support in the present disclosure is a metal plate containing dimensionally stable aluminum as a main component and is selected from an alloy plate which contains aluminum as a main component and a trace amount of heteroelements; a plastic film on which aluminum (alloy) is laminated or vapor-deposited; or paper, in addition to a pure aluminum plate. In the description below, a support formed of aluminum or an aluminum alloy exemplified above is collectively referred to as an aluminum support.

Examples of the heteroelements contained in the aluminum alloy include silicon, iron, manganese, copper, magnesium, chromium, zinc, bismuth, nickel, and titanium, and the content of the heteroelements in the alloy is 10% by mass or less. In the present disclosure, a pure aluminum plate is suitable. However, since completely pure aluminum is difficult to produce due to the refining technology, the plate may contain a small amount of heteroelements. The composition of the aluminum plate applied in the present disclosure as described above is not specified, and known materials which have been used in the related art, such as JIS A 1050, JIS A 1100, JIS A 3103, and JIS A 3005, can be used as appropriate.

In addition, the thickness of the aluminum plate used in the present disclosure is approximately in a range of 0.1 mm to 0.6 mm. The thickness can be appropriately changed according to the size of a printing press, the size of a printing plate, and the user's request.

It is preferable that the aluminum support is subjected to a hydrophilic treatment. Preferred examples of the hydrophilic treatment include surface treatments described in paragraphs 0252 to 0258 of JP2008-107758 A.

<Protective Layer>

In the planographic printing plate precursor of the present invention, it is preferable that a protective layer (oxygen blocking layer) is provided on the image recording layer in order to block diffusion penetration of oxygen that disturbs a polymerization reaction during exposure.

As the material of the protective layer, any of a water-soluble polymer and a water-insoluble polymer can be appropriately selected and used, and two or more kinds thereof can be used in combination as necessary. Specific examples thereof include polyvinyl alcohol, modified polyvinyl alcohol, polyvinylpyrrolidone, a water-soluble cellulose derivative, and poly(meth)acrylonitrile. Among these, a water-soluble polymer compound having relatively excellent crystallinity is preferably used. Specifically, in a case where polyvinyl alcohol is used as a main component, this leads to excellent results particularly for basic characteristics such as oxygen blocking properties and development removability.

Since polyvinyl alcohol used for the protective layer has necessary oxygen blocking properties and water solubility, a part of the polyvinyl alcohol may be substituted with an ester, an ether, or an acetal as long as the polyvinyl alcohol contains a necessary unsubstituted vinyl alcohol unit. Further, similarly, a part thereof may contain other copolymerization components. The polyvinyl alcohol can be obtained by hydrolyzing polyvinyl acetate. Specific examples of the polyvinyl alcohol include those in which the degree of hydrolysis is in a range of 69.0% to 100% by mole and the number of polymerization repeating units is in a range of 300 to 2400.

Specific examples thereof include PVA-102 PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217 EE, PVA-217E, PVA-220E, PVA-224E, PVA-403, PVA-405, PVA-420, PVA-424H, PVA-505, PVA-617, PVA-613, PVA-706, and L-8 (all manufactured by KURARAY CO., LTD.). The polyvinyl alcohol can be used alone or in combination of two or more kinds thereof. The content of the polyvinyl alcohol in the protective layer is preferably in a range of 20% to 95% by mass and more preferably in a range of 30% to 90% by mass.

Further, the modified polyvinyl alcohol can also be preferably used. Particularly, acid-modified polyvinyl alcohol containing a carboxylic acid group or a sulfonic acid group is preferably used. Specifically, polyvinyl alcohol described in JP2005-250216 A and JP2006-259137 A is suitably exemplified.

In a case where polyvinyl alcohol is mixed with other materials and used, from the viewpoints of oxygen blocking properties and development removability, modified polyvinyl alcohol, polyvinylpyrrolidone, or a modified product thereof is preferable as the component to be mixed. The content thereof in the protective layer is preferably in a range of 3.5% to 80% by mass, more preferably in a range of 10% to 60% by mass, and still more preferably in a range of 15% to 30% by mass.

The flexibility can be imparted to the protective layer by adding several mass percent of glycerin, dipropylene glycol, or the like to the above-described polymer. Further, several mass percent of an anionic surfactant such as sodium alkyl sulfate or sodium alkyl sulfonate; an amphoteric surfactant such as alkylaminocarboxylate or alkylaminodicarboxylate; or a non-ionic surfactant such as polyoxyethylene alkyl phenyl ether can be added to the above-described polymer.

For the purpose of improving oxygen blocking properties or surface protection properties of the photosensitive layer, it is also preferable that the protective layer contains an inorganic layered compound. Among examples of the inorganic layered compound, a fluorine-based swellable synthetic mica which is a synthetic inorganic layered compound is particularly useful. Specifically, inorganic layered compounds described in JP2005-119273 A are suitably exemplified.

It is preferable that the protective layer contains inorganic particles (inorganic filler) or organic resin particles (organic filler) and more preferable that the protective layer contains organic resin particles.

Further, the protective layer may contain additives such as a thickener or a polymer compound. Known additives can be used as the additives.

Only one or two or more protective layers may be formed, but it is preferable that one or two protective layers are formed and more preferable that two layers of protective layers are formed.

The coating amount of the protective layer is preferably in a range of 0.05 to 10 $g/m^2$, more preferably in a range of 0.1 to 5 $g/m^2$ in a case where the protective layer contains an inorganic layered compound, and still more preferably in a range of 0.5 to 5 $g/m^2$ in a case where the protective layer does not contain an inorganic layered compound.

The planographic printing plate precursor of the present disclosure may further include known layers other than those described above.

For example, the planographic printing plate precursor of the present disclosure may have a back coat layer on the rear surface of the support as necessary.

Known back coat layers can be used as the back coat layer.

(Method of Preparing Planographic Printing Plate)

A method of preparing a planographic printing plate of the present disclosure is a preparation method using the negative type planographic printing plate precursor of the present disclosure and it is preferable that the method includes, in order, an exposure step of image-exposing the negative type planographic printing plate precursor of the present disclosure; and a development step of performing development by removing a non-exposed portion of the exposed negative type planographic printing plate precursor using a developer.

Further, as the method of preparing a planographic printing plate of the present disclosure, a method of setting the planographic printing plate precursors of the present disclosure in a plate setter, automatically transporting the planographic printing plate precursors one by one, image-exposing the planographic printing plate precursors with light having a wavelength of 700 nm to 1300 nm, and performing a development treatment at a transport speed of 1.25 m/min or greater without substantially performing a heat treatment is exemplified.

Hereinafter, the image exposure and the development treatment will be described.

<Exposure Step>

It is preferable that the method of preparing a planographic printing plate of the present disclosure includes an exposure step of image-exposing the negative type planographic printing plate precursor of the present disclosure.

As a light source used for image exposure, a light source which can emit light having a wavelength of 300 nm to 1400 nm is preferable; a light source which can emit light having a wavelength of 700 nm to 1300 nm is more preferable; and an infrared laser is still more preferable. In the present disclosure, it is preferable that image exposure is performed using a solid-state laser or a semiconductor laser emitting infrared rays having a wavelength of 700 nm to 1300 nm. The output of the laser is preferably 100 mW or greater. In order to shorten the exposure time, it is preferable to use a multibeam laser device. In addition, the exposure time per pixel is preferably within 20μ seconds. The energy to be applied to the planographic printing plate precursor is preferably in a range of 10 to 300 mJ/cm$^2$. In a case where the energy is in the above-described range, the curing of the image recording layer is sufficiently promoted, and damage to an image recording layer can be prevented through laser ablation.

The image exposure can be carried out by overlapping a light beam of the light source. The overlapping means that the sub-scanning pitch width is smaller than the beam diameter. For example, in a case where the beam diameter is expressed by the half-width (FWHM) of the beam intensity, the overlapping can be quantitatively expressed by FWHM/sub-scanning pitch width (overlap coefficient). In the present disclosure, this overlap coefficient is preferably 0.1 or greater.

A scanning method of the light source of an exposure device which can be used in the present disclosure is not particularly limited, and examples thereof include a drum outer surface scanning method, a drum inner surface scanning method, and a planar scanning method. In addition, the channel of the light source may be a single channel or a multichannel, and the multichannel is preferably used in a case of drum outer surface scanning method.

In the present disclosure, as described above, it is preferable that the image-exposed planographic printing plate precursor is subjected to a development treatment without performing a special heat treatment or a water-washing treatment. In a case where the heat treatment is not performed, the non-uniformity of an image caused by the heat treatment can be prevented. Further, in a case where the heat treatment and the water-washing treatment are not performed, a stable treatment with a high speed can be carried out during the development treatment.

<Development Step>

It is preferable that the method of preparing a planographic printing plate of the present disclosure includes a development step of performing development by removing a non-exposed portion of the exposed negative type planographic printing plate precursor using a developer.

During the development treatment applied in the present disclosure, it is preferable that the non-image area (non-exposed portion) of the image recording layer is removed using a developer.

In the present disclosure, as described above, the treatment speed during the development treatment, that is, the transport speed (line speed) of the planographic printing plate precursor during the development treatment is preferably 1.25 m/min or greater and more preferably 1.35 m/min or greater. The upper limit of the transport speed is not particularly limited, but is preferably 3 m/min or less from the viewpoint of stability of transport.

The developer used in the development step is preferably an aqueous solution having a pH of 6.0 to 13.5 and more preferably an alkali aqueous solution having a pH of 8.5 to 13.5.

Further, it is preferable that the developer contains a surfactant. A surfactant contributes to improvement of processability.

As the surfactant used for the developer, any of an anionic surfactant, a nonionic surfactant, a cationic surfactant, and an amphoteric surfactant can be used, but an anionic surfactant or a nonionic surfactant is preferable as described above.

As the surfactant used for the developer of the present disclosure, the surfactants described in paragraphs 0128 to 0131 of JP2013-134341 A can be used.

Examples of the developer suitably used during the development treatment include developers described in paragraphs 0288 to 0309 of JP2008-107758 A.

The temperature of development is not particularly limited as long as the development can be carried out, but the temperature is preferably 60° C. or lower and more preferably in a range of 15° C. to 40° C. In the development treatment using an automatic developing machine, since the developer becomes fatigued according to the treatment amount, the processing capability may be restored using a replenisher or a fresh developer. As one example of the development or a treatment after the development, a method of performing alkali development, removing the alkali in a post-water washing step, performing a gum treatment in a gumming step, and performing drying in a drying step can be exemplified.

The planographic printing plate precursor to which the development treatment has been applied is subjected to a post treatment using wash water, a rinse liquid containing a surfactant or the like, and a desensitizing liquid containing Arabic gum or a starch derivative, as described in JP1979-8002 A (JP-S54-8002 A), JP1980-115045 A (JP-S55-115045 A), and JP1984-58431 A (JP-S59-58431 A). The post treatment can be performed on the planographic printing plate precursor of the present disclosure by combining these treatments.

According to the method of preparing a planographic printing plate of the present disclosure, it is possible to perform post-heating or exposure of the entire surface with respect to the image which has been subjected to the development treatment for the purpose of improving the image strength or the printing durability.

Extremely strong conditions can be used for the heating after development. It is preferable that the heating after development is performed in a heating temperature range of 200° C. to 500° C. In a case where the heating temperature is in the above-described range, an image-strengthening action is sufficiently obtained, and deterioration of the support and thermal decomposition or the like of the image area can be suppressed.

The planographic printing plate obtained according to the method of preparing a planographic printing plate of the present disclosure is mounted on an offset printing machine and suitably used for printing a large number of sheets.

Further, as a plate cleaner used for removing stain on a planographic printing plate during printing, a plate cleaner for a PS plate which has been known in the related art is suitably used. Examples thereof include multi-cleaners CL-1, CL-2, CP, CN-4, CN, CG-1, PC-1, SR, and IC (manufactured by Fujifilm Corporation).

EXAMPLES

Hereinafter, embodiments of the present invention will be described in detail with reference to examples, but the present disclosure is not limited to these. Moreover, "part" and "%" in the examples respectively indicate "part by mass" and "% by mass" unless otherwise specified.

Examples 1 to 52 and Comparative Examples 1 to 6

<Preparation of Support>

A surface treatment described below was performed using an aluminum plate (JIS A 1050) having a thickness of 0.30 mm and a width of 1030 mm.

—Surface Treatment—

The surface treatment was carried out by continuously performing various treatments of (a) to (f) described below. Further, liquid cutting was performed using a nip roller after each treatment and the washing treatment with water.

(a) The aluminum plate was subjected to an etching treatment using an aqueous solution at a temperature of 70° C., in which the concentration of caustic soda was 26% by mass and the concentration of aluminum ions was 6.5% by mass. Next, 5 g/m² of the aluminum plate was dissolved therein, and then washed with water.

(b) A desmutting treatment was performed using an aqueous solution having a nitric acid concentration of 1% by mass (containing 0.5% by mass of aluminum ions) at a temperature of 30° C. with a spray, and then washing with water was performed.

(c) An electrochemical surface roughening treatment was continuously performed using an AC voltage of 60 Hz. As the electrolyte at this time, a 1 mass % aqueous solution in nitric acid (containing 0.5% by mass of aluminum ions and 0.007% by mass of ammonium ions) was used and the temperature was 30° C. Using a trapezoidal rectangular waveform AC having a time TP, until the current value reached a peak from zero, of 2 msec and the duty ratio of 1:1 as the AC power supply, the electrochemical surface roughening treatment was performed using a carbon electrode as a counter electrode. As an auxiliary anode, ferrite was used. The current density was 25 A/dm² as the peak current value, and the electric quantity was 250 C/cm² as the sum total of electric quantity at the time of anodization of the aluminum plate. 5% of the current flowing from the power source was allowed to separately flow into the auxiliary anode. Thereafter, washing with water was performed.

(d) The aluminum plate was subjected to an etching treatment at 35° C. using an aqueous solution, in which the concentration of caustic soda was 26% by mass and the concentration of aluminum ions was 6.5% by mass, with a spray. Next, 0.2 g/m² of the aluminum plate was dissolved therein, smut components containing aluminum hydroxide, as the main component, generated at the time of electrochemical surface roughening using the AC current of the upper stage were removed, the edge portion of the generated pit was dissolved, and the edge portion was made smooth. Next, washing with water was performed.

(e) A desmutting treatment was performed using an aqueous solution having a nitric acid concentration of 25% by mass (containing 0.5% by mass of aluminum ions) at a temperature of 60° C. with a spray, and then washing with water with a spray was performed.

(f) An anodization treatment was performed at a temperature of 33° C. and a current density of 5 A/dm² for 50 seconds in an aqueous solution having a sulfuric acid concentration of 170 g/L (containing 0.5% by mass of aluminum ions). Next, washing with water was performed. The anodized film weight at this time was 2.7 g/m². The surface roughness Ra of the aluminum support obtained in the above-described manner was 0.27 μm (measurement device: manufactured by TOKYO SEIMITSU CO., LTD., diameter of stylus tip: 2 μm).

<Formation of Back Coat Layer>

Next, the rear surface of the aluminum support was coated with the following coating solution for a back coat layer using a wire bar and then dried at 100° C. for 10 seconds. The coating amount thereof was 0.5 g/m².

—Coating Solution for Back Coat Layer—
PR55422 (manufactured by Sumitomo Bakelite Co., Ltd., phenol/m-cresol/p-cresol=5/3/2 (molar ratio), weight-average molecular weight: 5300): 0.44 parts
Fluorine-based surfactant (MEGAFAC F-780-F, manufactured by DIC Corporation, 30 mass % solution in methyl isobutyl ketone (MIBK)): 0.002 parts
Methanol: 3.70 parts
1-Methoxy-2-propanol: 0.92 parts <Formation of Undercoat Layer>

Next, the surface of the aluminum support was coated with the following coating solution for an undercoat layer using a wire bar and then dried at 100° C. for 10 seconds. The coating amount thereof was 10 mg/m².

—Coating Solution for Undercoat Layer—
Polymer compound A with the following structure (weight-average molecular weight: 10000): 0.05 parts
Methanol: 27 parts
Ion exchange water: 3 parts

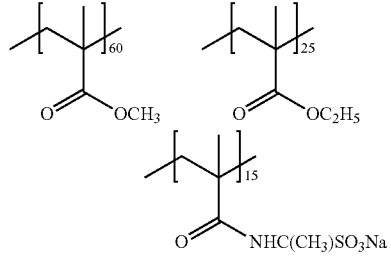

Polymer compound A

<Formation of Image Recording Layer>

The obtained surface was coated with a negative type photosensitive resin composition having the following composition such that the mass of the composition to be dried and applied was set to 1.4 g/m² and dried at 125° C. for 34 seconds to obtain an image recording layer (photosensitive layer).

—Negative Type Photosensitive Resin Composition—
Infrared absorbent (the following IR-1): 0.038 parts
Polymerization initiator A (the following S-1): 0.061 parts
Polymerization initiator B (the following I-1): 0.094 parts
Chain transfer agent (the following E-1): 0.015 parts
Polymerizable compound (the following M-1, manufactured by Shin Nakamura Chemical Industry Co., Ltd., A-BPE-4): 0.425 parts
Binder polymer A (polymer listed in Table 1 or 2): amount listed in Table 1 or 2
Binder polymer B (the following B-1): amount listed in Table 1 or 2
Binder polymer C (the following B-2): amount listed in Table 1 or 2
Additive (the following A-1): 0.079 parts
Polymerization inhibitor (the following Q-1); 0.0012 parts
Ethyl violet (the following EV-1): 0.021 parts Fluorine-based surfactant (MEGAFAC F-780-F, manufactured by DIC Corporation, 30 mass % solution in methyl isobutyl ketone (MIBK)): 0.0081 parts
Methyl ethyl ketone: 5.886 parts
Methanol: 2.733 parts
1-Methoxy-2-propanol: 5.886 parts The details of the infrared absorbent, the polymerization initiator, the polymerizable compound, the binder polymer, the additive, the polymerization inhibitor, and the ethyl violet used in Examples 1 to 52 and Comparative Examples 1 to 6 are as follows.

IR-1
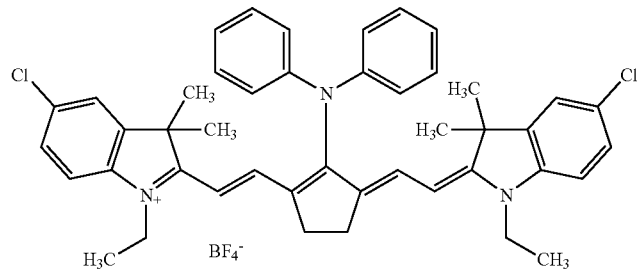

S-1
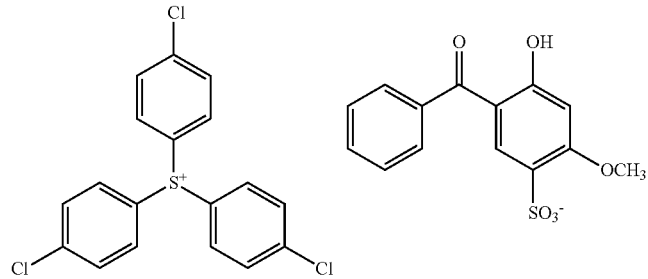

I-1
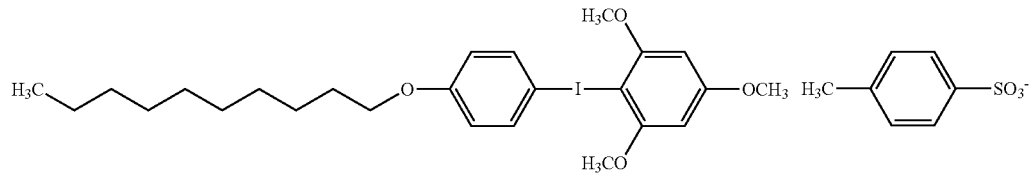

E-1
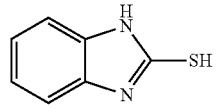

M-1
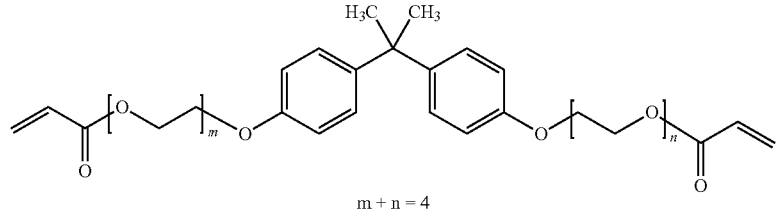

B-1
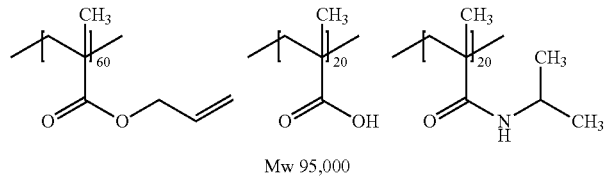

B-2
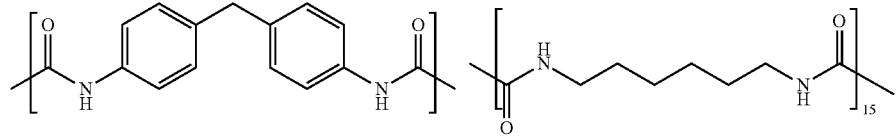

-continued

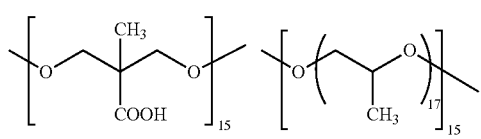 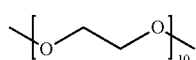 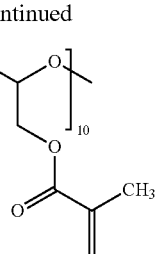 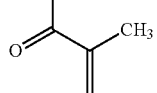

Mw 84,000

Further, the numerical values at the lower right of parentheses showing constitutional units B-1 and B-2 indicate molar ratios, and the numerical values at the lower right of parentheses showing the propylene glycol units in B-2 indicate repetition numbers.

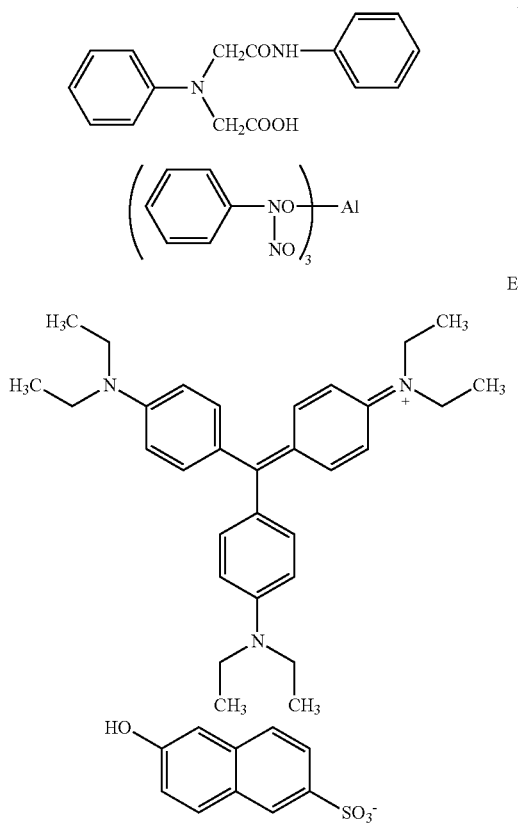

<Formation of Lower Protective Layer>

The surface of the image recording layer was coated with a mixed aqueous solution (coating solution for a lower protective layer) containing synthetic mica (SOMASIF MEB-3L, 3.2% aqueous dispersion liquid, manufactured by CO-OP CHEMICAL CO., LTD.), polyvinyl alcohol (GOHSERAN CKS-50, saponification degree of 99% by mole, polymerization degree of 300, sulfonic acid-modified polyvinyl alcohol, manufactured by Nippon Synthetic Chem Industry Co., Ltd.), a surfactant A (EMALEX 710, manufactured by Nihon Emulsion Co., Ltd.), and a surfactant B (ADEKA PLURONIC P-84, manufactured by ADEKA CORPORATION) using a wire bar and dried at 125° C. for 30 seconds using a hot air dryer. The ratio of the content of synthetic mica (solid content)/polyvinyl alcohol/surfactant A/surfactant B in the mixed aqueous solution (coating solution for a lower protective layer) was 7.5/89/2/1.5 (% by mass). Further, the coating amount thereof (covering amount after the drying) was 0.5 g/m².

<Formation of Upper Protective Layer>

The surface of the lower protective layer was coated with a mixed aqueous solution (coating solution for an upper protective layer) containing an organic filler (ART PEARL J-7P, manufactured by Negami Chemical Industrial Co., Ltd.), synthetic mica (SOMASIF MEB-3L, 3.2% aqueous dispersion liquid, manufactured by CO-OP CHEMICAL CO., LTD.), polyvinyl alcohol (L-3266, saponification degree of 87% by mole, polymerization degree of 300, sulfonic acid-modified polyvinyl alcohol, manufactured by Nippon Synthetic Chem Industry Co., Ltd.), a thickener (CELLOGEN FS-B, manufactured by Dai-ichi Kogyo Seiyaku Co., Ltd.), a polymer compound A (the structure described above), and a surfactant A (EMALEX 710, manufactured by Nihon Emulsion Co., Ltd.) using a wire bar and dried at 125° C. for 30 seconds using a hot air dryer. The ratio of the content of organic filler/synthetic mica (solid content)/polyvinyl alcohol/thickener/polymer compound A/surfactant in the mixed aqueous solution (coating solution for an upper protective layer) was 4.7/2.8/67.4/18.6/2.3/4.2 (% by mass). Further, the coating amount thereof (covering amount after the drying) was 1.2 g/m².

In this manner, the upper protective layer was formed on the surface of the lower protective layer, thereby obtaining planographic printing plate precursors of Examples 1 to 52 and Comparative Examples 1 to 6.

[Evaluation of Planographic Printing Plate Precursor]

(1) Evaluation of Printing Durability and Printing Stain Resistance

The prepared planographic printing plate precursors were evaluated by exposing 80% tint images having a resolution of 175 lpi (lines per inch, number of lines in 1 inch (2.54 cm)) under conditions of an output of 8 W, an external surface drum rotation speed of 206 rpm, and a plate surface energy of 100 mJ/cm² using Trendsetter 3244VX (manufactured by Creo Co., Ltd.) equipped with a water-cooling system 40 W infrared semiconductor laser. After each protective layer was removed by washing the surface with tap water after the exposure, the development treatment was performed at a development temperature of 30° C. and a transport speed (line speed) of 2 m/min using an automatic development machine LP-1310News (manufactured by Fujifilm Corporation). A 1:4 water-diluted solution of DH-N (manufactured by Fujifilm Corporation) was used as a developer, a 1:1.4 water-diluted solution of "FCT-421" (manufactured by Fujifilm Corporation) was used as a development replenisher, and a 1:1 water-diluted solution of "GN-2K" (manufactured by Fujifilm Corporation) was used as a finisher. Here, the printing was performed with the obtained planographic printing plate while an operation of wiping the ink from the surface of the plate material was repeated using a multi-cleaner (manufactured by Fujifilm Corporation) every time 10000 sheets were printed using a printing press LITHRONE (manufactured by Komori Corporation). As an index of printing durability, relative evaluation of (the number of printed sheets in each example)/(the number of printed sheets in Comparative Example 1) was used. The results are listed in Table 1 or 2.

Further, the ink stain, as the printing stain resistance (before forced aging), in the non-image area was evaluated through visual observation in 10 scores at the time of evaluation of the printing durability. Evaluation of the printing stain resistance (after forced aging) was performed on the planographic printing plate precursors, which were stored under conditions of 45° C. and 75% RH for 4 days and on which forced aging was performed, according to the same method as described above. As the evaluation score is greater, the printing stain in the non-image area is less and stain resistance is excellent. An evaluation score of 8 or greater is a practical level and an evaluation score of 6 is an acceptable lower limit. The results are listed in Table 1 or 2.

(2) Evaluation of Development Scum

The prepared planographic printing plate precursors (area of 0.88 m$^2$) were exposed such that the area of the non-image area was set to 0.75 m$^2$ and the development treatment was continuously performed on 1200 sheets with a developer having a pH of 11.90 (30° C.) using a development machine LP-1310 (manufactured by Fujifilm Corporation) provided with a protective layer removing device.

The developer after the treatment was visually confirmed whether development scum was deposited thereon. A case where development scum was not found at all was evaluated as A, a case where development scum was slightly found at a practically acceptable level was evaluated as B, and a case where development scum was significantly found was evaluated as C. The results are listed in Table 1 or 2.

(3) Evaluation of Chemical Resistance

Exposure, development, and printing were performed on the prepared planographic printing plate precursors in the same manner as in the evaluation of the printing durability. At this time, every time 5,000 sheets were printed, a step of wiping the plate surface with a cleaner (MC-E, manufactured by Fujifilm Corporation, multi-cleaner) was performed, and the chemical resistance was evaluated. The printing durability at this time was evaluated as 1 in a case where the printing durability was greater than 95% and 100% or less of the number of printing endurable sheets described above, evaluated as 2 in a case where the printing durability was greater than 80% and 95% or less of the number of printing endurable sheets described above, evaluated as 3 in a case where the printing durability was greater than 60% and 80% or less of the number of printing endurable sheets described above, and evaluated as 4 in a case where the printing durability was 60% or less of the number of printing endurable sheets described above. Even in a case where the step of wiping the plate surface with a cleaner was performed, the chemical resistance was evaluated to be excellent as the change in the printing durability index was smaller. The results are listed in Table 1 or 2.

TABLE 1

| | Binder polymer A | | Amount of binder polymer B to be added (part by mass) | Amount of binder polymer C to be added (part by mass) | Evaluation results | | | | |
|---|---|---|---|---|---|---|---|---|---|
| | | | | | | Printing stain resistance | | | |
| | Type | Addition amount (part by mass) | | | Printing durability | Before forced aging | After forced aging | Development scum | Chemical resistance |
| Example 1 | PU-1 | 0.623 | — | — | 130 | 9 | 9 | A | 1 |
| Example 2 | PU-2 | 0.623 | — | — | 130 | 9 | 9 | A | 1 |
| Example 3 | PU-3 | 0.623 | — | — | 125 | 10 | 9 | A | 1 |
| Example 4 | PU-4 | 0.623 | — | — | 130 | 10 | 10 | A | 1 |
| Example 5 | PU-5 | 0.623 | — | — | 125 | 10 | 10 | A | 1 |
| Example 6 | PU-6 | 0.623 | — | — | 130 | 10 | 10 | A | 1 |
| Example 7 | PU-7 | 0.623 | — | — | 130 | 9 | 9 | A | 1 |
| Example 8 | PU-4 | 0.623 | — | — | 130 | 10 | 10 | A | 1 |
| Example 9 | PU-4 | 0.311 | 0.250 | 0.062 | 125 | 10 | 9 | A | 2 |
| Example 10 | PU-4 | 0.373 | 0.250 | — | 120 | 10 | 10 | A | 1 |
| Example 11 | PU-4 | 0.561 | — | 0.062 | 120 | 9 | 9 | A | 1 |
| Example 12 | PU-8 | 0.623 | — | — | 130 | 10 | 9 | A | 1 |
| Example 13 | PU-9 | 0.623 | — | — | 125 | 9 | 9 | A | 1 |
| Example 14 | PU-10 | 0.623 | — | — | 125 | 9 | 8 | A | 1 |
| Example 15 | PU-11 | 0.623 | — | — | 115 | 10 | 8 | A | 1 |
| Example 16 | PU-12 | 0.623 | — | — | 125 | 10 | 9 | A | 1 |
| Example 17 | PU-13 | 0.623 | — | — | 125 | 9 | 8 | A | 1 |
| Example 18 | PU-15 | 0.623 | — | — | 120 | 9 | 9 | A | 1 |
| Example 19 | PUT-1 | 0.623 | — | — | 125 | 9 | 8 | A | 1 |
| Example 20 | PUT-2 | 0.623 | — | — | 125 | 9 | 8 | A | 1 |
| Example 21 | PUT-3 | 0.623 | — | — | 120 | 10 | 9 | A | 1 |
| Example 22 | PUT-4 | 0.623 | — | — | 125 | 10 | 10 | A | 1 |
| Example 23 | PUT-5 | 0.623 | — | — | 120 | 10 | 10 | A | 1 |
| Example 24 | PUT-6 | 0.623 | — | — | 125 | 10 | 10 | A | 1 |
| Example 25 | PUT-7 | 0.623 | — | — | 125 | 10 | 9 | A | 1 |
| Example 26 | PUT-4 | 0.311 | 0.250 | 0.062 | 125 | 10 | 9 | A | 1 |
| Example 27 | PUT-4 | 0.373 | 0.250 | — | 120 | 10 | 9 | A | 1 |
| Example 28 | PUT-4 | 0.561 | — | 0.062 | 120 | 9 | 8 | A | 1 |
| Example 29 | PUT-6 | 0.623 | — | — | 125 | 9 | 9 | A | 1 |
| Example 30 | PUT-7 | 0.623 | — | — | 130 | 8 | 8 | A | 1 |

TABLE 1-continued

|  | Binder polymer A Type | Addition amount (part by mass) | Amount of binder polymer B to be added (part by mass) | Amount of binder polymer C to be added (part by mass) | Printing durability | Printing stain resistance Before forced aging | Printing stain resistance After forced aging | Development scum | Chemical resistance |
|---|---|---|---|---|---|---|---|---|---|
| Example 31 | PUT-8 | 0.623 | — | — | 125 | 9 | 8 | A | 1 |
| Example 32 | PUT-9 | 0.623 | — | — | 125 | 9 | 8 | A | 1 |
| Example 33 | PUT-10 | 0.623 | — | — | 125 | 9 | 9 | A | 1 |
| Example 34 | PUT-11 | 0.623 | — | — | 120 | 9 | 9 | A | 1 |
| Example 35 | PUT-12 | 0.623 | — | — | 120 | 8 | 8 | A | 1 |

TABLE 2

|  | Binder polymer A Type | Addition amount (part by mass) | Amount of binder polymer B to be added (part by mass) | Amount of binder polymer C to be added (part by mass) | Printing durability | Printing stain resistance Before forced aging | Printing stain resistance After forced aging | Development scum | Chemical resistance |
|---|---|---|---|---|---|---|---|---|---|
| Example 36 | PA-1 | 0.623 | — | — | 130 | 9 | 8 | A | 1 |
| Example 37 | PA-2 | 0.623 | — | — | 130 | 9 | 9 | A | 1 |
| Example 38 | PA-3 | 0.623 | — | — | 130 | 9 | 8 | A | 1 |
| Example 39 | PA-4 | 0.623 | — | — | 135 | 9 | 8 | A | 1 |
| Example 40 | PA-5 | 0.623 | — | — | 130 | 10 | 9 | A | 1 |
| Example 41 | PA-6 | 0.623 | — | — | 135 | 9 | 8 | A | 1 |
| Example 42 | PA-7 | 0.623 | — | — | 135 | 9 | 8 | A | 1 |
| Example 43 | PA-4 | 0.311 | 0.250 | 0.062 | 130 | 10 | 9 | A | 1 |
| Example 44 | PA-4 | 0.373 | 0.250 | — | 125 | 10 | 9 | A | 1 |
| Example 45 | PA-4 | 0.561 | — | 0.062 | 125 | 10 | 9 | A | 1 |
| Example 46 | PA-9 | 0.623 | — | — | 130 | 9 | 8 | A | 1 |
| Example 47 | PA-10 | 0.623 | — | — | 130 | 9 | 8 | A | 1 |
| Example 48 | PA-8 | 0.623 | — | — | 125 | 9 | 9 | A | 1 |
| Example 49 | PA-9 | 0.623 | — | — | 130 | 8 | 9 | A | 1 |
| Example 50 | PA-10 | 0.623 | — | — | 135 | 8 | 9 | A | 1 |
| Example 51 | PA-11 | 0.623 | — | — | 135 | 9 | 8 | A | 1 |
| Example 52 | PA-12 | 0.623 | — | — | 130 | 8 | 8 | A | 1 |
| Comparative Example 1 | R-1 | 0.311 | 0.250 | 0.062 | 100 | 7 | 6 | B | 3 |
| Comparative Example 2 | R-1 | 0.373 | 0.250 | — | 80 | 7 | 6 | B | 3 |
| Comparative Example 3 | R-1 | 0.561 | — | 0.062 | 90 | 6 | 5 | B | 3 |
| Comparative Example 4 | R-1 | 0.623 | — | — | 85 | 7 | 6 | B | 4 |
| Comparative Example 5 | R-2 | 0.623 | — | — | 85 | 5 | 3 | C | 4 |
| Comparative Example 6 | R-3 | 0.623 | — | — | 80 | 7 | 5 | B | 3 |

Further, as PU-1 to PU-13, PU-15, PUT-1 to PUT-12, and PA-1 to PA-12 used in the examples, the same ones as described above were used.

In addition, R-1 to R-3 listed in Table 2 are shown below. The numerical values at the lower right of parentheses showing each of the constitutional units R-1 to R-3 indicate molar ratios.

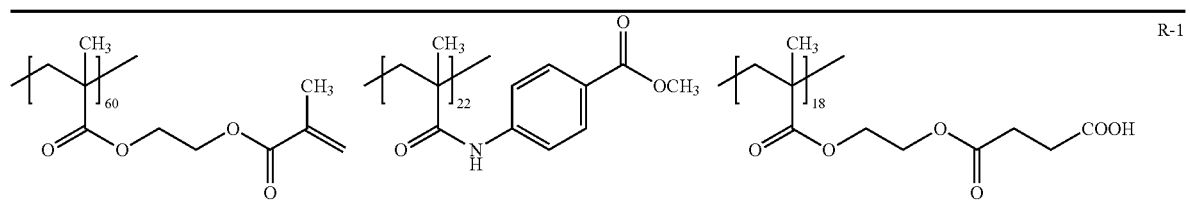

Mw 52,000

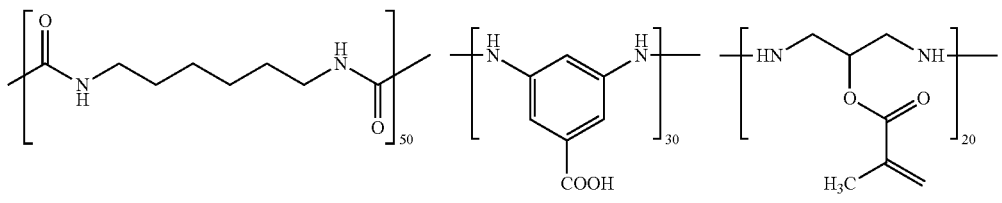

R-2

Mw 74,000

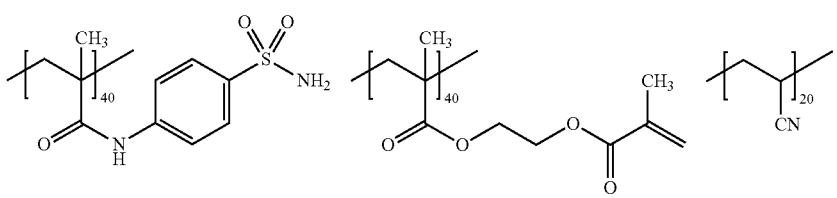

R-3

Mw 63,000

The disclosure of JP No. 2015-189519 filed on Sep. 28, 2015 is incorporated in the present specification by reference.

All documents, patent applications, and technical standards described in the present specification are incorporated herein by reference to the same extent as a case of being specifically and individually noted that individual documents, patent applications, and technical standards are incorporated by reference.

What is claimed is:

1. A negative photosensitive resin composition comprising:
   a polymer compound which has, in a main chain thereof, a constitutional unit A represented by Formula A-1, a constitutional unit B that is at least one of constitutional units represented by Formulae B-1, B-2, B-3, B-4, B-5, B-6, or B-7, and a constitutional unit C containing an ethylenically unsaturated group; and
   a polymerization initiator,

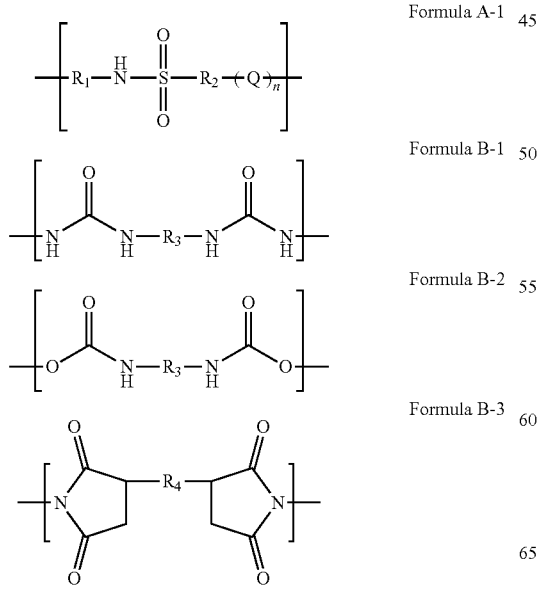

Formula A-1

Formula B-1

Formula B-2

Formula B-3

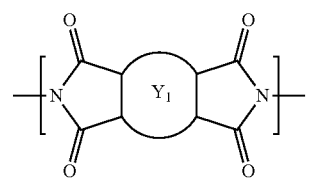

Formula B-4

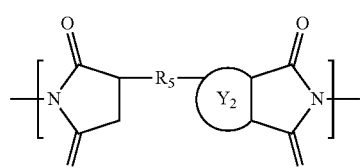

Formula B-5

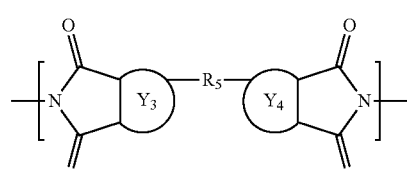

Formula B-6

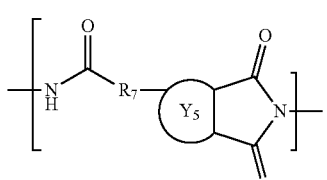

Formula B-7 in Formulae A-1 and B-1 to B-7, $R_1$ to $R_3$ each independently represent a divalent linking group, Q represents a divalent structure containing a sulfonamide group, n represents an integer of 0 or 1, $R_4$ to $R_7$ each independently represent a single bond or a divalent linking group, and $Y_1$ to $Y_5$ each independently represent an aromatic hydrocarbon ring or an aliphatic hydrocarbon ring.

2. The negative photosensitive resin composition according to claim 1,
   wherein the constitutional unit B has a constitutional unit represented by Formula B-1, B-2, or B-7.

3. The negative photosensitive resin composition according to claim 1,
   wherein the constitutional unit B has a constitutional unit represented by Formula B-1 or B-2.

4. The negative photosensitive resin composition according to claim 1,
   wherein $R_1$ represents an alkylene group or an arylene group, and
   $R_2$ represents an arylene group.

5. The negative photosensitive resin composition according to claim 1,
   wherein the constitutional unit A is a constitutional unit represented by Formula A-2,

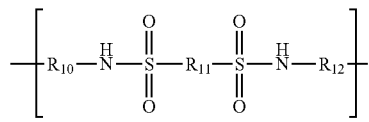

Formula A-2 in Formula A-2, $R_{10}$ to $R_{12}$ each independently represent a divalent linking group.

6. The negative photosensitive resin composition according to claim 1,
   wherein the constitutional unit A is a constitutional unit represented by any of Formulae C-1 to C-6,

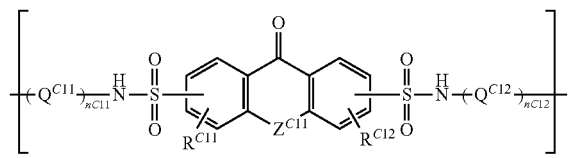

Formula C-1

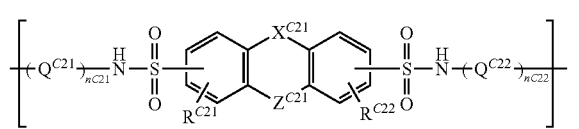

Formula C-2

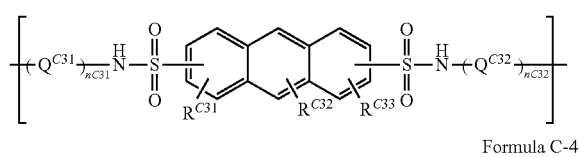

Formula C-3

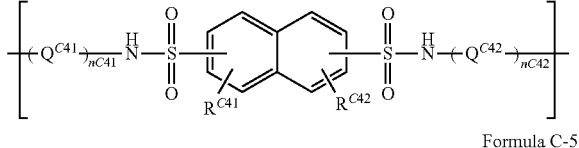

Formula C-4

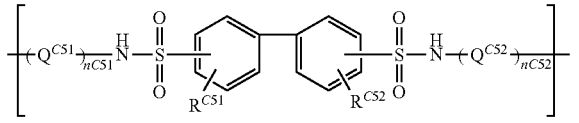

Formula C-5

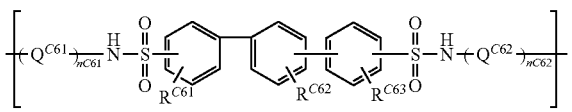

Formula C-6 in Formulae C-1 to C-6, $R^{C11}, R^{C12}, R^{C21}, R^{C22}, R^{C31}$ to $R^{C33}, R^{C41}, R^{C42}, R^{C51}, R^{C52}$, and $R^{C61}$ to $R^{C63}$ each independently represent a hydrogen atom, a sulfonamide group, a phenolic hydroxyl group, a carboxy group, an alkyl group, or a halogen atom, $Z^{C11}$ represents —C(R)$_2$—, —O—, —NR—, —S—, —C(=O)—, or a single bond, $Z^{C21}$ represents —C(R)$_2$—, —O—, —NR—, —S—, or a single bond, R represents a hydrogen atom or an alkyl group, $X^{C21}$ represents —C(R')$_2$—, —O—, —NR—, —S—, or a single bond, R' represents a hydrogen atom or an alkyl group, $Q^{C11}, Q^{C12}, Q^{C21}, Q^{C22}, Q^{C31}, Q^{C32}, Q^{C41}, Q^{C42}, Q^{C51}, Q^{C52}, Q^{C61}$, and $Q^{C62}$ each independently represent an alkylene group, an arylene group, a divalent saturated alicyclic hydrocarbon group, a divalent unsaturated alicyclic hydrocarbon group, or a divalent group formed by a plurality of these groups being linked to one another, and nC11, nC12, nC21, nC22, nC31, nC32, nC41, nC42, nC51, nC52, nC61, and nC62 each independently represent an integer of 1.

7. The negative photosensitive resin composition according to claim 1,
   wherein the constitutional unit C is a constitutional unit having a group selected from the group consisting of an acryloyl group, a methacryloyl group, a styryl group, and an allyl group.

8. The negative photosensitive resin composition according to claim 1,
   wherein the constitutional unit C is a constitutional unit having a group selected from the group consisting of an acryloyl group and a methacryloyl group.

9. The negative photosensitive resin composition according to claim 1,
   wherein the polymerization initiator is an onium salt compound.

10. The negative photosensitive resin composition according to claim 1,
    wherein the polymerization initiator is a diaryl iodonium salt compound or a triaryl sulfonium salt compound.

11. The negative photosensitive resin composition according to claim 1, further comprising:
    a sensitizing dye having a maximum absorption wavelength of 700 to 1300 nm.

12. The negative photosensitive resin composition according to claim 1, further comprising:
    a sensitizing dye having a maximum absorption wavelength of 300 to 600 nm.

13. A negative planographic printing plate precursor comprising:
    an image recording layer which contains the negative photosensitive resin composition according to claim 1.

14. A method of preparing a planographic printing plate, comprising, in order:
    an exposure step of image-exposing the negative planographic printing plate precursor according to claim 13; and
    a development step of performing development by removing a non-exposed portion of the exposed negative planographic printing plate precursor using a developer.

* * * * *